(12) United States Patent
Chien et al.

(10) Patent No.: US 11,705,505 B2
(45) Date of Patent: Jul. 18, 2023

(54) GATE SPACER STRUCTURE AND METHOD OF FORMING SAME

(71) Applicant: Taiwan Semiconductor Manufacturing Co., Ltd., Hsinchu (TW)

(72) Inventors: Wei-Ting Chien, Hsinchu (TW); Liang-Yin Chen, Hsinchu (TW); Yi-Hsiu Liu, Taipei (TW); Tsung-Lin Lee, Hsinchu (TW); Huicheng Chang, Tainan (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 17/818,400

(22) Filed: Aug. 9, 2022

(65) Prior Publication Data

US 2022/0384606 A1 Dec. 1, 2022

Related U.S. Application Data

(63) Continuation of application No. 17/120,869, filed on Dec. 14, 2020, now Pat. No. 11,508,831, which is a
(Continued)

(51) Int. Cl.
*H01L 29/66* (2006.01)
*H01L 29/423* (2006.01)
(Continued)

(52) U.S. Cl.
CPC ........ *H01L 29/6656* (2013.01); *H01L 21/764* (2013.01); *H01L 21/823468* (2013.01);
(Continued)

(58) Field of Classification Search
CPC ........... H01L 21/764; H01L 21/823468; H01L 21/823864; H01L 29/0649;
(Continued)

(56) References Cited

U.S. PATENT DOCUMENTS 10,868,142 B2    12/2020  Chien et al.
11,508,831 B2*   11/2022  Chien ............... H01L 21/764
(Continued)

FOREIGN PATENT DOCUMENTS

JP     2005150713 A    6/2005
KR    20140083737 A    7/2014
(Continued)

*Primary Examiner* — Jose R Diaz
(74) *Attorney, Agent, or Firm* — Slater Matsil, LLP

(57) ABSTRACT

A semiconductor device and a method of forming the same are provided. The method includes forming a sacrificial gate structure over an active region. A first spacer layer is formed along sidewalls and a top surface of the sacrificial gate structure. A first protection layer is formed over the first spacer layer. A second spacer layer is formed over the first protection layer. A third spacer layer is formed over the second spacer layer. The sacrificial gate structure is replaced with a replacement gate structure. The second spacer layer is removed to form an air gap between the first protection layer and the third spacer layer.

20 Claims, 51 Drawing Sheets

Related U.S. Application Data continuation of application No. 16/245,442, filed on Jan. 11, 2019, now Pat. No. 10,868,142.

(60) Provisional application No. 62/753,139, filed on Oct. 31, 2018.

(51) Int. Cl.

| | | |
|---|---|---|
| *H01L 29/49* | (2006.01) | |
| *H01L 29/06* | (2006.01) | |
| *H01L 21/8238* | (2006.01) | |
| *H01L 21/764* | (2006.01) | |
| *H01L 21/8234* | (2006.01) | |
| *H01L 29/51* | (2006.01) | |
| *H01L 29/78* | (2006.01) | |
| *H01L 21/02* | (2006.01) | |
| *H01L 21/311* | (2006.01) | |

(52) U.S. Cl.
CPC .. *H01L 21/823864* (2013.01); *H01L 29/0649* (2013.01); *H01L 29/42324* (2013.01); *H01L 29/4991* (2013.01); *H01L 29/515* (2013.01); *H01L 29/6653* (2013.01); *H01L 29/6659* (2013.01); *H01L 29/66537* (2013.01); *H01L 29/66545* (2013.01); *H01L 29/66795* (2013.01); *H01L 29/66825* (2013.01); *H01L 29/785* (2013.01); *H01L 21/0228* (2013.01); *H01L 21/02112* (2013.01); *H01L 21/02115* (2013.01); *H01L 21/02205* (2013.01); *H01L 21/02274* (2013.01); *H01L 21/31111* (2013.01); *H01L 21/31116* (2013.01)

(58) Field of Classification Search
CPC ........... H01L 29/42324; H01L 29/4991; H01L 29/6653; H01L 29/66537; H01L 29/6659; H01L 29/66795; H01L 29/66825; H01L 29/66545; H01L 29/6656
See application file for complete search history.

(56) References Cited

U.S. PATENT DOCUMENTS

| | | |
|---|---|---|
| 2005/0104095 A1 | 5/2005 | Ng et al. |
| 2009/0321853 A1 | 12/2009 | Cheng |
| 2014/0021524 A1 | 1/2014 | Sim et al. |
| 2014/0175659 A1 | 6/2014 | Lee et al. |
| 2014/0179101 A1 | 6/2014 | Lee et al. |
| 2014/0179102 A1 | 6/2014 | Joung et al. |
| 2014/0264479 A1 | 9/2014 | Cai et al. |
| 2014/0299989 A1 | 10/2014 | Lim et al. |
| 2014/0308794 A1 | 10/2014 | Lee et al. |
| 2015/0056801 A1 | 2/2015 | Park et al. |
| 2015/0243544 A1 | 8/2015 | Alptekin et al. |
| 2015/0372102 A1 | 12/2015 | Usami |
| 2016/0013131 A1 | 1/2016 | Choi et al. |
| 2016/0163816 A1 | 6/2016 | Yu et al. |
| 2016/0276273 A1 | 9/2016 | Kwon et al. |
| 2017/0194213 A1 | 7/2017 | Ching et al. |
| 2018/0151706 A1 | 5/2018 | Lin et al. |
| 2018/0166553 A1 | 6/2018 | Lee et al. |
| 2018/0233398 A1 | 8/2018 | Van Cleemput et al. |
| 2019/0115249 A1 | 4/2019 | Koh et al. |
| 2019/0172941 A1 | 6/2019 | Rachmady et al. |
| 2019/0296123 A1 | 9/2019 | Lee et al. |

FOREIGN PATENT DOCUMENTS

| | | |
|---|---|---|
| KR | 20140083744 A | 7/2014 |
| KR | 20140085654 A | 7/2014 |
| KR | 20140085657 A | 7/2014 |
| KR | 20140121955 A | 10/2014 |
| KR | 20140123639 A | 10/2014 |
| KR | 20150024068 A | 3/2015 |
| KR | 20150026116 A | 3/2015 |
| KR | 20160074306 A | 6/2016 |
| KR | 20180060941 A | 6/2018 |
| KR | 20180068846 A | 6/2018 |
| KR | 20180113888 A | 10/2018 |
| TW | 201735268 A | 10/2017 |
| TW | 201810394 A | 3/2018 |
| WO | 2018080712 A1 | 5/2018 |

\* cited by examiner

GATE SPACER STRUCTURE AND METHOD OF FORMING SAME

PRIORITY CLAIM AND CROSS-REFERENCE

This application is a continuation of U.S. patent application Ser. No. 17/120,869, filed on Dec. 14, 2020, now U.S. Pat. No. 11,508,831, issued Nov. 22, 2022, which is a continuation of U.S. patent application Ser. No. 16/245,442, filed on Jan. 11, 2019, now U.S. Pat. No. 10,868,142 issued Dec. 15, 2020, which claims the benefit of U.S. Provisional Application No. 62/753,139, filed on Oct. 31, 2018, each application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-5A are cross-sectional views of intermediate stages in the manufacture of a FinFET device in accordance with some embodiments.

DETAILED DESCRIPTION

Figure 1:
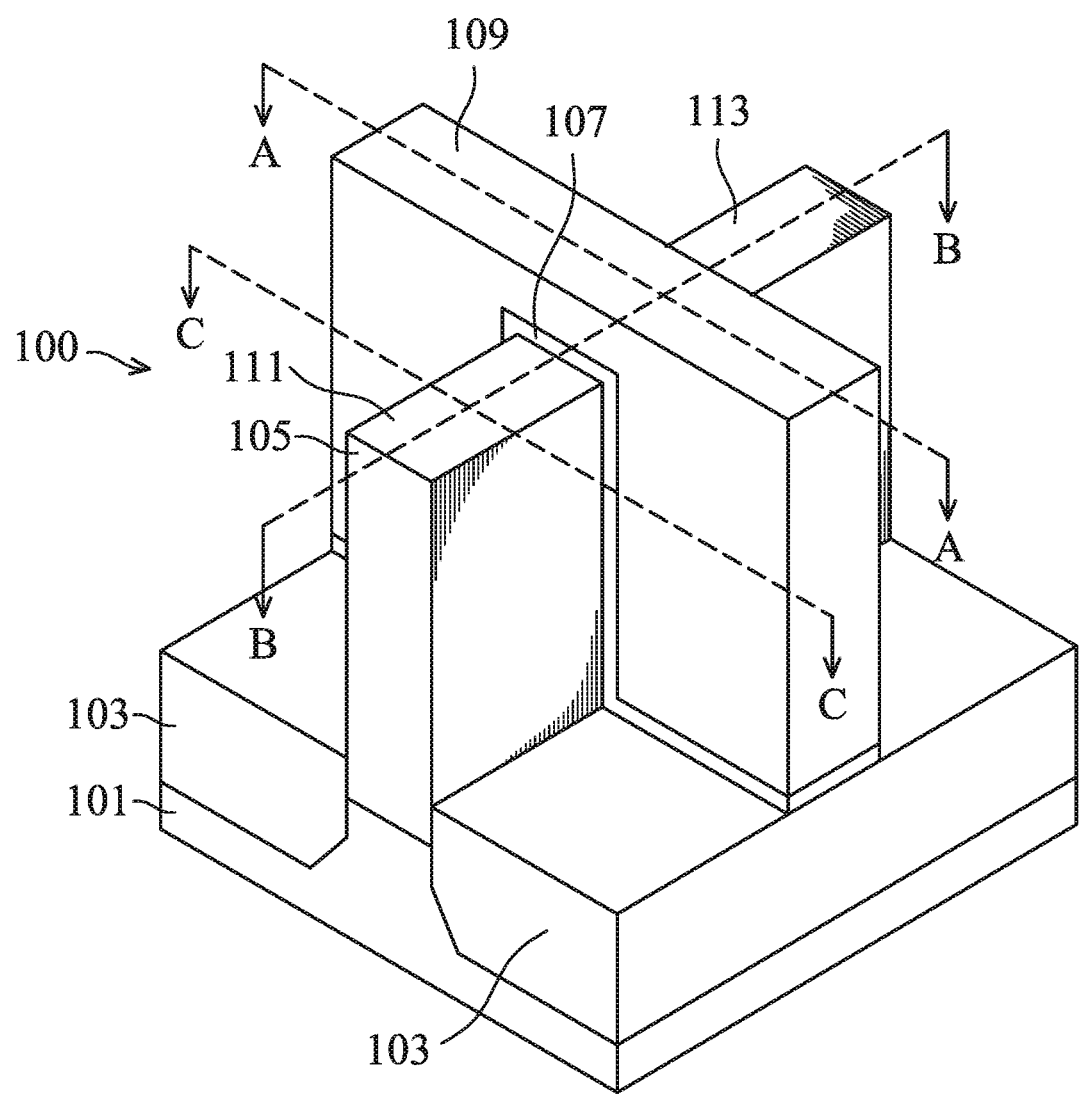
FIG. 1 is a perspective view of a fin field-effect transistor ("FinFET") device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a gate spacer structure of a semiconductor device and a method of forming the same. Various embodiments presented herein are discussed in the context of a FinFET device formed using a gate-last process. In other embodiments, a gate-first process may be used. Also, some embodiments contemplate aspects used in planar transistor devices, multiple-gate transistor devices, 2D transistor devices, gate-all-around transistor devices, nanowire transistor devices, or the like. Various embodiments discussed herein allow for forming a gate spacer structure comprising an air gap or an air spacer. In some embodiments, one or more protection layers are formed to protect spacer layers while enhancing an etch selectivity of a sacrificial layer to be removed to form an air spacer. In some embodiments, a protection layer is formed by depositing carbon or boron on a spacer layer. In other embodiments, a protection layer is formed by doping a spacer layer with carbon or boron. In some embodiments, a protection layer is formed using a plasma-assisted deposition/doping apparatus. Various embodiments discussed herein further allow for improving structural integrity of gate spacer structures during an etch process for forming an air spacer and reducing or avoiding a gate collapse.

FIG. 1 illustrates an example of a fin field-effect transistor (FinFET) 100 in a three-dimensional view. The FinFET 100 comprises a fin 105 on a substrate 101. The substrate 101 includes isolation regions 103, and the fin 105 protrudes above and from between neighboring isolation regions 103. A gate dielectric 107 is along sidewalls and over a top surface of the fin 105, and a gate electrode 109 is over the gate dielectric 107. Source/drain regions 111 and 113 are disposed in opposite sides of the fin 105 with respect to the gate dielectric 107 and gate electrode 109. The FinFET 100 illustrated in FIG. 1 is provided for illustrative purposes only and is not meant to limit the scope of the present disclosure. As such, many variations are possible, such as epitaxial source/drain regions, multiple fins, multilayer fins, etc. FIG. 1 further illustrates reference cross-sections that are used in subsequent figures. Cross-section A-A is across a channel, the gate dielectric 107, and the gate electrode 109 of the FinFET 100. Cross-section C-C is in a plane that is parallel to the cross section A-A and is across fin 105 outside of the channel. Cross-section B-B is perpendicular to the cross-sections A-A and C-C, and is along a longitudinal axis of the fin 105 and in a direction of, for example, a current flow between the source/drain regions 111 and 113. Subsequent figures refer to these reference cross-sections for clarity.

FIGS. 2A-9A, 11A-16A, 18A-26A, 6B-9B, 11B-16B, 18B-26B, 7C-9C, and 11C-26C are cross-sectional views of intermediate stages in the manufacturing of a FinFET device 200 in accordance with some embodiments. In FIGS. 2A-9A, 11A-16A, 18A-26A, 6B-9B, 11B-16B, 18B-26B, 7C-9C, and 11C-26C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1.

Figure 2A:
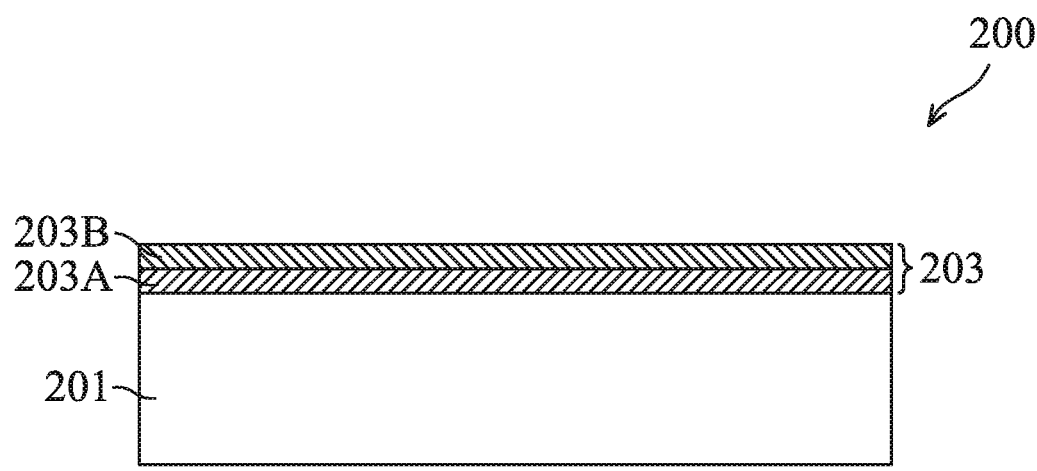

Referring to FIG. 2A, in some embodiments, the process of forming the FinFET device 200 starts with forming a mask 203 over a substrate 201. The substrate 201 may be a semiconductor substrate, such as a bulk semiconductor, a semiconductor-on-insulator (SOI) substrate, or the like, which may be doped (e.g., with a p-type or an n-type dopant) or undoped. The substrate 201 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 201 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 201 may further include integrated circuit devices (not shown). As one of ordinary skill in the art will recognize, a wide variety of integrated circuit devices such as transistors, diodes, capacitors, resistors, the like, or combinations thereof may be formed in and/or on the substrate 201 to generate the structural and functional requirements of the design for the FinFET device 200. The integrated circuit devices may be formed using any suitable methods.

In some embodiments, appropriate wells (not shown) may be formed in the substrate 201. In some embodiments where the resulting FinFET device 200 is an n-type device, the wells are p-wells. In some embodiments where the resulting FinFET device 200 is a p-type device, the wells are n-wells. In other embodiments, both p-wells and n-wells are formed in the substrate 201. In some embodiments, p-type impurities are implanted into the substrate 201 to form the p-wells. The p-type impurities may be boron, $BF_2$, or the like. In some embodiments, n-type impurities are implanted into the substrate 201 to form the n-wells. The n-type impurities may be phosphorus, arsenic, or the like. After implanting the appropriate impurities, an annealing process may be performed on the substrate 201 to activate the p-type and n-type impurities that were implanted.

FIG. 2A further illustrates the formation of a mask 203 over the substrate 201. In some embodiments, the mask 203 may be used in a subsequent etch step to pattern the substrate 201 (see FIG. 3A). In some embodiments, the mask 203 may comprise one or more mask layers. As shown in FIG. 2A, in some embodiments, the mask 203 may include a first mask layer 203A and a second mask layer 203B over the first mask layer 203A. The first mask layer 203A may be a hard mask layer, may comprise one or more layers of silicon oxide, silicon nitride, silicon oxynitride, silicon carbide, silicon carbonitride, a combination thereof, or the like, and may be formed using any suitable process, such as thermal oxidation, thermal nitridation, atomic layer deposition (ALD), physical vapor deposition (PVD), chemical vapor deposition (CVD), a combination thereof, or the like. The first mask layer 203A may be used to prevent or minimize etching of the substrate 201 underlying the first mask layer 203A in the subsequent etch step (see FIG. 3A). The second mask layer 203B may comprise a photoresist, and in some embodiments, may be used to pattern the first mask layer 203A for use in the subsequent etch step. The second mask layer 203B may be formed using a spin-on technique and may be patterned using acceptable photolithography techniques. In some embodiments, the mask 203 may comprise three or more mask layers.

Figure 3A:
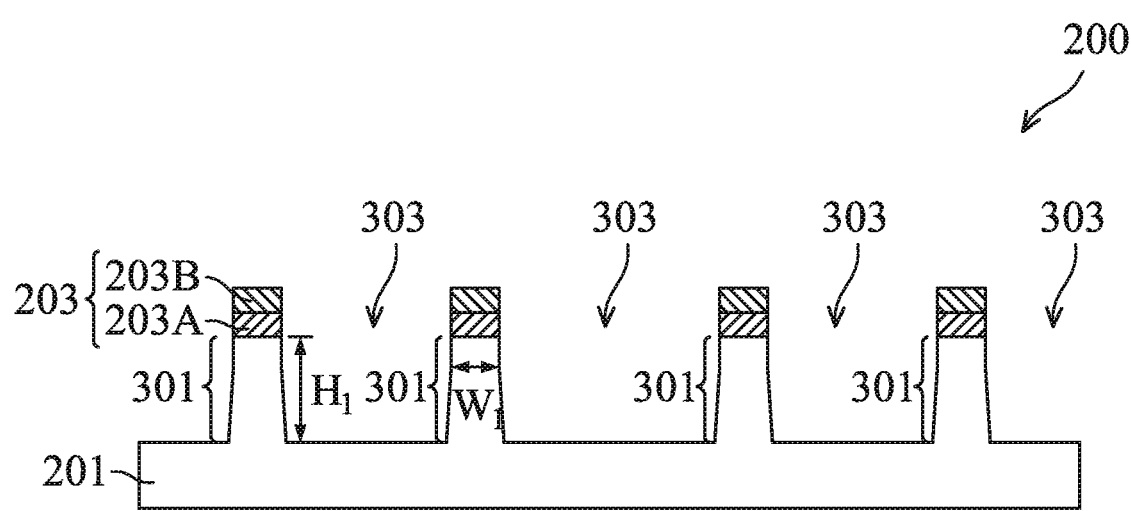

FIG. 3A illustrates the formation of semiconductor strips 301 in the substrate 201. First, mask layers 203A and 203B may be patterned, where openings in mask layers 203A and 203B expose areas of the substrate 201 where trenches 303 are to be formed. Next, an etch process is performed, where the etch process creates the trenches 303 in the substrate 201 through the openings in the mask 203. The remaining portions of the substrate 201 underlying the patterned mask 203 form a plurality of semiconductor strips 301. The etch process may comprise any acceptable etch process, such as a reactive ion etch (RIE), neutral beam etch (NBE), a combination thereof, or the like. The etch process may be anisotropic. In some embodiments, after forming the semiconductor strips 301, any remaining portions of the mask 203 may be removed by any suitable process. In other embodiments, portions of the mask 203, such as the first mask layer 203A, may remain over the semiconductor strips 301. In some embodiments, the semiconductor strips 301 may have a height $H_1$ between about 50 nm and about 80 nm. In some embodiments, the semiconductor strips 301 may have a width $W_1$ between about 5 nm and about 10 nm.

Figure 4A:
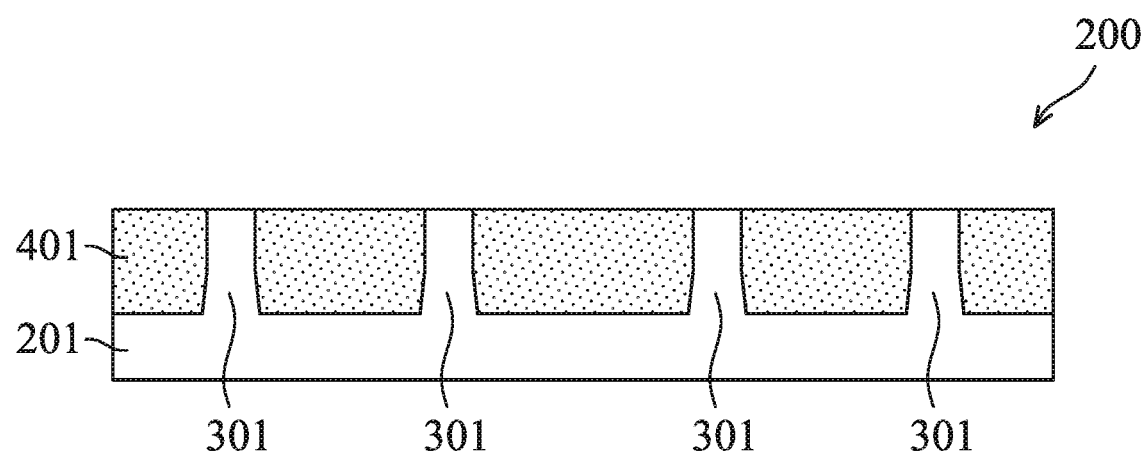

FIG. 4A illustrates the formation of an insulation material in the trenches 303 (see FIG. 3A) between neighboring semiconductor strips 301 to form isolation regions 401. The insulation material may be an oxide, such as silicon oxide, a nitride, such as silicon nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable processes may be also used.

Furthermore, in some embodiments, the isolation regions 401 may include a conformal liner (not illustrated) formed on sidewalls and bottom surfaces of the trenches 303 (see FIG. 3A) prior to filling the trenches 303 with the insulation material of the isolation regions 401. In some embodiments, the liner may comprise a semiconductor (e.g., silicon) nitride, a semiconductor (e.g., silicon) oxide, a thermal semiconductor (e.g., silicon) oxide, a semiconductor (e.g., silicon) oxynitride, a polymer, combinations thereof, or the like. The formation of the liner may include any suitable method, such as ALD, CVD, HDP-CVD, a combination thereof, or the like. In such embodiments, the liner may prevent (or at least reduce) the diffusion of the semiconductor material from the semiconductor strips 301 (e.g., Si or Ge) into the surrounding isolation regions 401 during the subsequent annealing of the isolation regions 401. In some embodiments, after the insulation material of the isolation regions 401 is deposited, an annealing process may be performed on the insulation material of the isolation regions 401.

Referring further to FIG. 4A, a planarization process, such as a chemical mechanical polishing (CMP) process, may remove any excess insulation material of the isolation regions 401, such that top surfaces of the isolation regions 401 and top surfaces of the semiconductor strips 301 are coplanar. In some embodiments where portions of the mask 203 (see FIG. 3A) remain over the semiconductor strips 301 after forming the semiconductor strips 301, the planarization process may also remove the remaining portions of the mask 203.

Figure 5A:
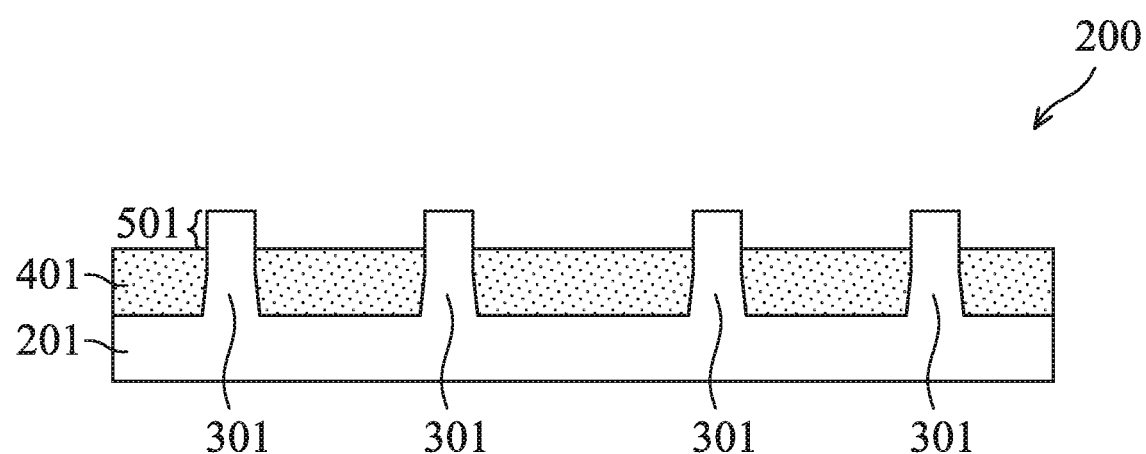

FIG. 5A illustrates the recessing of the isolation regions 401 to form shallow trench isolation (STI) regions 401. The isolation regions 401 are recessed such that fins 501 protrude from between neighboring isolation regions 401. Further, the top surfaces of the isolation regions 401 may have a flat surface as illustrated, a convex surface, a concave surface (such as dishing), or a combination thereof. The top surfaces of the isolation regions 401 may be formed flat, convex, and/or concave by an appropriate etch. The isolation regions 401 may be recessed using an acceptable etch process, such as one that is selective to the material of the isolation regions 401. In some embodiments, a chemical oxide removal using a CERTAS® etch, an Applied Materials SICONI tool, or dilute hydrofluoric (dHF) acid may be used.

A person having ordinary skill in the art will readily understand that the process described with respect to FIGS. 2A through 5A is just one example of how the fins 501 may be formed. In other embodiments, a dielectric layer can be formed over a top surface of the substrate 201; trenches can be etched through the dielectric layer; homoepitaxial structures can be epitaxially grown in the trenches; and the dielectric layer can be recessed such that the homoepitaxial structures protrude from the dielectric layer to form fins. In yet other embodiments, heteroepitaxial structures can be used for the fins. For example, the semiconductor strips 301 in FIG. 4A can be recessed, and one or more materials different from the semiconductor strips 301 may be epitaxially grown in their place. In even further embodiments, a dielectric layer can be formed over a top surface of the substrate 201; trenches can be etched through the dielectric layer; heteroepitaxial structures can be epitaxially grown in the trenches using one or more materials different from the substrate 201; and the dielectric layer can be recessed such that the heteroepitaxial structures protrude from the dielectric layer to form fins 501.

In some embodiments where homoepitaxial or heteroepitaxial structures are epitaxially grown, the grown materials may be in situ doped during growth. In other embodiments, homoepitaxial or heteroepitaxial structures may be doped using, for example, ion implantation after homoepitaxial or heteroepitaxial structures are epitaxially grown. In various embodiments, the fins 501 may comprise silicon germanium ($Si_xGe_{1-x}$, where x can be between approximately 0 and 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Figure 6A:
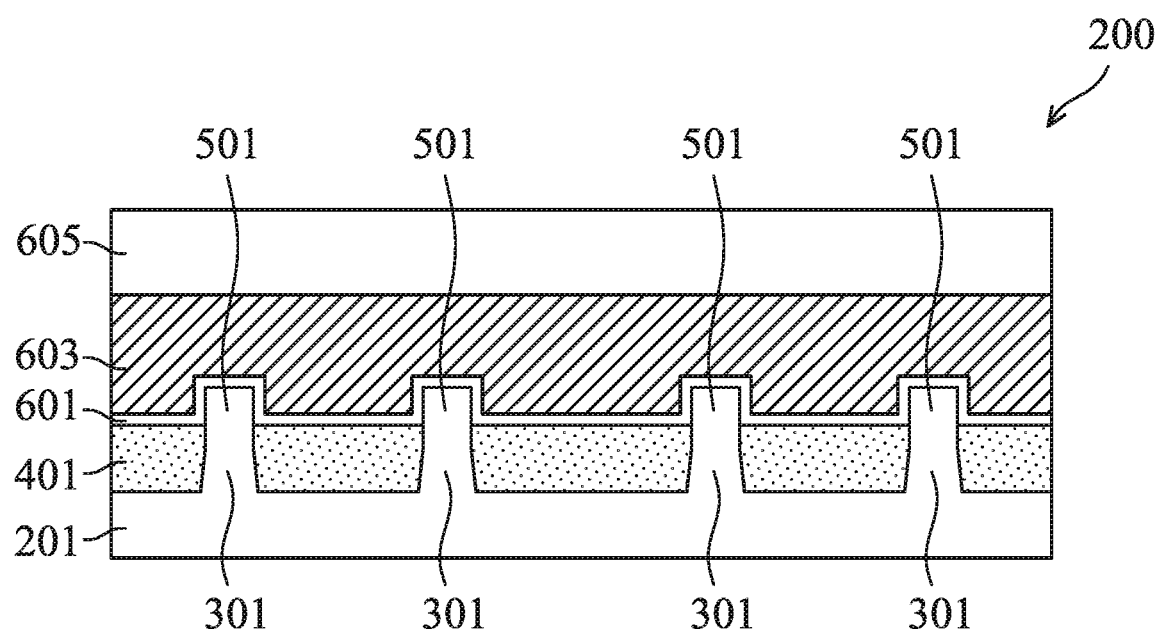
FIGS. 6A and 6B are cross-sectional views of an intermediate stage in the manufacture of a FinFET device in accordance with some embodiments.
Figure 6B:
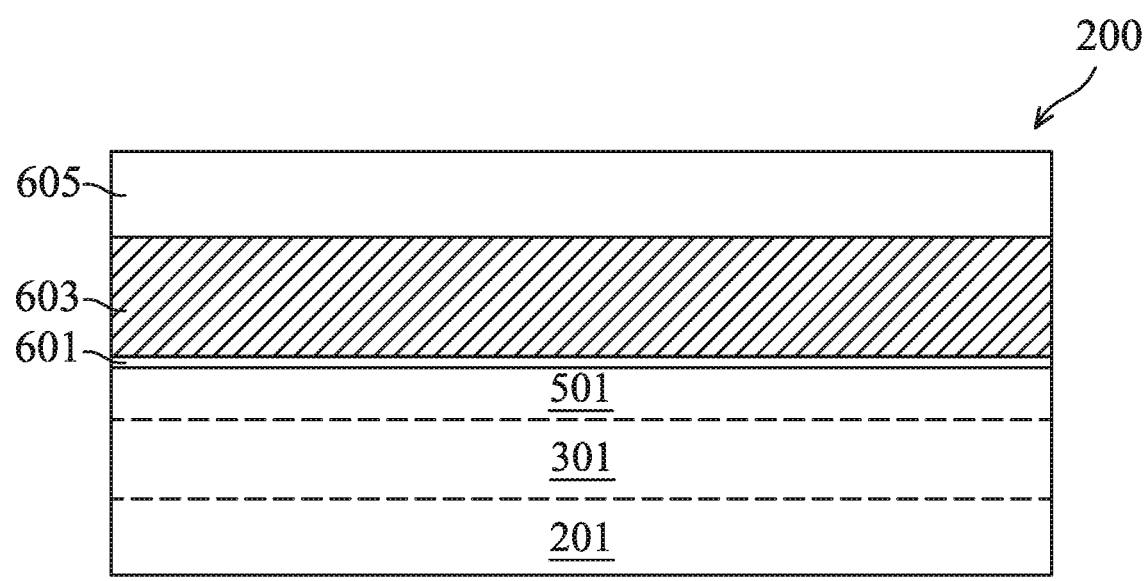

Referring to FIGS. 6A and 6B, a dielectric layer 601 is formed on sidewalls and top surfaces of the fins 501. In some embodiments, the dielectric layer 601 may be also formed over the isolation regions 401. In other embodiments, top surfaces of the isolation regions 401 may be free from the dielectric layer 601. The dielectric layer 601 may comprise an oxide, such as silicon oxide, or the like, and may be deposited (using, for example, ALD, CVD, PVD, a combination thereof, or the like) or thermally grown (for example, using thermal oxidation, or the like) according to acceptable techniques. In some embodiments, the dielectric layer 601 may comprise a dielectric material that has an acceptable breakdown voltage and leakage performance. A gate electrode layer 603 is formed over the dielectric layer 601, and a mask 605 is formed over the gate electrode layer 603. In some embodiments, the gate electrode layer 603 is deposited over the dielectric layer 601 and then planarized using, for example, a CMP process. The mask 605 is then deposited over the gate electrode layer 603. The gate electrode layer 603 may be made of, for example, polysilicon, although other materials that have a high etching selectivity with respect to the material of the isolation regions 401 may also be used. In other embodiments, the gate electrode layer 603 may comprise one or more suitable metallic materials. The mask 605 may include one or more layers of, for example, silicon oxide, silicon nitride, silicon oxynitride, silicon carbide, silicon carbonitride, a combination thereof, or the like, and may be formed using any suitable process, such as thermal oxidation, thermal nitridation, ALD, PVD, CVD, a combination thereof, or the like.

Figure 7A:
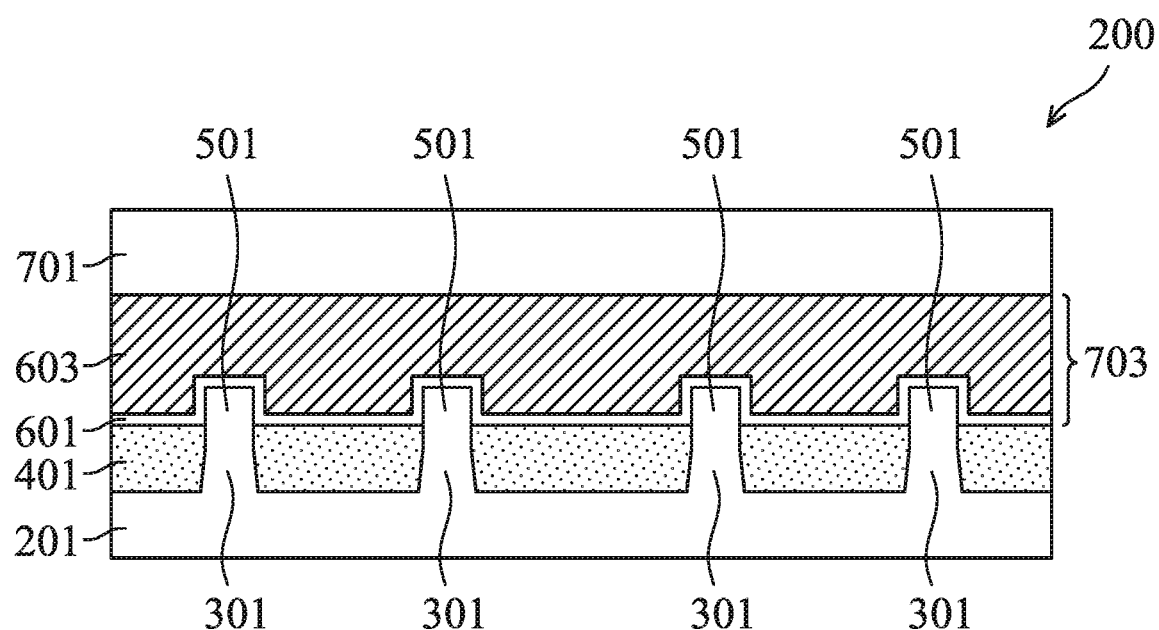
FIGS. 7A, 7B and 7C are cross-sectional views of an intermediate stage in the manufacture of a FinFET device in accordance with some embodiments.
Figure 7B:
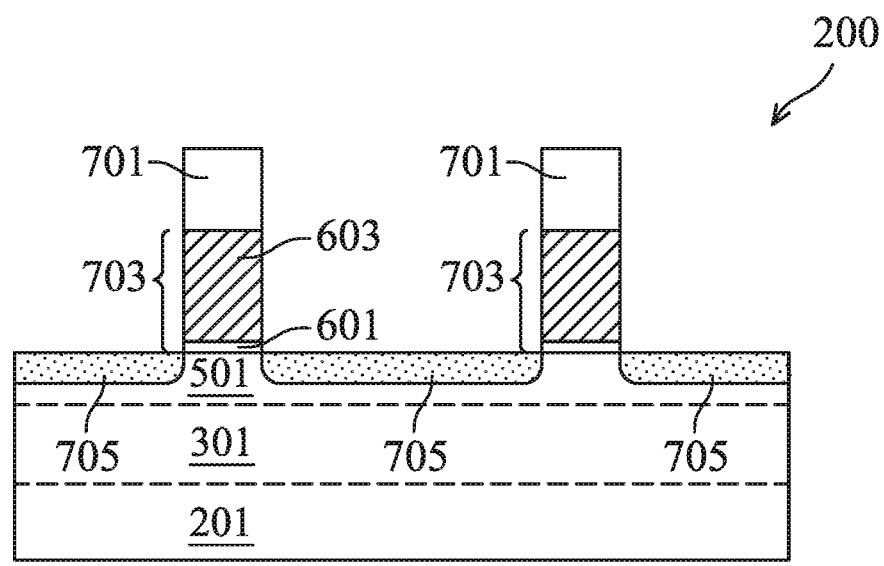
Figure 7C:
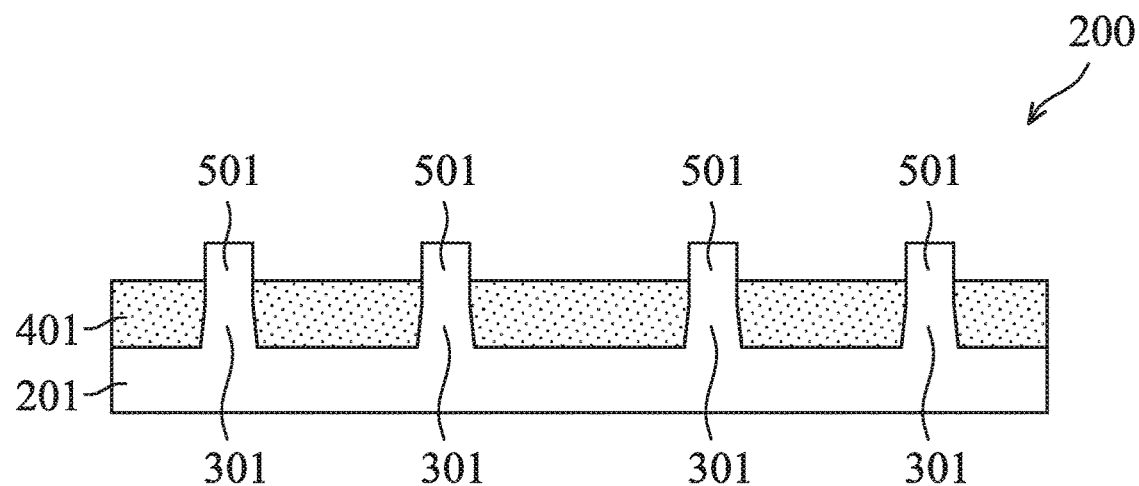

Referring to FIGS. 7A, 7B, and 7C, the mask 605 (see FIGS. 6A and 6B) may be patterned using acceptable photolithography and etching techniques to form a patterned mask 701. The pattern of the patterned mask 701 is transferred to the gate electrode layer 603 and the dielectric layer 601 by acceptable etching techniques to form gates 703. The pattern of the gates 703 cover respective channel regions of the fins 501 (see FIG. 7B) while exposing source/drain regions of the fins 501 (see FIG. 7C). The gates 703 may also have a lengthwise direction substantially perpendicular to the lengthwise direction of respective fins 501 within process variations (see FIG. 7A). A size of the gates 703, and a pitch between the gates 703, may depend on a region of a die in which the gates 703 are formed. In some embodiments, the gates 703 may have a larger size and a larger pitch when located in, for example, an input/output region of a die (e.g., where input/output circuitry is disposed) than when located in, for example, a logic region of a die (e.g., where logic circuitry is disposed). As described below in greater detail, the gates 703 are sacrificial gates and are subsequently replaced by replacement gates. Accordingly, the gates 703 may also be referred to as sacrificial gates or dummy gates. In other embodiments, the gates 703 are not replaced and remain in the final structure of the FinFET device 200.

Referring further to FIGS. 7A, 7B, and 7C, lightly doped source/drain (LDD) regions 705 may be formed in the substrate 201. Similar to the implantation process discussed above with reference to FIG. 2A, appropriate impurities are implanted into the fins 501 to form the LDD regions 705. In some embodiments where the resulting FinFET device 200 is a p-type device, p-type impurities are implanted into the fins 501 to form p-type LDD regions 705. In some embodiments where the resulting FinFET device 200 is an n-type device, n-type impurities are implanted into the fins 501 to form n-type LDD regions 705. During the implantation of the LDD regions 705, the gates 703 and the patterned mask 701 may act as a mask to prevent (or at least reduce) dopants from implanting into the channel regions of the fins 501. Thus, the LDD regions 705 may be formed substantially in the source/drain regions of the fins 501. The n-type impurities may be any of the n-type impurities previously discussed, and the p-type impurities may be any of the p-type impurities previously discussed. After the implantation process, an annealing process may be performed to activate the implanted impurities.

Figure 8A:
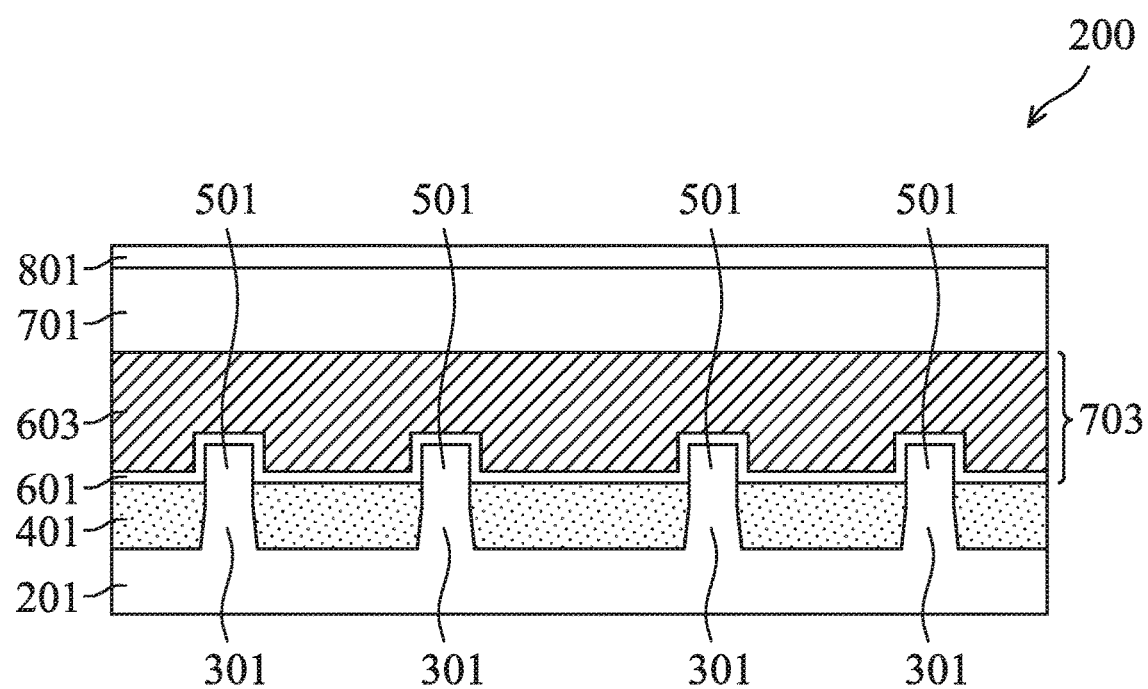
FIGS. 8A, 8B and 8C are cross-sectional views of an intermediate stage in the manufacture of a FinFET device in accordance with some embodiments.
Figure 8B:
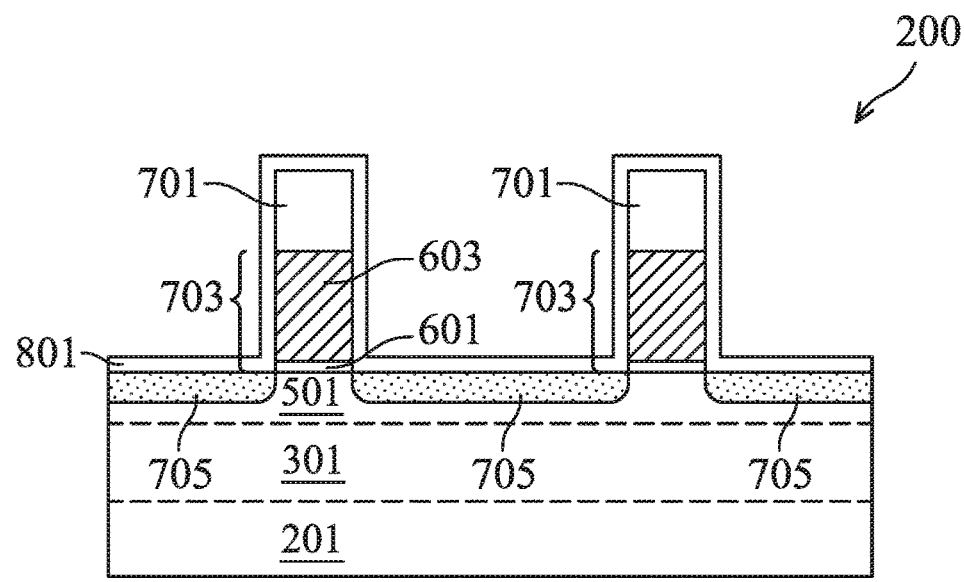
Figure 8C:
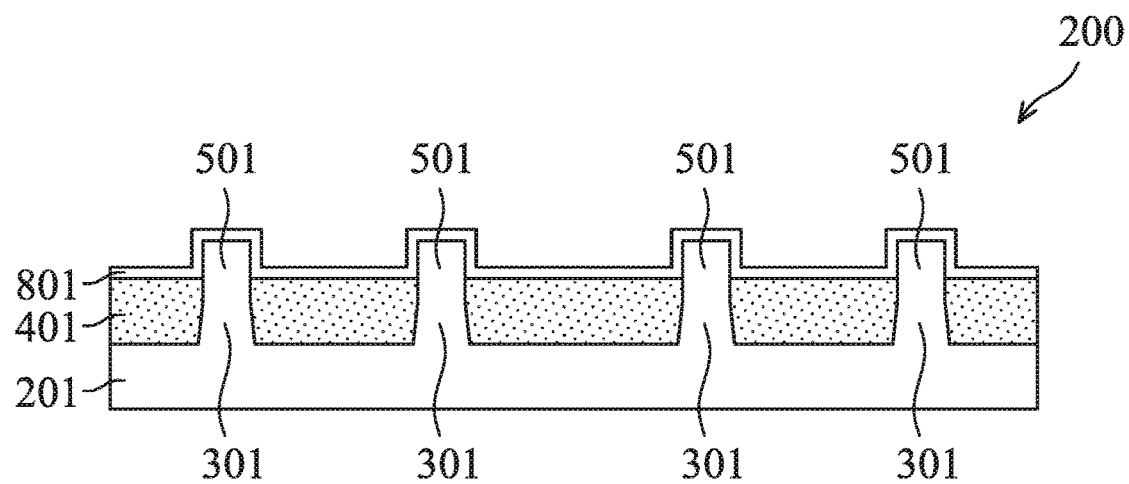

Referring to FIGS. 8A, 8B, and 8C, a dielectric layer 801 is blanket formed on exposed surfaces of the gates 703, the patterned mask 701, the isolation regions 401, and the fins 501. In some embodiments, the dielectric layer 801 may comprise silicon nitride (SiN), silicon oxynitride (SiON), silicon oxycarbide (SiOC), silicon carbonitride (SiCN), silicon carboxynitride (SiOCN), a combination thereof, or the like, and may be formed using CVD, ALD, a combination thereof, or the like. The dielectric layer 801 may be also referred to as a spacer layer. In some embodiments, the dielectric layer 801 has a thickness between about 2 nm and about 4 nm.

Figure 9A:
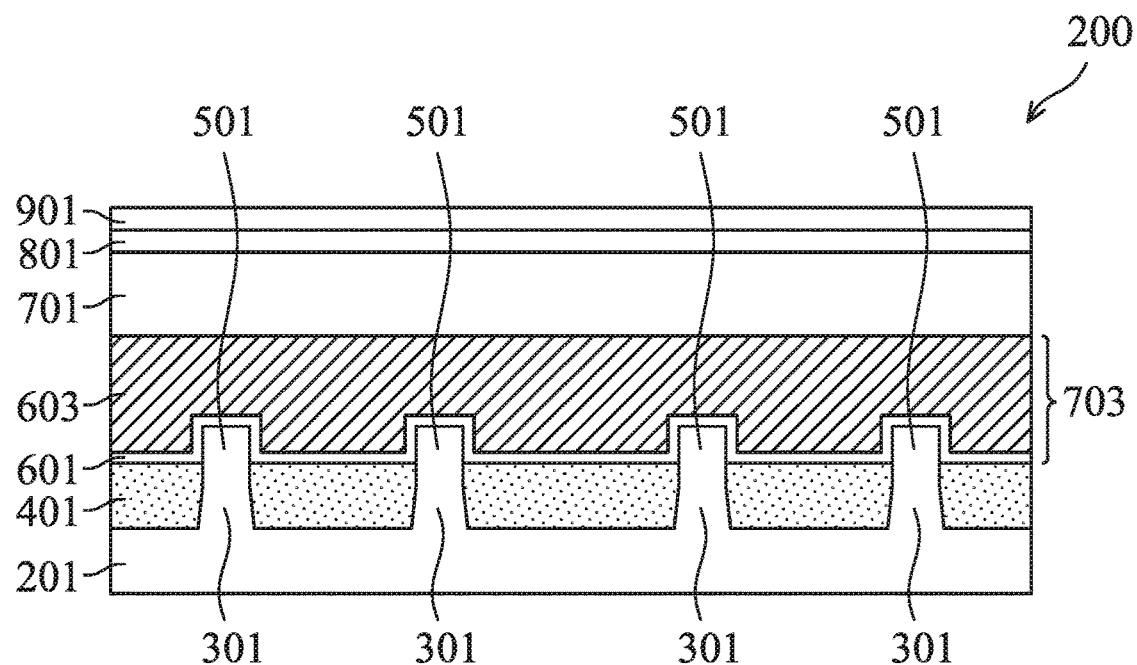
FIGS. 9A, 9B and 9C are cross-sectional views of an intermediate stage in the manufacture of a FinFET device in accordance with some embodiments.
Figure 9B:
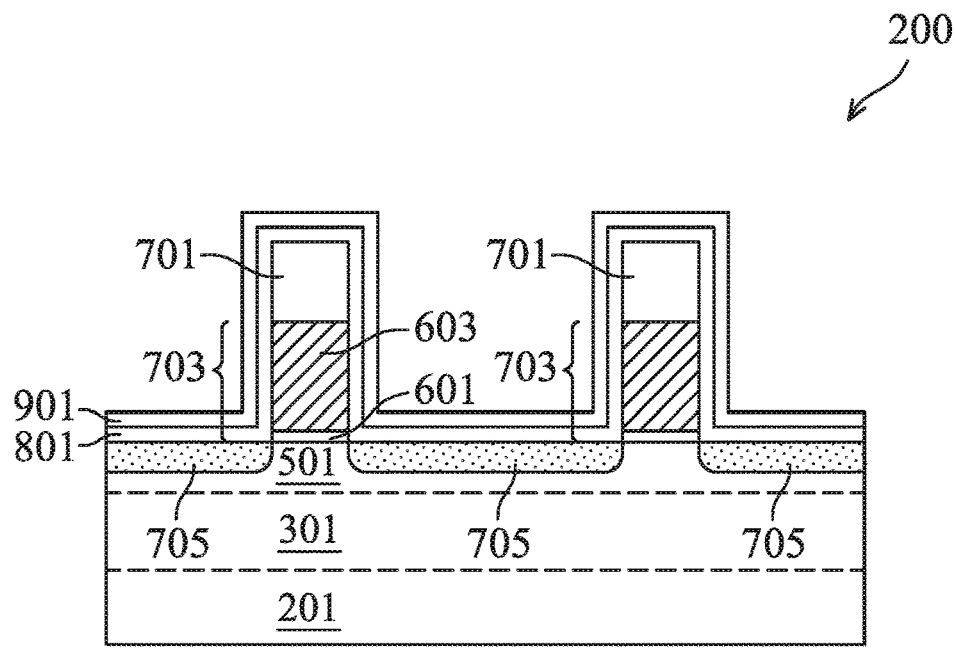
Figure 9C:
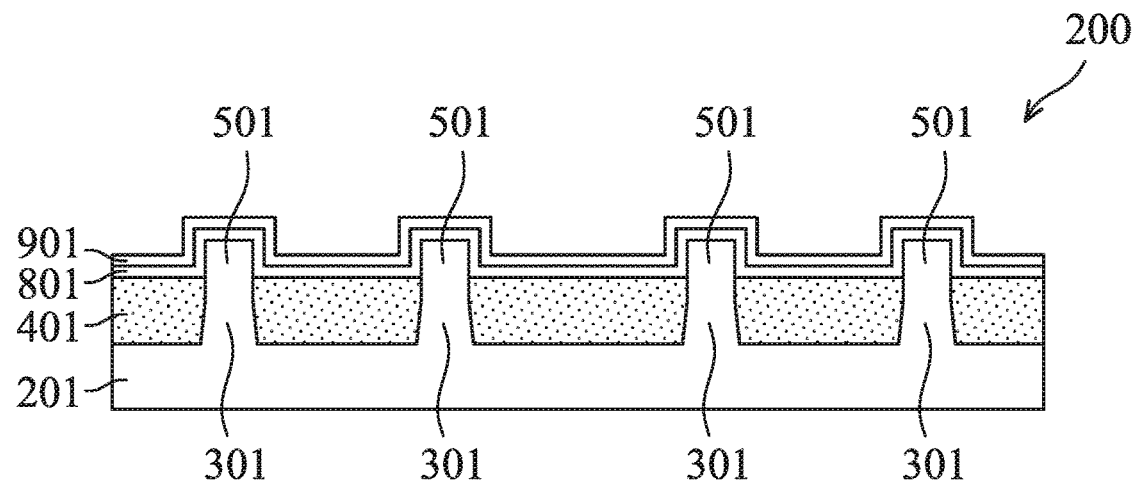

Referring to FIGS. 9A, 9B, and 9C, a protection layer 901 is blanket formed over the dielectric layer 801. In some embodiments, the protection layer 901 comprises carbon. In other embodiments, the protection layer 901 comprises boron. In yet other embodiments, the protection layer 901 is a carbon layer or a boron layer. In some embodiments, the protection layer 901 has a thickness between about 0.5 nm and about 4 nm. As described below in greater detail, the protection layer 901 protects the dielectric layer 801 in a subsequent etch process for forming an air gap (see FIGS. 24A, 24B, and 24C). In some embodiments, the protection layer 901 is formed using a plasma-assisted process, such as a plasma-enhanced CVD (PECVD), or the like. In some embodiments where the protection layer 901 comprises boron, the plasma-assisted process uses a gas mixture comprising a boron-containing precursor gas. The boron-containing precursor gas may be $B_2H_6$, $BF_3$, a combination thereof, or the like. In some embodiments where the protection layer 901 comprises carbon, the plasma-assisted process uses a gas mixture comprising a carbon-containing precursor gas. The carbon-containing precursor gas may be $CH_4$, $CO$, $CO_2$, a combination thereof, or the like. In some embodiments, the gas mixture of the plasma-assisted process may also comprise an inert gas. The inert gas may comprise xenon, helium, argon, neon, krypton, radon, the like, or combinations thereof. As described below in greater detail, in some embodiments, the protection layer 901 may be formed using a plasma-assisted deposition/doping apparatus 1000 (see FIG. 10).

Figure 10:
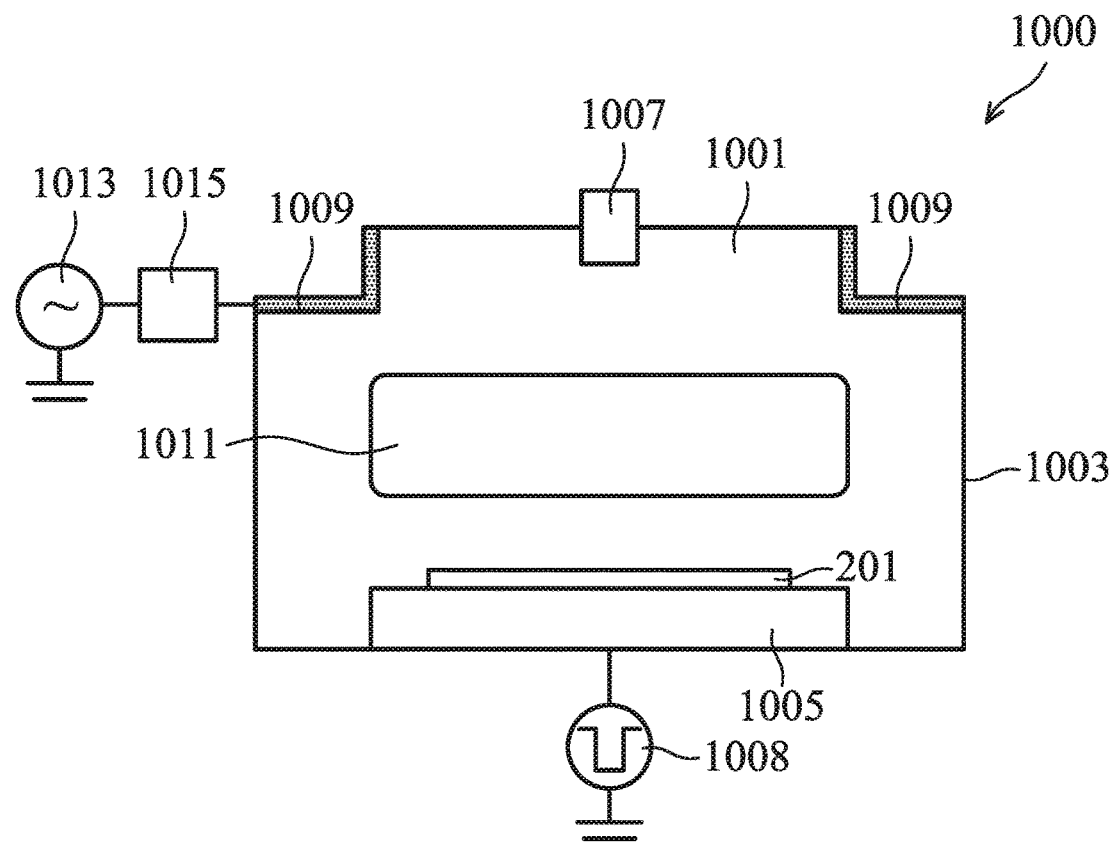
FIG. 10 is a cross-sectional view of a plasma deposition/doping apparatus in accordance with some embodiments.

FIG. 10 is a cross-sectional view of a plasma-assisted deposition/doping apparatus 1000 in accordance with some embodiments. The plasma-assisted deposition/doping apparatus 1000 may be used to perform a deposition process for forming the protection layer 901 over the dielectric layer 801 (see FIGS. 9A, 9B, and 9C). As described below in greater detail, the plasma-assisted deposition/doping apparatus 1000 may be also used to perform a doping process for doping the protection layer 901 to form a protection layer (see FIGS. 28A, 28B, and 28C). The plasma-assisted deposition/doping apparatus 1000 includes a chamber 1001 defined by a housing 1003. A chuck 1005 in the chamber 1001 holds a wafer, such as a wafer including the substrate 201. A gas inlet 1007 provides suitable process gasses to the chamber 1001. A plasma generator 1009 generates plasma 1011 from the process gases. The plasma generator 1009 is coupled to a radio-frequency (RF) power source 1013 through a matching circuit system 1015. In some embodiments, the plasma generator 1009 may be a transformer-coupled plasma generator, inductively coupled plasma system, magnetically enhanced reactive ion etch system, electron cyclotron resonance system, a remote plasma generator, or the like. In some embodiment, the RF power source 1013 is operated at a power between about 200 W and about 3300 W. A voltage source 1008 is coupled to the chuck 1005 to generate a bias voltage between the plasma generator 1009 and the chuck 1005. In some embodiments, the voltage source 1008 generates a pulsed DC bias voltage comprising DC voltage pulses (applying a negative DC bias voltage between the plasma generator 1009 and the chuck 1005) separated by discharge steps (applying zero bias voltage between the plasma generator 1009 and the chuck 1005). Each DC voltage pulse may be from about −0.2 kV to about −10 kV. Each DC voltage pulse may have duration from about 20 μs to about 100 μs. The DC voltage pulses have a frequency from about 0.2 kHz to about 9 kHz.

In some embodiments, the plasma-assisted deposition/doping apparatus 1000 may perform deposition and doping processes in an alternating manner. The deposition process is performed during discharge steps when ions of the plasma 1011 are neutralized at a surface of the wafer and are deposited over the dielectric layer 801 to form the protection layer 901 (see FIGS. 9A, 9B, and 9C). The doping process is performed during the DC voltage pulse steps when ions of the plasma 1011 are accelerated by the DC bias voltage of the DC voltage pulse and are implanted into the dielectric layer 801 (see FIGS. 28A, 28B, and 28C).

Referring further to FIG. 10, in some embodiments, the plasma-assisted deposition/doping apparatus 1000 may be configured to perform mainly a deposition process on the dielectric layer 801 without significantly doping the dielectric layer 801. In such embodiments, the DC bias voltage of the DC voltage pulses, the duration of the DC voltage pulses and the frequency of the DC voltage pulses may be altered. For example, the DC bias voltage of the DC voltage pulses may be altered such that energy of ions of the plasma 1011 is insufficient to implant the ions of the plasma 1011 into the dielectric layer 801. Instead, the ions of the plasma 1011 are deposited over the dielectric layer 801. In some embodiments where the plasma-assisted deposition/doping apparatus 1000 is configured to perform a deposition process, the DC bias voltage of the DC voltage pulses is from about 0.3 kV to about 5 kV. In some embodiments where the plasma-assisted deposition/doping apparatus 1000 is configured to perform a deposition process, the duration of the DC voltage pulses is from about 10 μs to about 100 μs. In some embodiments where the plasma-assisted deposition/doping apparatus 1000 is configured to perform a deposition process, the frequency of the DC voltage pulses is from about 500 Hz to about 9000 Hz.

In other embodiments, the plasma-assisted deposition/doping apparatus 1000 may be configured to perform mainly a doping process on the dielectric layer 801 (see FIGS. 28A, 28B, and 28C) without performing a significant deposition process. In such embodiments, the DC bias voltage of the DC voltage pulses, the duration of the DC voltage pulses and the frequency of the DC voltage pulses may be altered. For example, the DC bias voltage of the DC voltage pulses may be altered such that energy of ions of the plasma 1011 is sufficient to implant the ions of the plasma 1011 into the dielectric layer 801. Furthermore, the duration of discharge steps may be also reduced. In some embodiments where the plasma-assisted deposition/doping apparatus 1000 is configured to perform a doping process, the DC bias voltage of the DC voltage pulses is from about 0.3 kV to about 5 kV. In some embodiments where the plasma-assisted deposition/doping apparatus 1000 is configured to perform a doping process, the duration of the DC voltage pulses is from about 10 μs to about 100 μs. In some embodiments where the plasma deposition/doping apparatus 1000 is configured to perform a doping process, the frequency of the DC voltage pulses is from about 500 Hz to about 9000 Hz. In some embodiments where the plasma-assisted deposition/doping apparatus 1000 is configured to perform a doping process, the duration of discharge steps is from about 10 μs to about 100 μs.

Figure 11A:
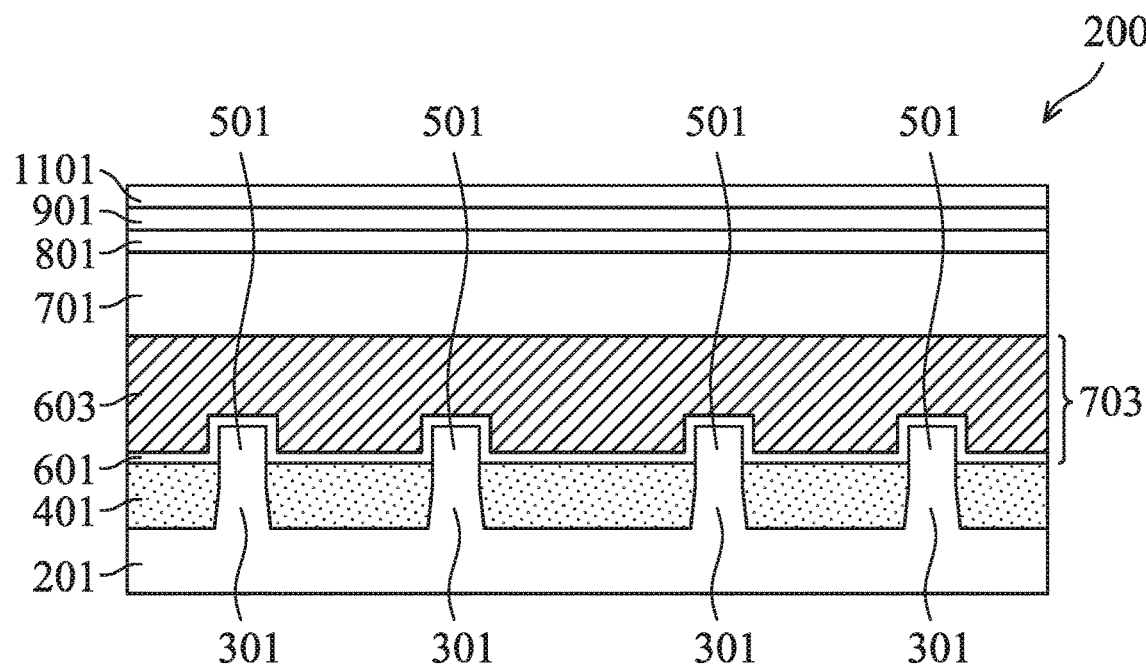
FIGS. 11A, 11B and 11C are cross-sectional views of an intermediate stage in the manufacture of a FinFET device in accordance with some embodiments.
Figure 11B:
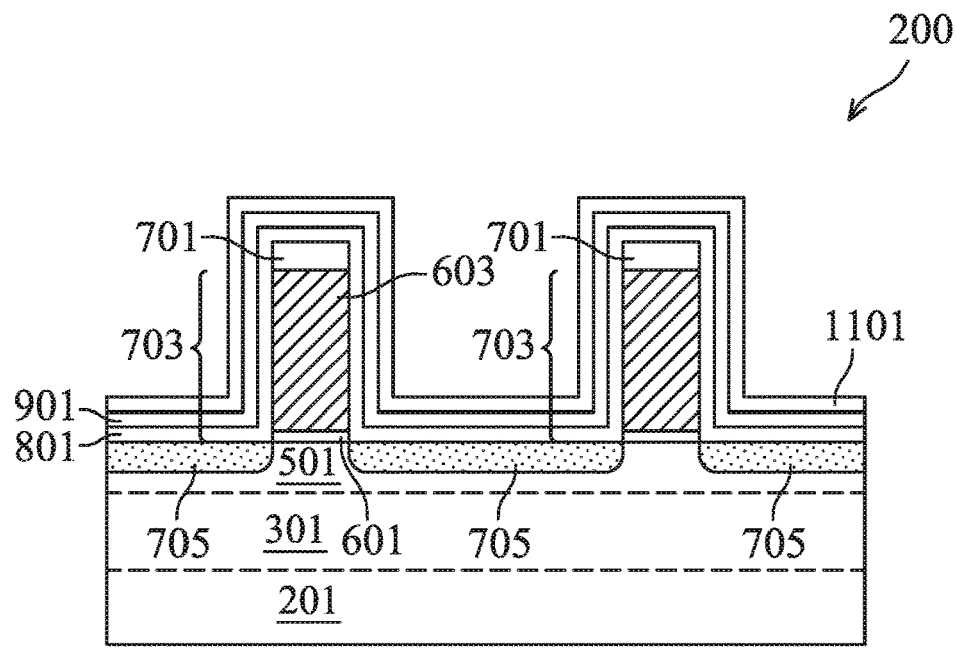
Figure 11C:
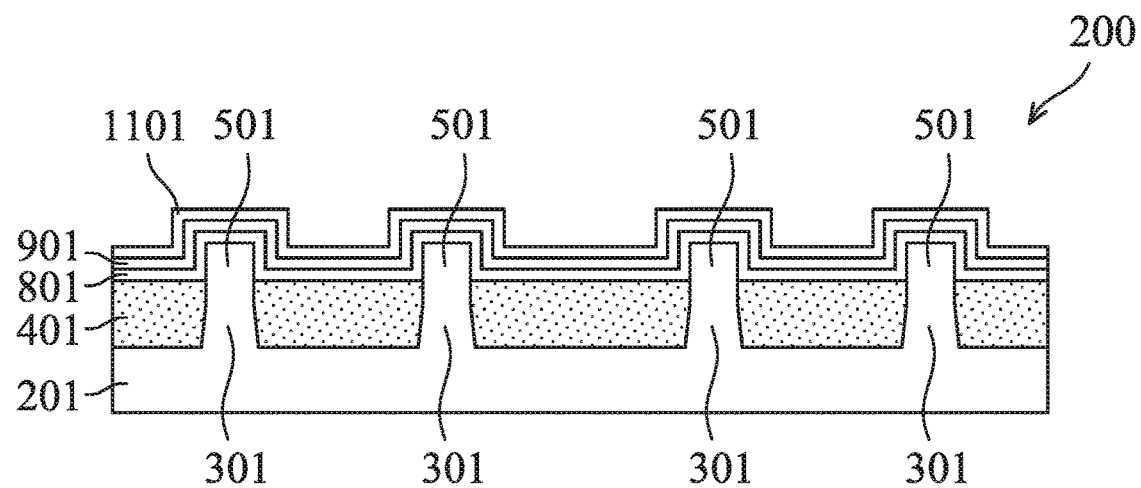

Referring to FIGS. 11A, 11B, and 11C, after forming the protection layer 901, a dielectric layer 1101 is formed over the protection layer 901. In some embodiments, the dielectric layer 1101 may be formed using similar materials and methods as the dielectric layer 801 described above with reference to FIGS. 8A, 8B, and 8C, and the description is not repeated herein. In some embodiments, the dielectric layer 1101 and the dielectric layer 801 comprise a same material. In other embodiments, the dielectric layer 1101 and the dielectric layer 801 comprise different materials. As described below in greater detail, the dielectric layer 1101 is removed to form an air gap (see FIGS. 24A, 24B, and 24C), while the protection layer 901 protects the dielectric layer 801. The dielectric layer 1101 may be also referred to as a spacer layer, or a sacrificial spacer layer. In some embodiments, the dielectric layer 1101 has a thickness between about 2 nm and about 5 nm.

Figure 12A:
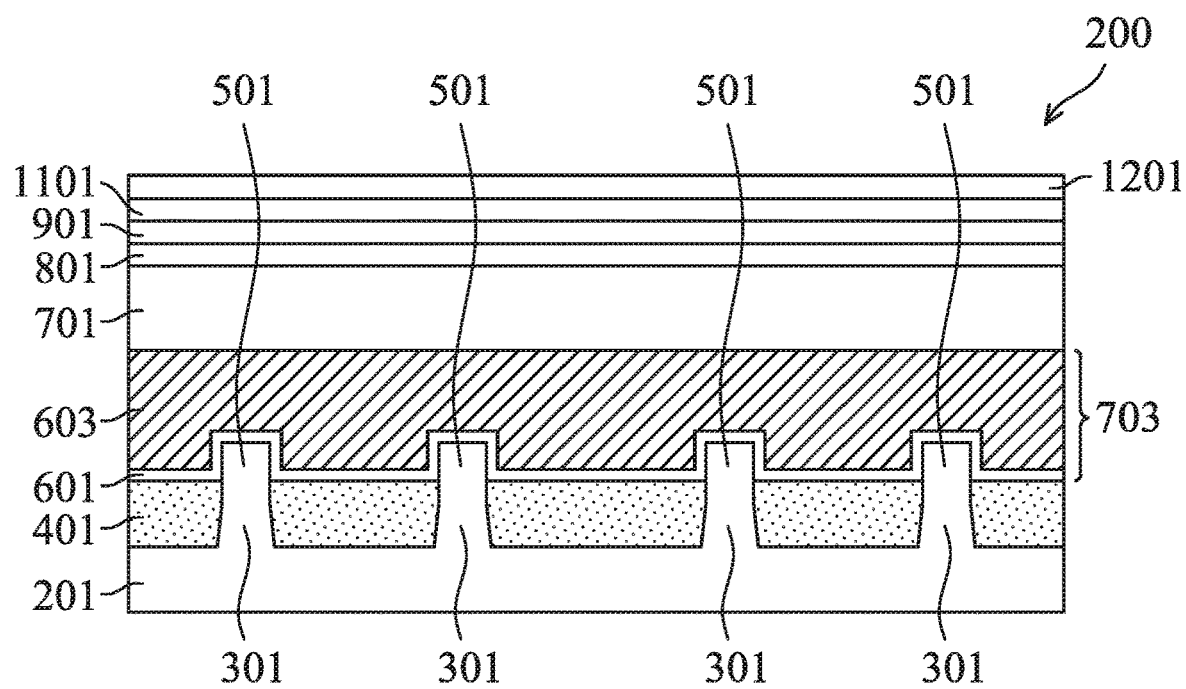
FIGS. 12A, 12B and 12C are cross-sectional views of an intermediate stage in the manufacture of a FinFET device in accordance with some embodiments.
Figure 12B:
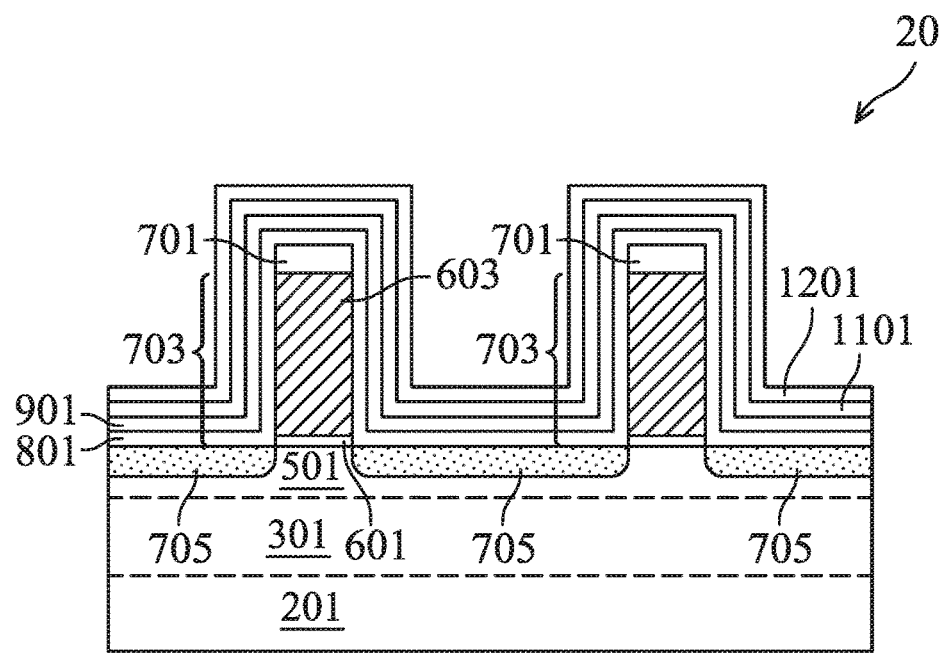
Figure 12C:
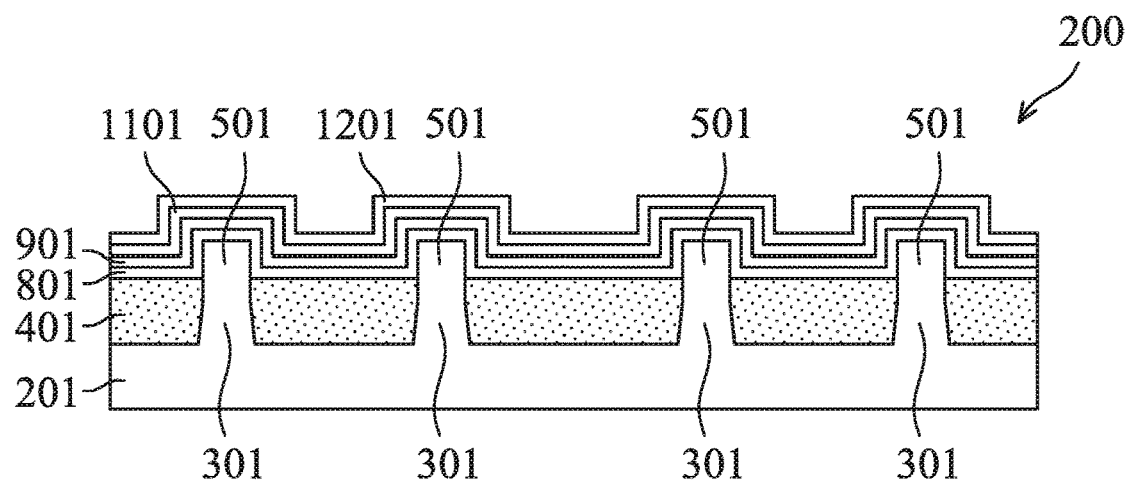

FIGS. 12A-16A, 12B-16B, and 12C-16C illustrate formation of epitaxial source/drain regions 1501 in the fins 501 between adjacent gates 703. Referring to FIGS. 12A, 12B, and 12C, a dielectric layer 1201 is formed over the dielectric layer 1101. In some embodiments, the dielectric layer 1201 may be formed using similar materials and methods as the dielectric layer 801 described above with reference to FIGS. 8A, 8B, and 8C, and the description is not repeated herein. In some embodiments, the dielectric layer 1201 and the dielectric layer 1101 comprise different materials. As described below in greater detail, the dielectric layer 1201 is removed after forming the epitaxial source/drain regions 1501. Accordingly, the dielectric layer 1201 may also be referred to as a dummy layer or a sacrificial layer. In some embodiments, the dielectric layer 1201 has a thickness between about 2 nm and about 4 nm.

Figure 13A:
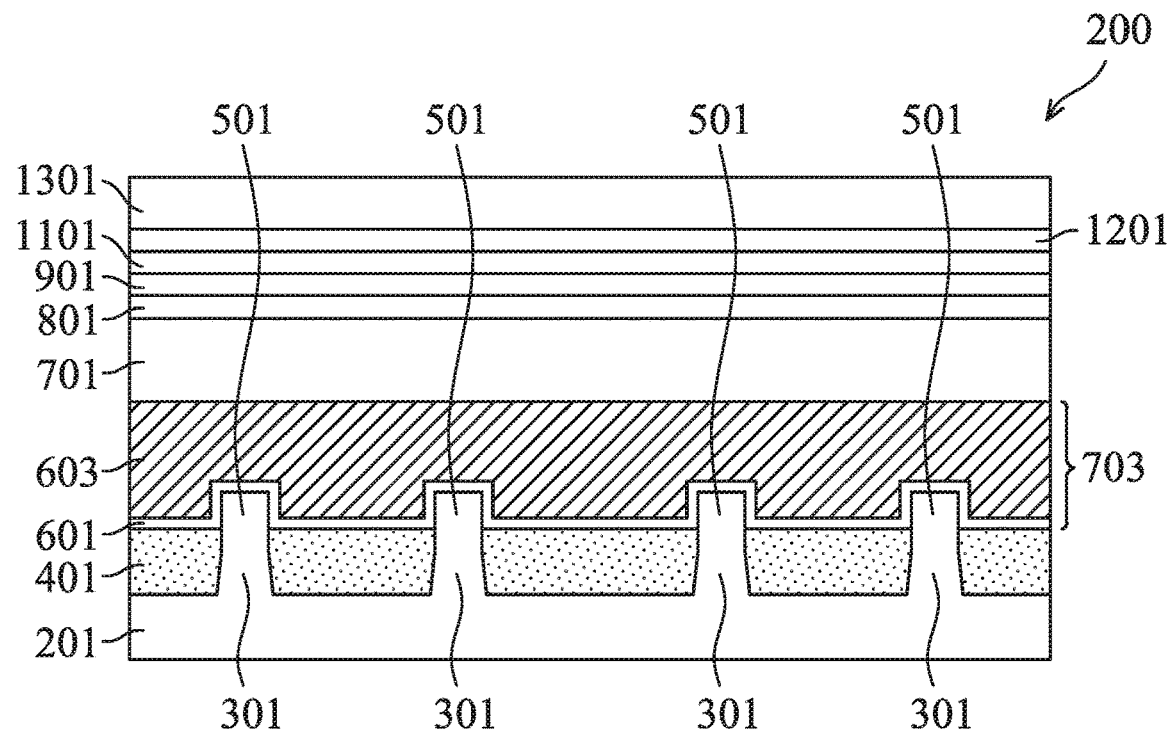
FIGS. 13A, 13B and 13C are cross-sectional views of an intermediate stage in the manufacture of a FinFET device in accordance with some embodiments.
Figure 13B:
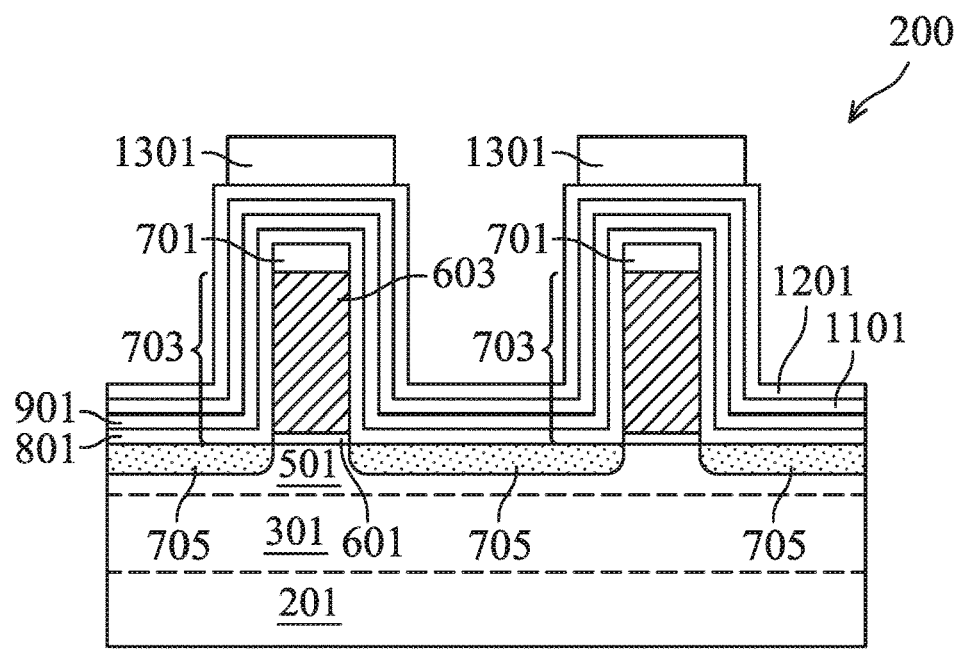
Figure 13C:
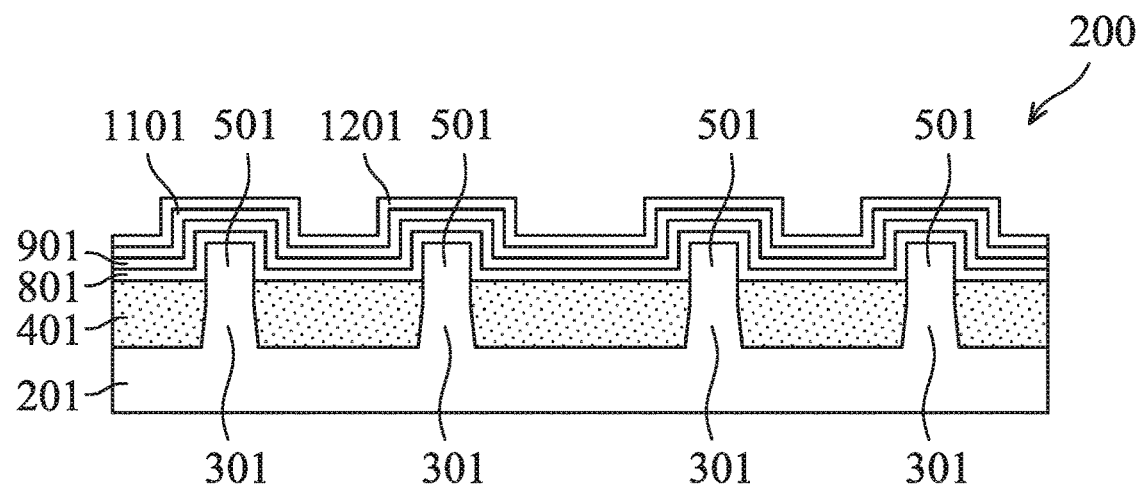

Referring to FIGS. 13A, 13B, and 13C, a patterned mask 1301 is formed over the substrate 201 to protect the gates 703 and expose source/drain regions of the fins 501. A mask layer is deposited and patterned to form the patterned mask 1301. In some embodiments, the mask layer may comprise a photoresist, or the like, and may be formed using a spin-on process, or the like. In some embodiments where the mask layer comprises a photoresist, the mask layer is patterned using suitable photolithography methods.

Figure 14A:
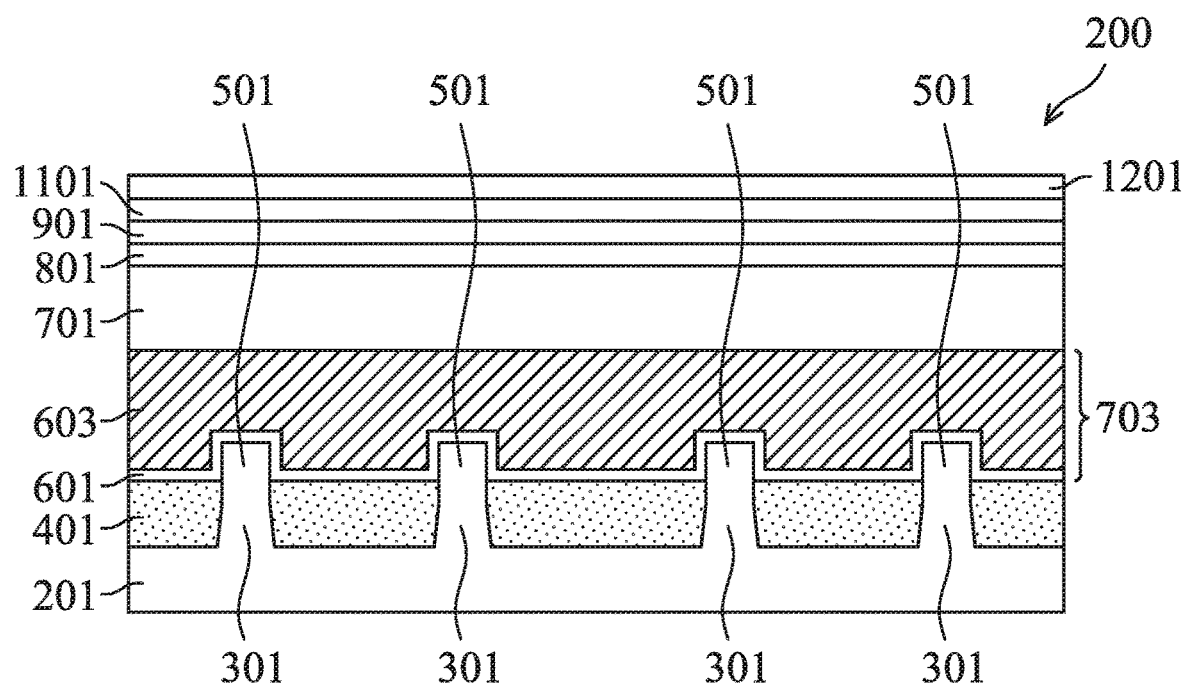
FIGS. 14A, 14B and 14C are cross-sectional views of an intermediate stage in the manufacture of a FinFET device in accordance with some embodiments.
Figure 14B:
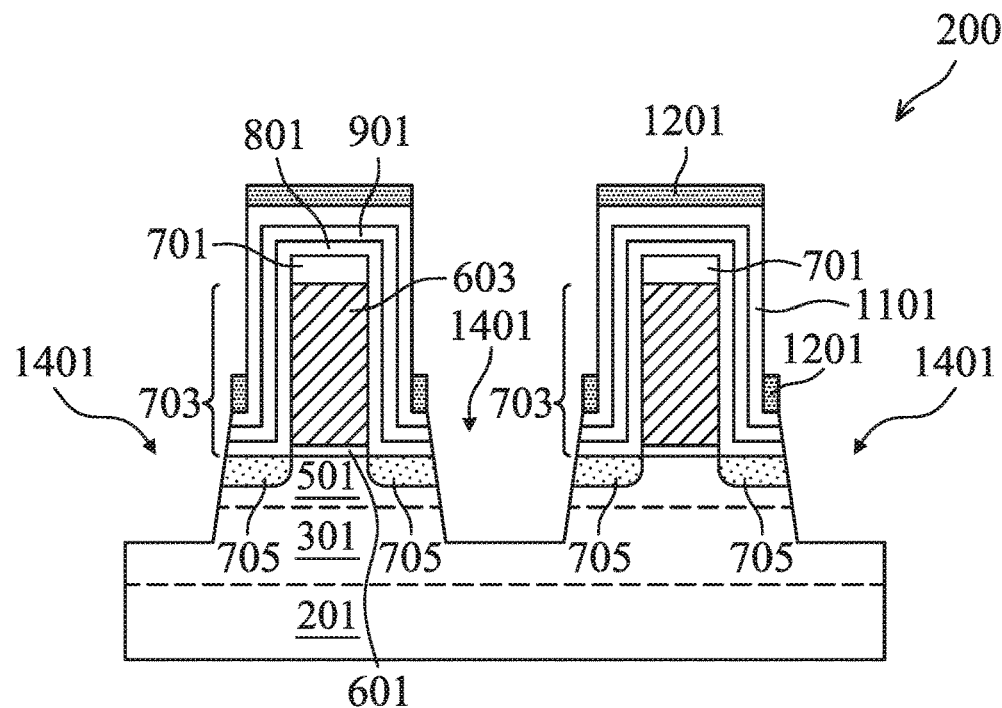
Figure 14C:
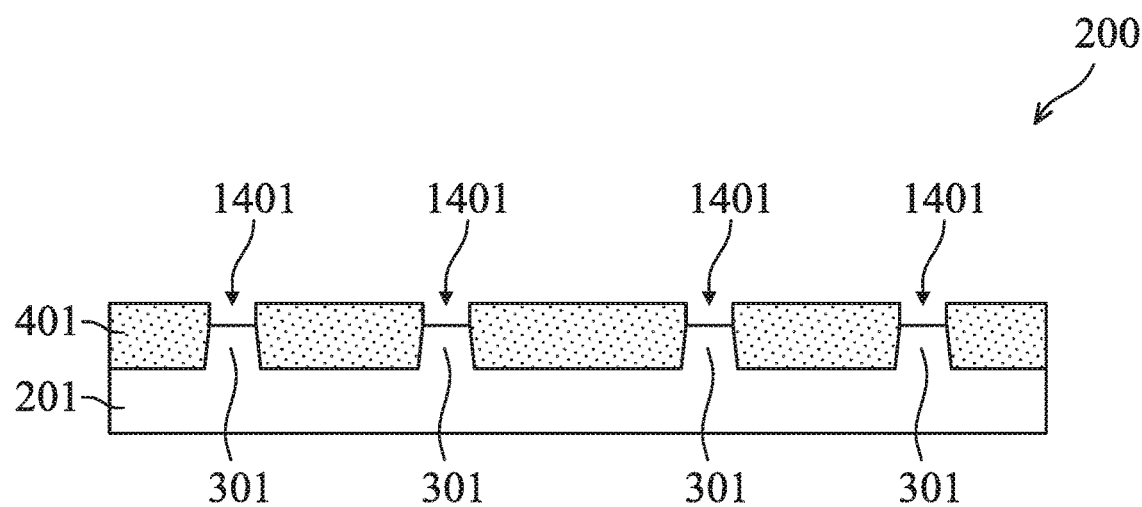

Referring to FIGS. 14A, 14B, and 14C, after forming the patterned mask 1301, a patterning process is performed on the dielectric layers 801, 1101 and 1201, the protection layer 901, and the fins 501 to form recesses 1401 in the source/drain regions of the fins 501. In some embodiments, the patterning process may include one or more suitable etch processes, such as anisotropic dry etch processes, while using the patterned mask 1301 as an etch mask. The suitable anisotropic etch processes may include a reactive ion etch (RIE), a neutral beam etch (NBE), a combination thereof, or the like. In some embodiments, unprotected portions of the dielectric layer 1201 may not be fully removed while forming the recesses 1401. In such embodiments, portions of the dielectric layer 1201 remain along sidewalls of the gates 703 in addition to portions of the dielectric layer 1201 over the gates 703 that were protected by the patterned mask 1301 (see FIG. 13B). After forming the recesses 1401, the patterned mask 1301 is removed. In some embodiments where the patterned mask 1301 comprises a photoresist, the patterned mask 1301 is removed by an ashing process followed by a wet clean process.

Figure 15A:
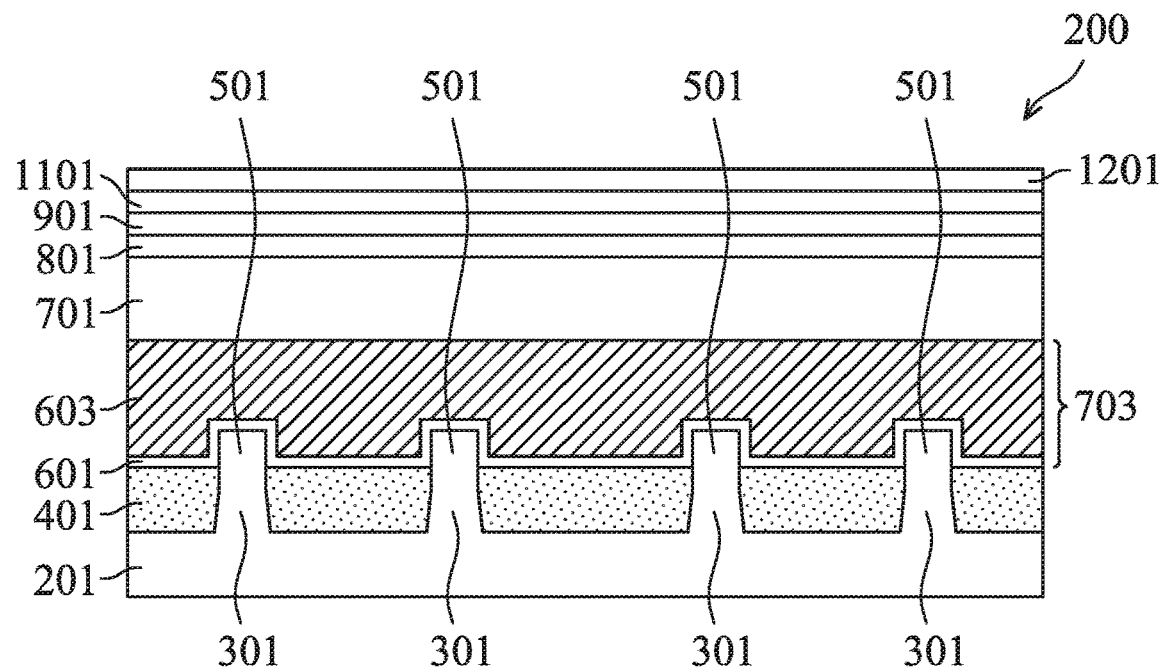
FIGS. 15A, 15B and 15C are cross-sectional views of an intermediate stage in the manufacture of a FinFET device in accordance with some embodiments.
Figure 15B:
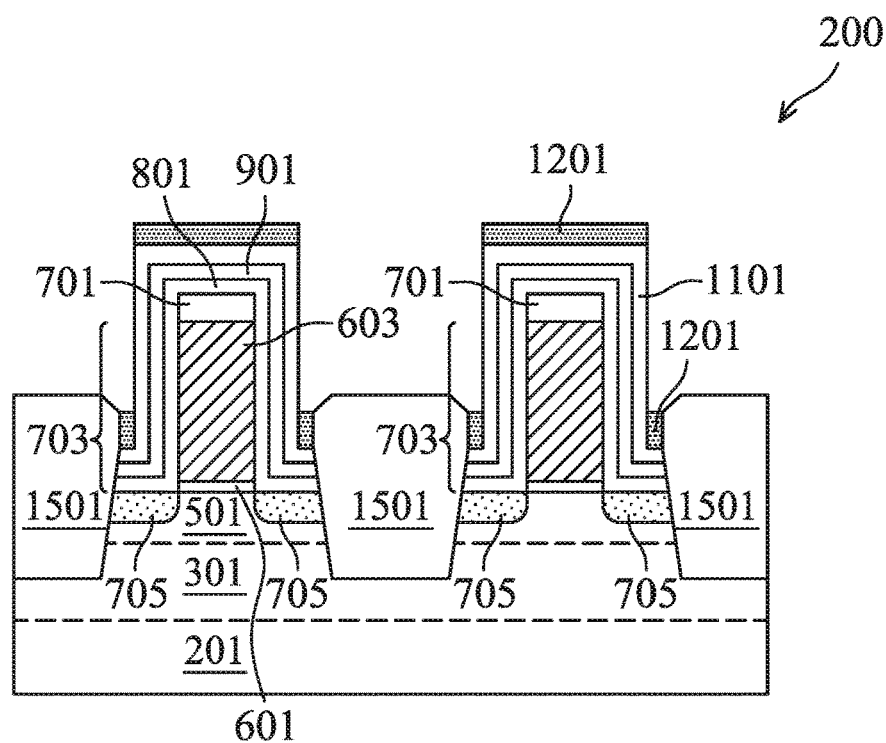
Figure 15C:
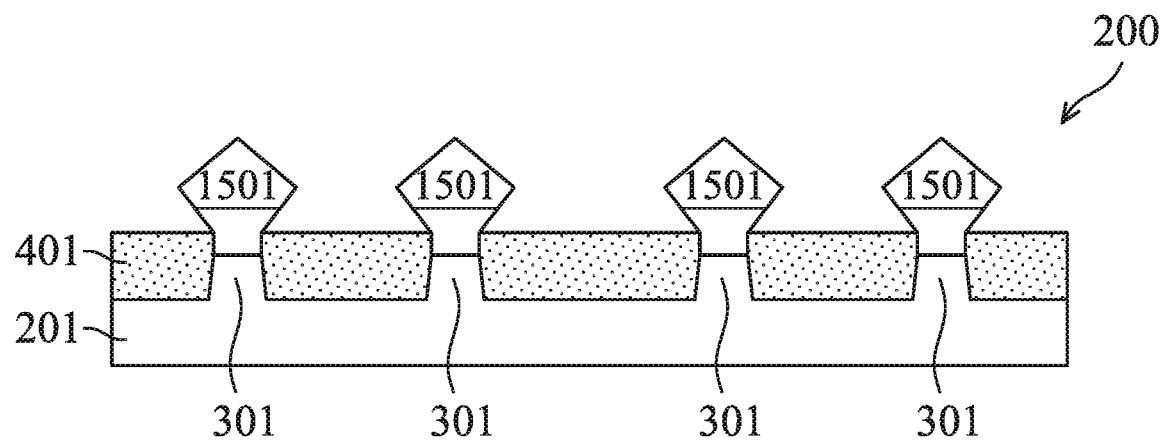

Referring to FIGS. 15A, 15B, and 15C, epitaxial source/drain regions 1501 are formed in the recesses 1401 (see FIGS. 14A, 14B, and 14C). In some embodiments, the epitaxial source/drain regions 1501 are epitaxially grown in the recesses 1401 using metal-organic CVD (MOCVD), molecular beam epitaxy (MBE), liquid phase epitaxy (LPE), vapor phase epitaxy (VPE), selective epitaxial growth (SEG), a combination thereof, or the like. In some embodiments where the FinFET device 200 is an n-type device and the fins 501 are formed of silicon, the epitaxial source/drain regions 1501 may include silicon, SiC, SiCP, SiP, or the like. In some embodiments where the FinFET device 200 is a p-type device and the fins 501 are formed of silicon, the epitaxial source/drain regions 1501 may include SiGe, SiGeB, Ge, GeSn, or the like. The epitaxial source/drain regions 1501 may have surfaces raised from respective surfaces of the fins 501 and may have facets. In some embodiments, the epitaxial source/drain regions 1501 may extend past the fins 501 and into the semiconductor strips 301. In some embodiments, the material of the epitaxial source/drain regions 1501 may be implanted with suitable dopants. In some embodiments, the implantation process is similar to the process used for forming the LLD regions 705 as described above with reference to FIGS. 7A, 7B, and 7C, and the description is not repeated herein. In other embodiments, the material of the epitaxial source/drain regions 1501 may be in situ doped during growth.

Figure 16A:
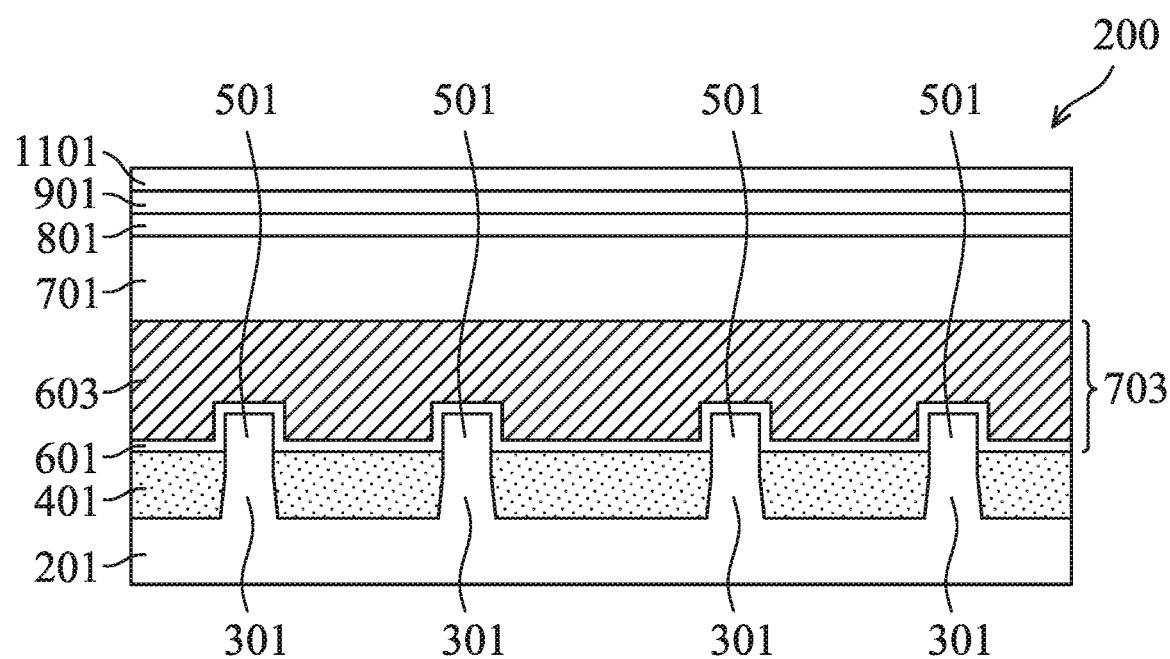
FIGS. 16A, 16B and 16C are cross-sectional views of an intermediate stage in the manufacture of a FinFET device in accordance with some embodiments.
Figure 16B:
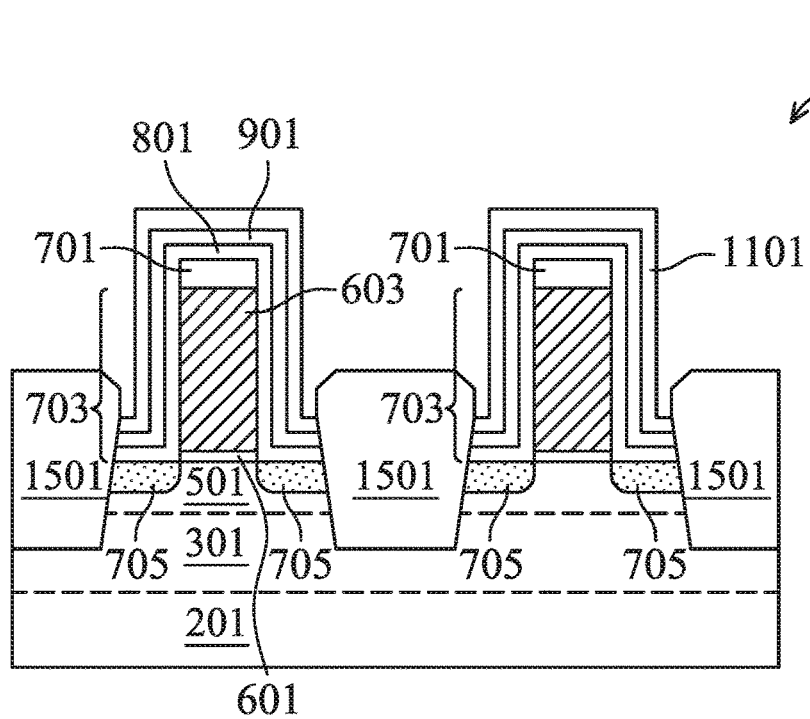
Figure 16C:
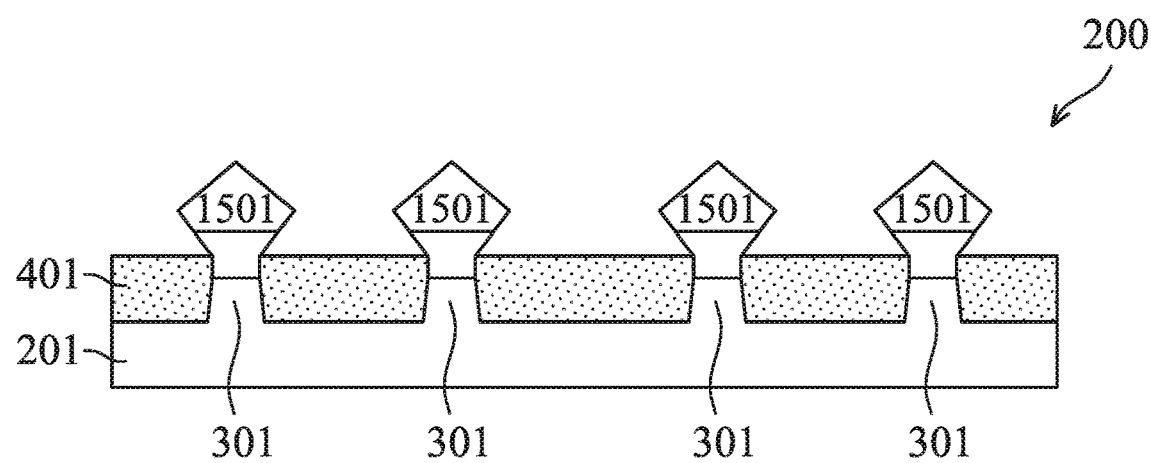
Figure 17C:
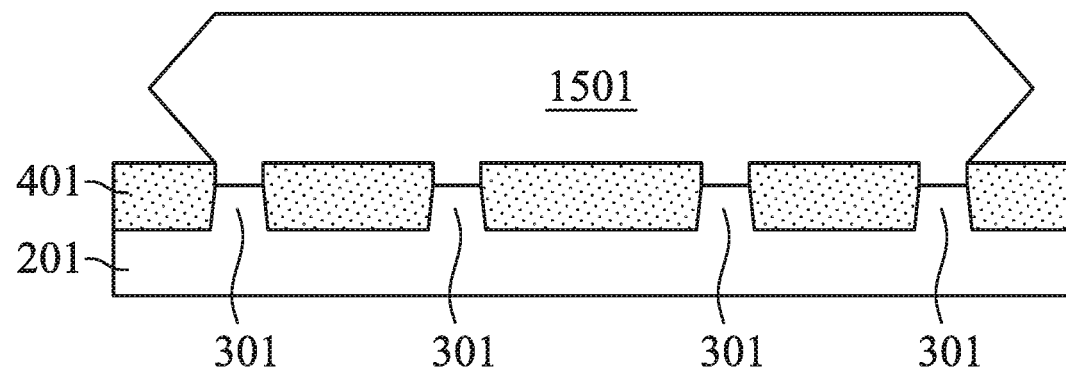
FIG. 17C is a cross-sectional view of an intermediate stage in the manufacture of a FinFET device in accordance with some embodiments.

Referring to FIGS. 16A, 16B, and 16C, after forming the epitaxial source/drain regions 1501, the remaining portions of the dielectric layer 1201 are removed. In some embodiments, the remaining portions of the dielectric layer 1201 may be removed using a suitable etch process that is selective to the material of the dielectric layer 1201. In the illustrated embodiment, each of the epitaxial source/drain regions 1501 are physically separated from other epitaxial source/drain regions 1501. In other embodiments, adjacent epitaxial source/drain regions 1501 may be merged. Such an embodiment is depicted in FIG. 17C, where adjacent epitaxial source/drain regions 1501 are merged to form a common epitaxial source/drain region 1501 for multiple fins 501.

Figure 18A:
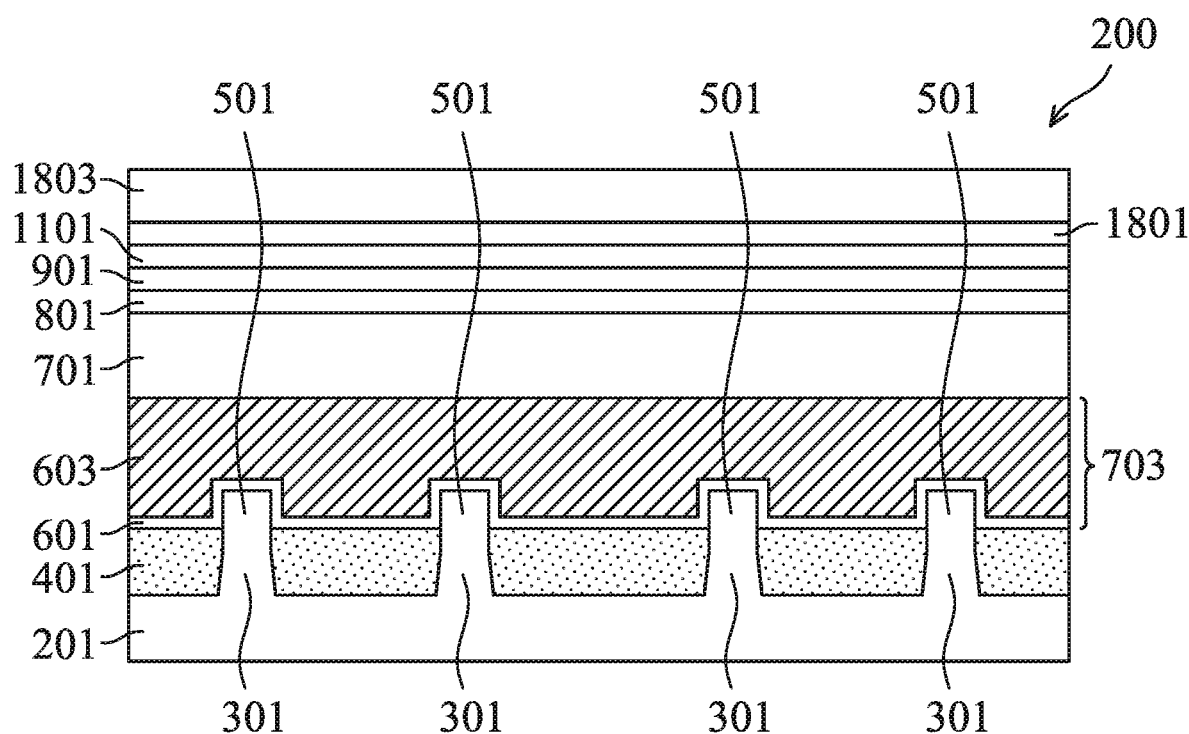
FIGS. 18A, 18B and 18C are cross-sectional views of an intermediate stage in the manufacture of a FinFET device in accordance with some embodiments.
Figure 18B:
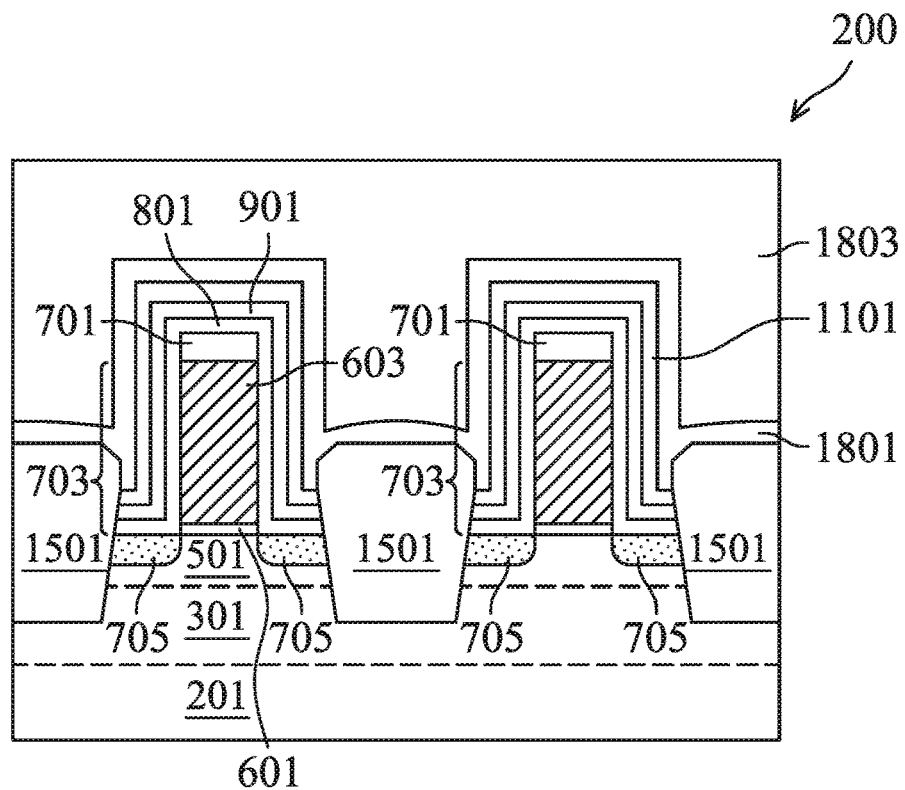
Figure 18C:
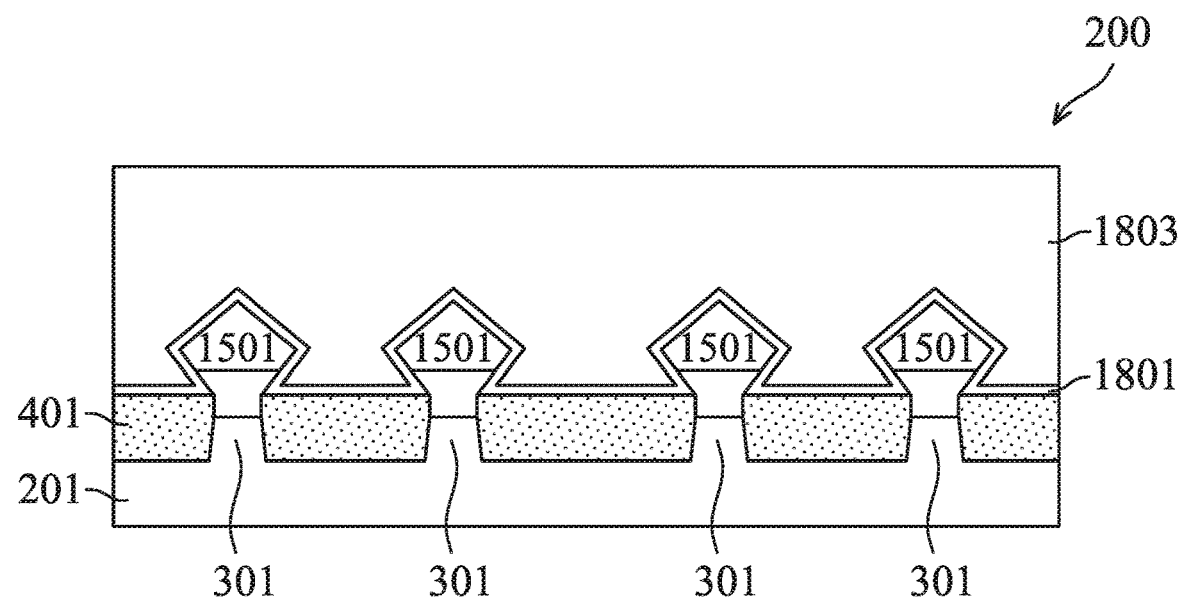

Referring to FIGS. 18A, 18B, and 18C, a dielectric layer 1801 is formed over the gates 703 and the epitaxial source/drain regions 1501 and an interlayer dielectric (ILD) 1803 is formed over the dielectric layer 1801. In some embodiments, the dielectric layer 1801 may be formed using similar materials and methods as the dielectric layer 801 described above with reference to FIGS. 8A, 8B, and 8C, and the description is not repeated herein. In some embodiments, the dielectric layer 1801 has a thickness between about 2 nm and about 5 nm. In some embodiments, the dielectric layer 1801 and the dielectric layer 1201 comprise different materials. The dielectric layer 1801 may be also referred to as a spacer layer. In some embodiments, the dielectric layer 1801 is used as a stop layer while patterning the ILD 1803 to form openings for subsequently formed contact plugs. In some embodiments, the ILD 1803 is a flowable film formed by a flowable CVD. In some embodiments, the ILD 1803 is formed of a dielectric material such as silicon oxide, SiOC, $ZrO_2$, $HfO_2$, Phospho-Silicate Glass (PSG), Boro-Silicate Glass (BSG), Boron-Doped Phospho-Silicate Glass (BPSG), undoped Silicate Glass (USG), low-k dielectric materials, extremely low-k dielectric materials, high-k dielectric materials, a combination thereof, or the like, and may be deposited by any suitable method, such as CVD, PECVD, a spin-on-glass process, a combination thereof, or the like.

Figure 19A:
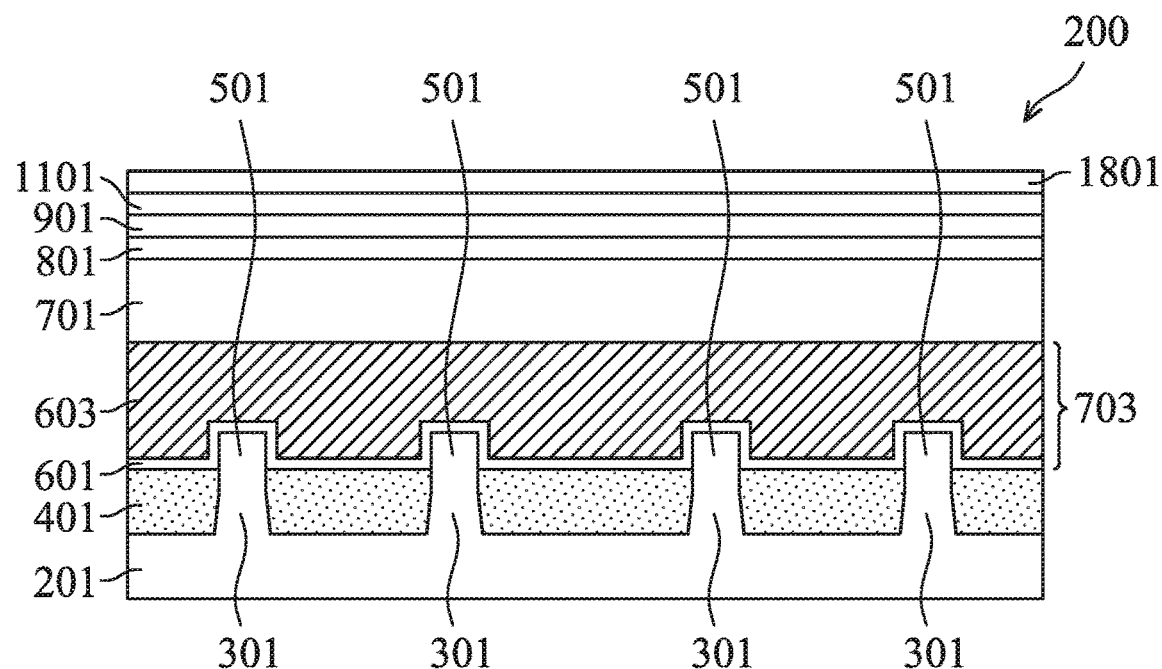
FIGS. 19A, 19B and 19C are cross-sectional views of an intermediate stage in the manufacture of a FinFET device in accordance with some embodiments.
Figure 19B:
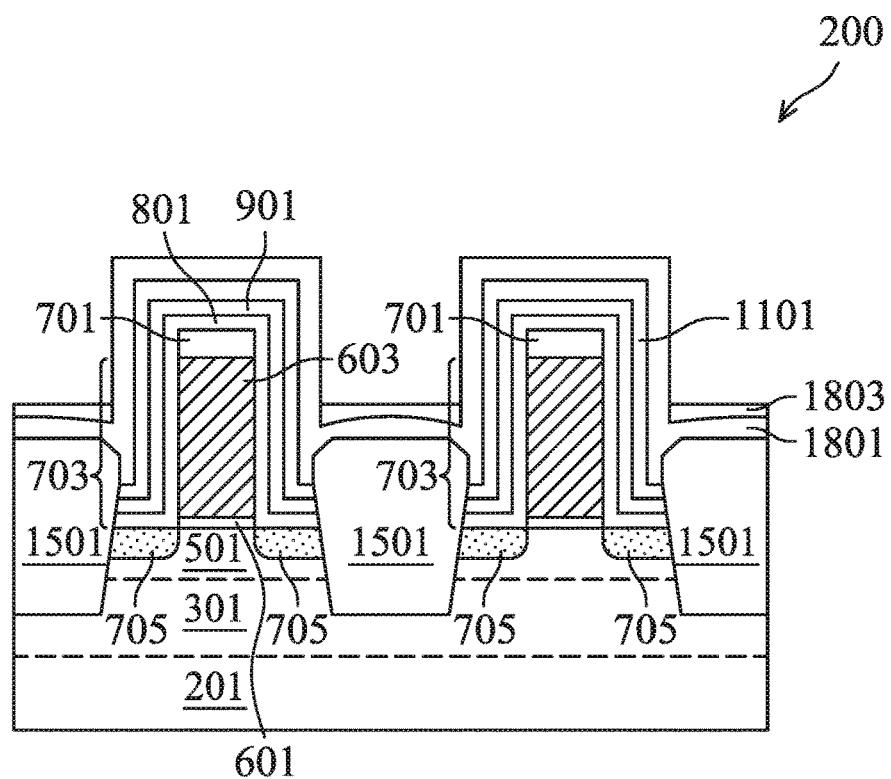
Figure 19C:
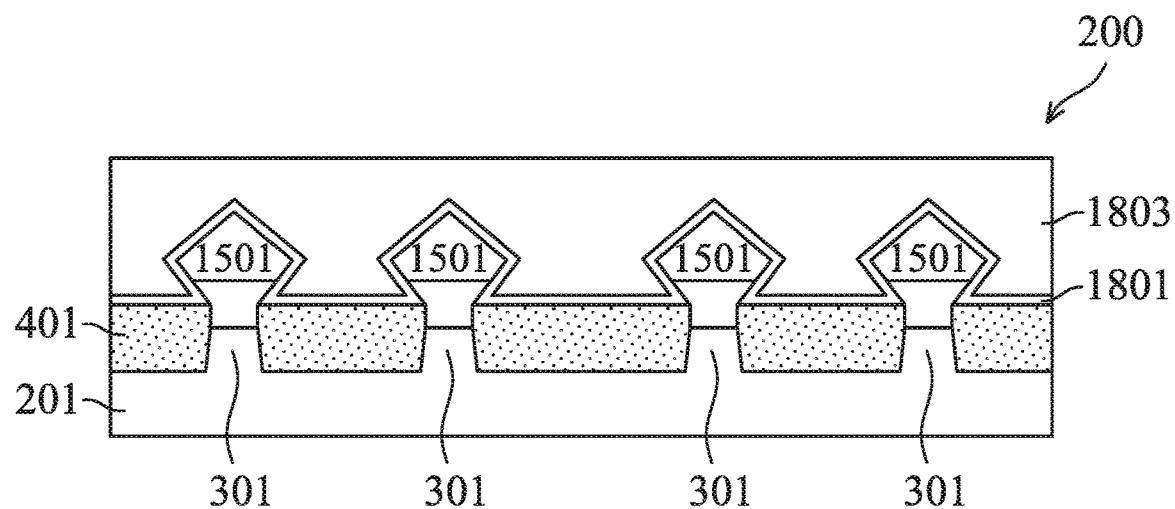

Referring to FIGS. 19A, 19B, and 19C, the ILD 1803 is recessed such that topmost surfaces of remaining portions of the ILD 1803 are below topmost surfaces of the gates 703. In some embodiments, the ILD 1803 may be recessed using a suitable etch process that is selective to the material of the ILD 1803.

Figure 20A:
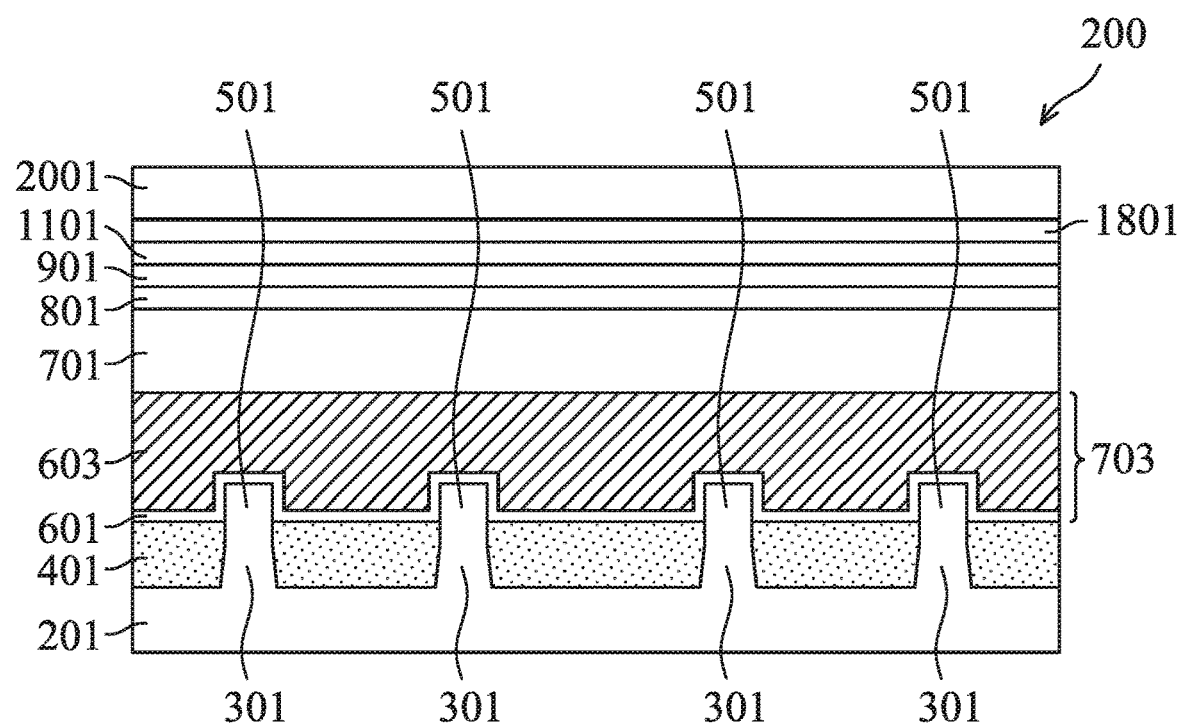
FIGS. 20A, 20B and 20C are cross-sectional views of an intermediate stage in the manufacture of a FinFET device in accordance with some embodiments.
Figure 20B:
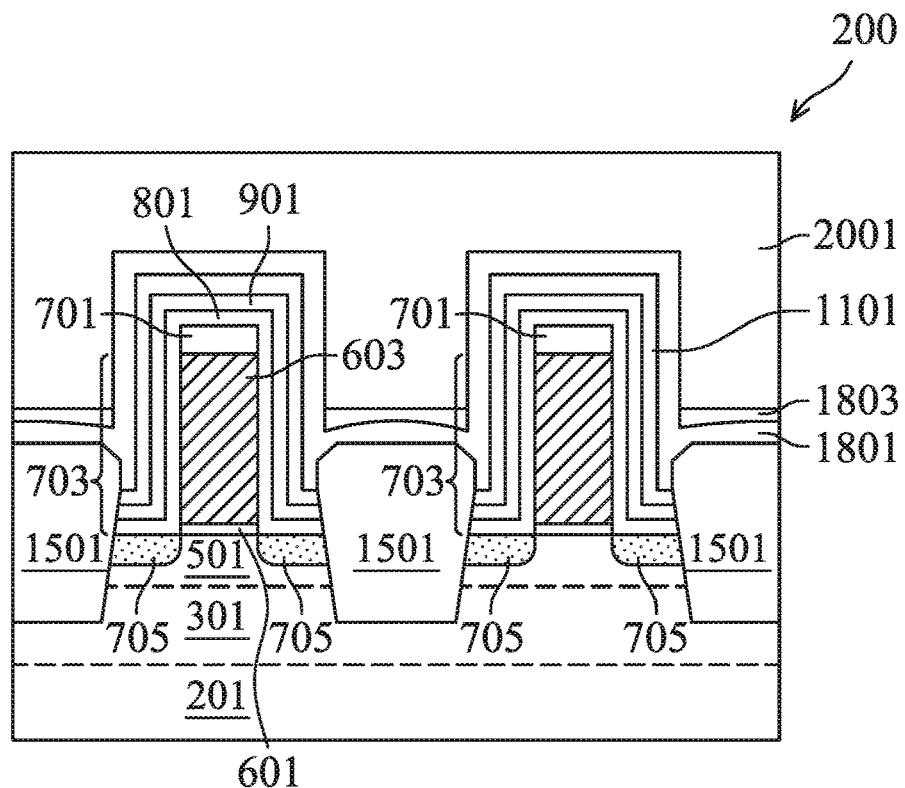
Figure 20C:
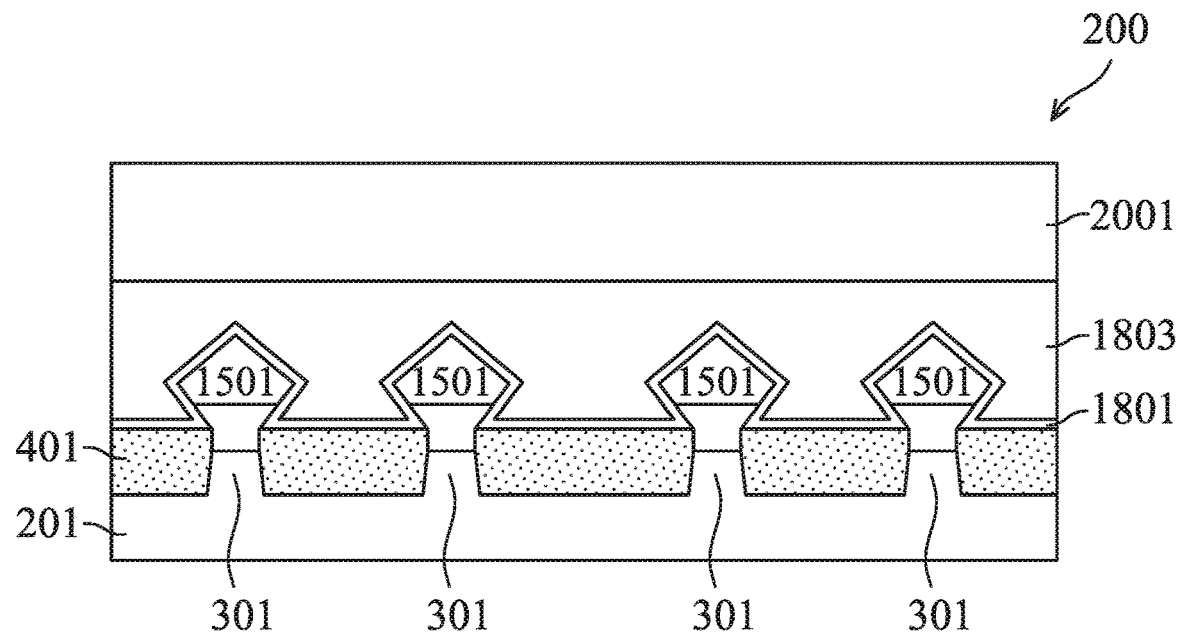

Referring to FIGS. 20A, 20B, and 20C, a dielectric layer 2001 is formed over the gates 703 and the ILD 1803. In some embodiments, the dielectric layer 2001 may be formed using similar materials and methods as the dielectric layer 801 described above with reference to FIGS. 8A, 8B, and 8C, and the description is not repeated herein. The dielectric layer 2001 may also be referred to as a cap layer.

Figure 21A:
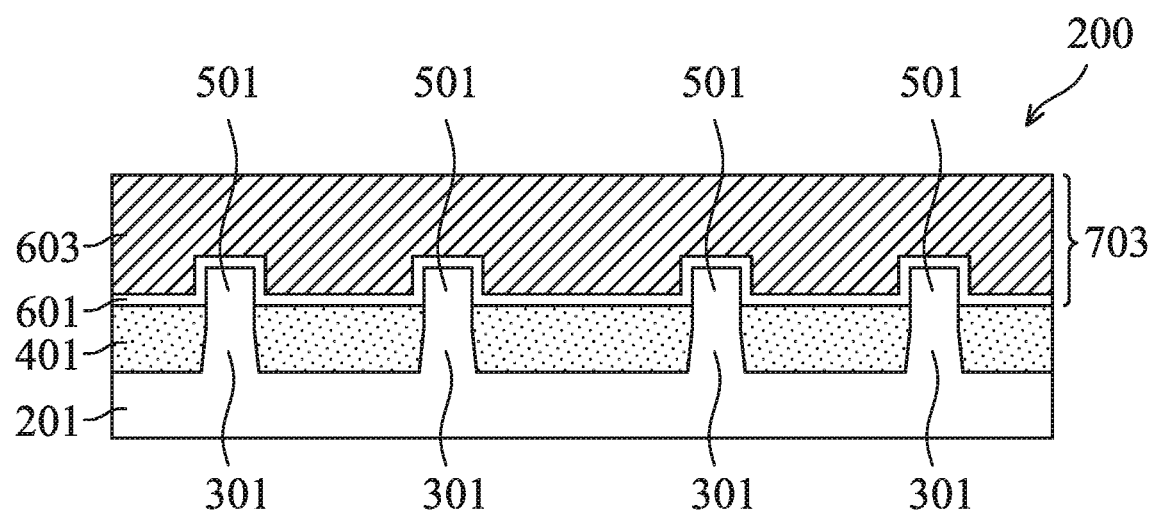
FIGS. 21A, 21B and 21C are cross-sectional views of an intermediate stage in the manufacture of a FinFET device in accordance with some embodiments.
Figure 21B:
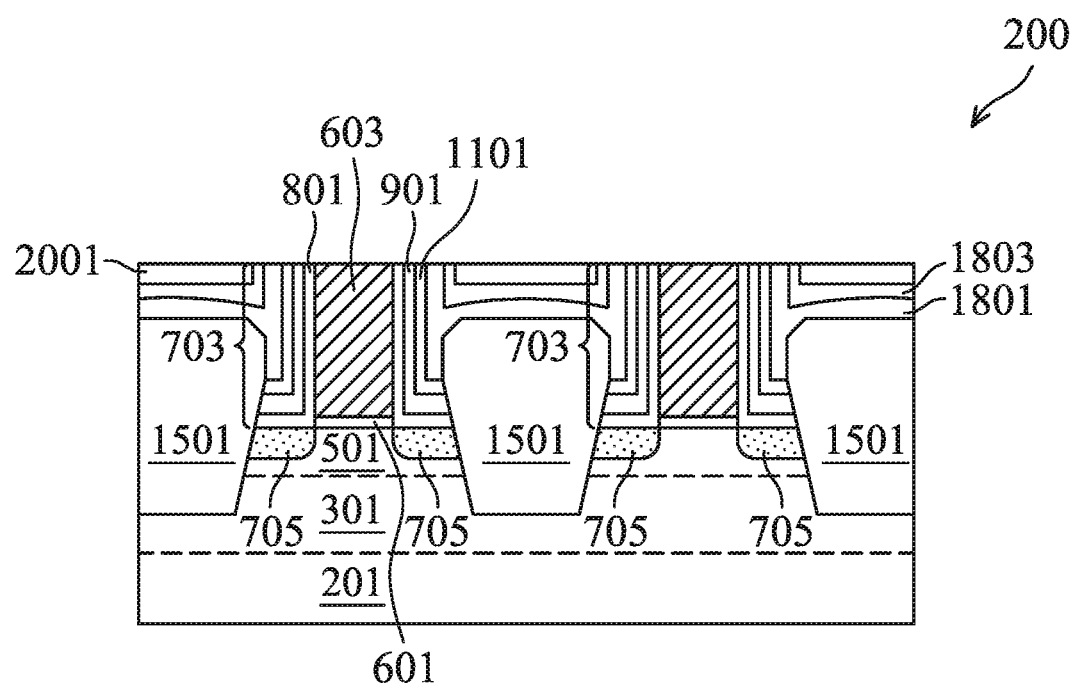
Figure 21C:
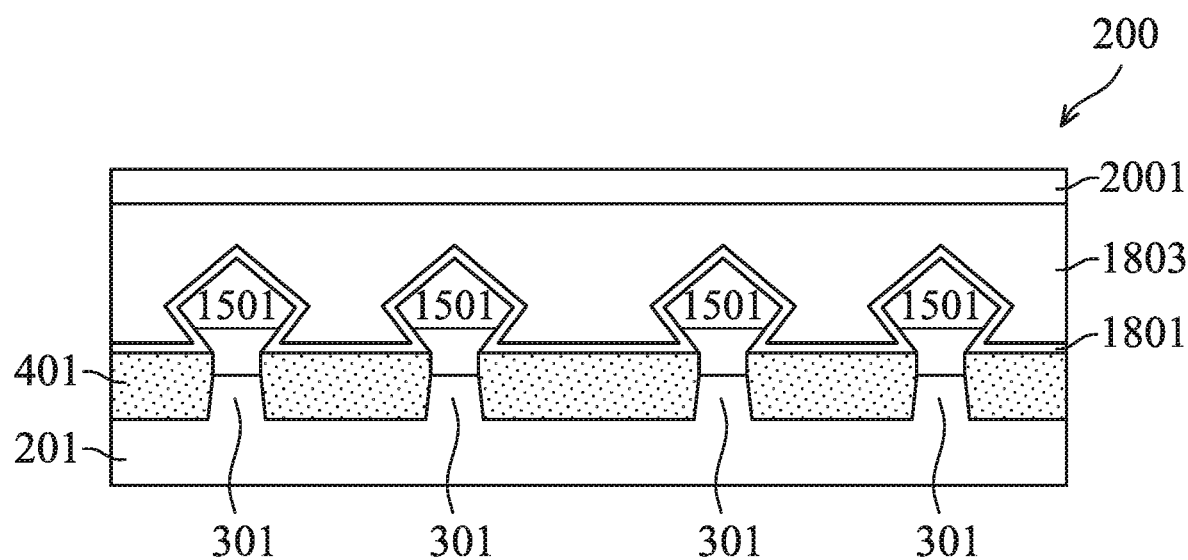

Referring to FIGS. 21A, 21B, and 21C, a planarization process, such as a CMP process, may be performed to level a top surface of dielectric layer 2001 with the top surfaces of the gates 703. The planarization process also removes the patterned mask 701 (see FIGS. 20A, 20B, and 20C), portions of the protection layer 901 and portions of the dielectric layers 801, 1101 and 1801 that extend above the top surfaces of the gates 703.

Figure 22A:
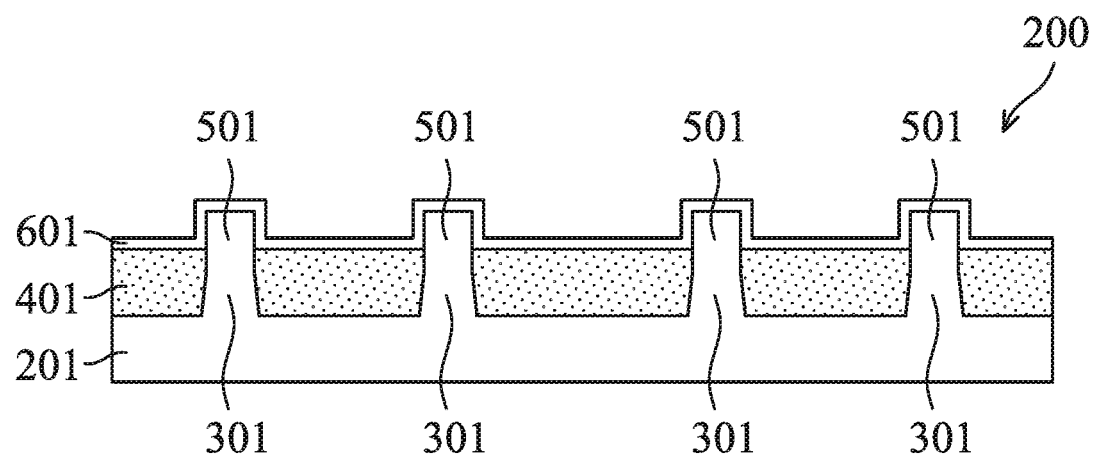
FIGS. 22A, 22B and 22C are cross-sectional views of an intermediate stage in the manufacture of a FinFET device in accordance with some embodiments.
Figure 22B:
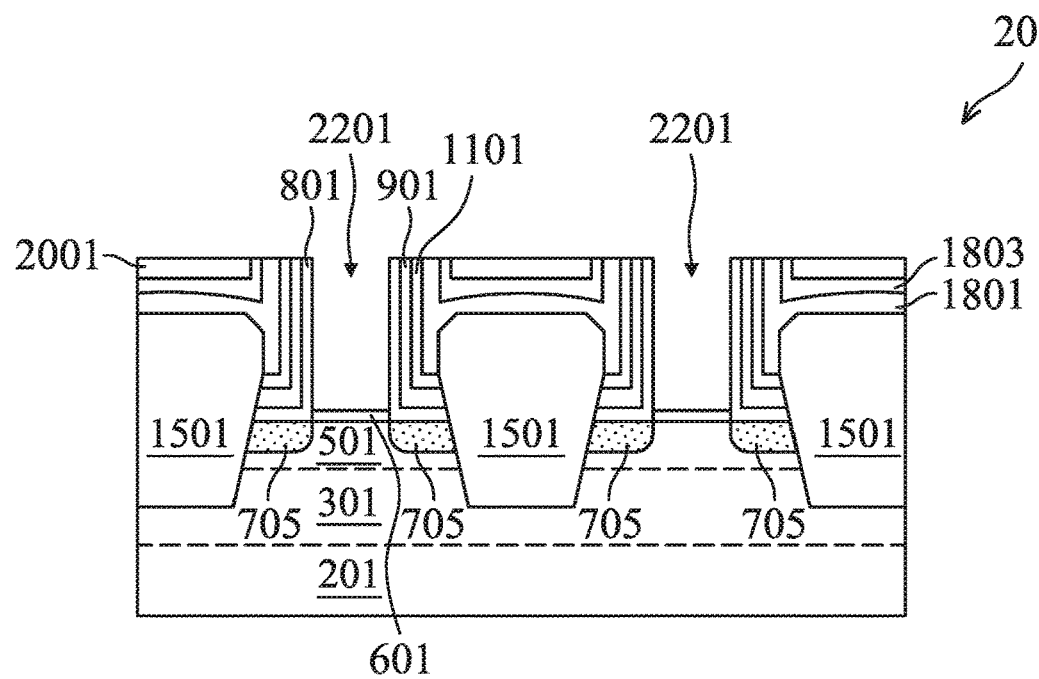
Figure 22C:
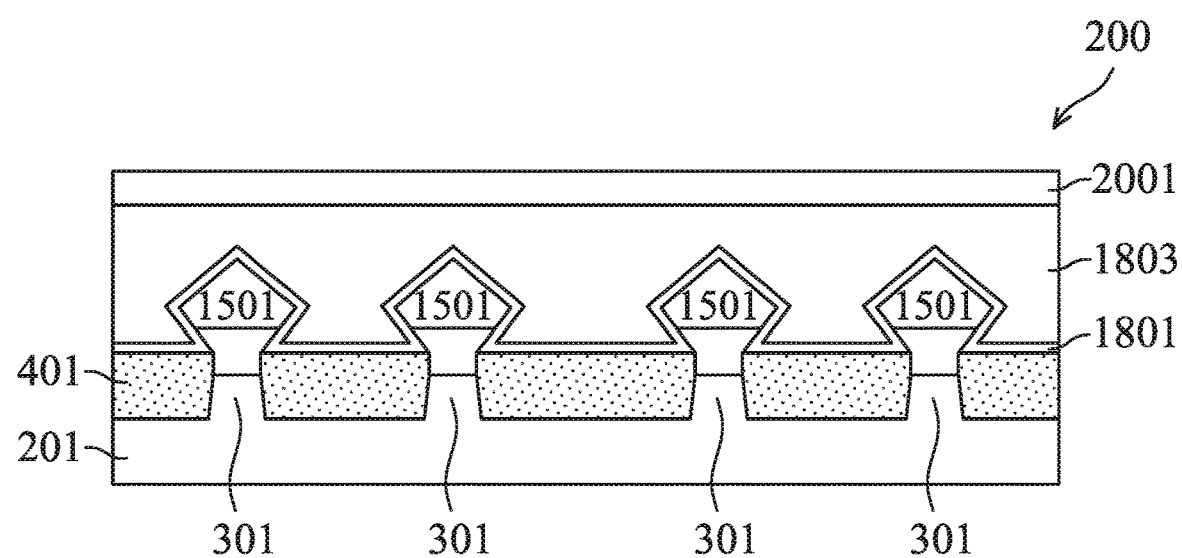

FIGS. 22A and 23A, 22B and 23B, and 22C and 23C illustrate a gate replacement process for forming the gates 2307. Referring to FIGS. 22A, 22B, and 22C, the gate electrode layers 603 of the gates 703 (see FIGS. 21A, 21B, and 21C) are removed using one or more suitable etch processes to form recesses 2201. Each of the recesses 2201 exposes a channel region of a respective fin 501. In the illustrated embodiment, the dielectric layers 601 remain over the channel regions of the fins 501. In other embodiments, the dielectric layers 601 may also be removed during the formation of the recesses 2201.

Figure 23A:
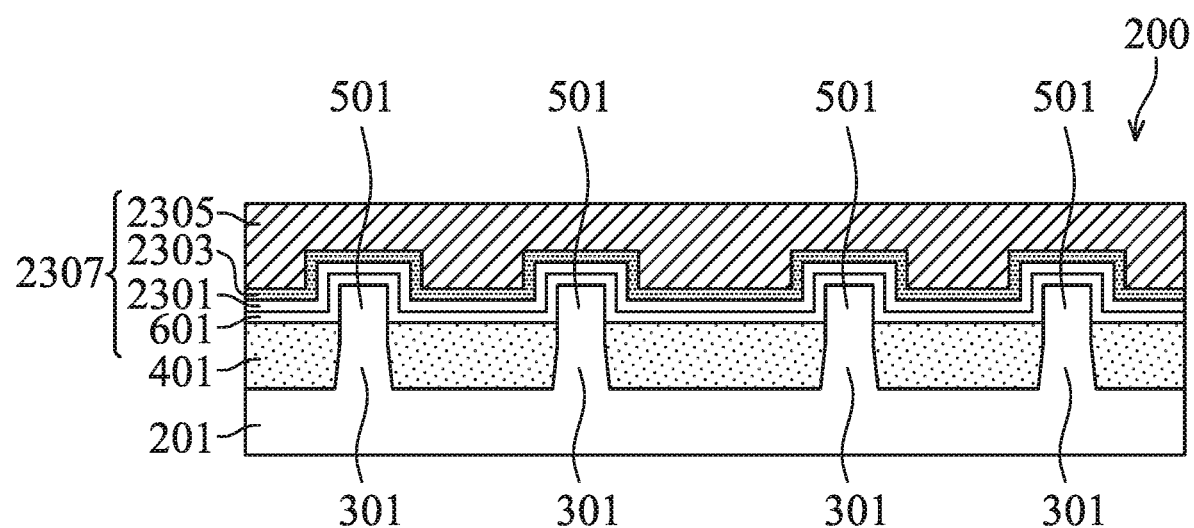
FIGS. 23A, 23B and 23C are cross-sectional views of an intermediate stage in the manufacture of a FinFET device in accordance with some embodiments.
Figure 23B:
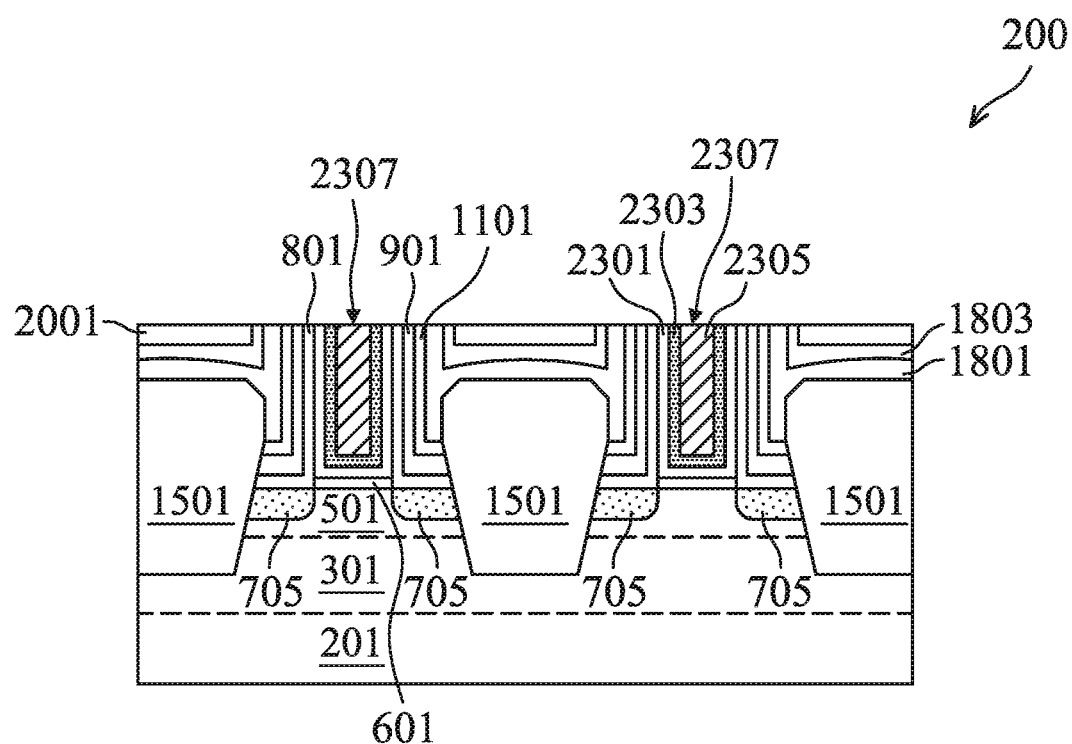
Figure 23C:
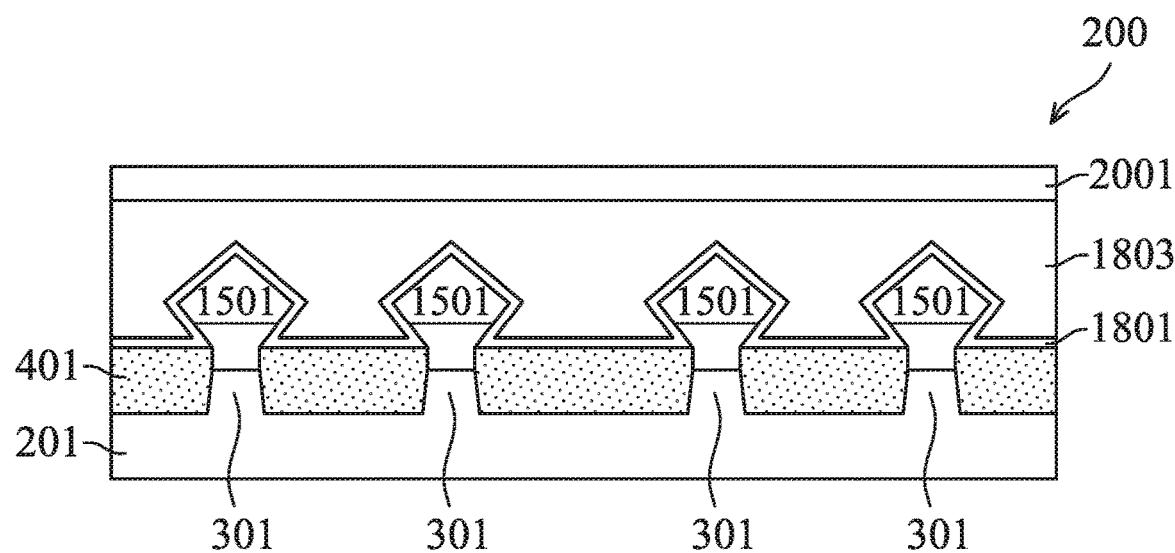

Referring to FIGS. 23A, 23B, and 23C, a gate dielectric layer 2301, a work function layer 2303, and a gate electrode layer 2305 are formed in the recesses 2201 (see FIG. 22B). In some embodiments, the gate dielectric layer 2301 is conformally deposited in the recesses 2201. In some embodiments, the gate dielectric layer 2301 comprises silicon oxide, silicon nitride, or multilayers thereof. In other embodiments, the gate dielectric layer 2301 includes a high-k dielectric material, and in these embodiments, the gate dielectric layer 2301 may have a k value greater than about 7.0, and may include a metal oxide or a silicate of Hf, Al, Zr, La, Mg, Ba, Ti, Pb, and combinations thereof. The formation methods of the gate dielectric layer 2301 may include Molecular-Beam Deposition (MBD), ALD, PECVD, a combination thereof, or the like.

In some embodiments where the dielectric layers 601 are not removed over the channel regions of the fins 501 while forming the recesses 2201, the dielectric layers 601 may act as interfacial layers between the gate dielectric layer 2301 and the channel regions of the fins 501. In some embodiments where the dielectric layers 601 are removed over the channel regions of the fins 501 while forming the recesses 2201, one or more interfacial layers may be formed over the channel regions of the fins 501 prior to forming the gate dielectric layer 2301, and the gate dielectric layer 2301 is formed over the one or more interfacial layers. The interfacial layers help to buffer the subsequently formed high-k dielectric layer from the underlying semiconductor material. In some embodiments, the interfacial layers comprise a chemical silicon oxide, which may be formed of chemical reactions. For example, a chemical oxide may be formed using deionized water+ozone ($O_3$), $NH_4OH+H_2O_2+H_2O$ (APM), or other methods. Other embodiments may utilize a different material or processes (e.g., a thermal oxidation or a deposition process) for forming the interfacial layers.

After forming the gate dielectric layer 2301, the work function layer 2303 is formed over the gate dielectric layer 2301. In some embodiments where the FinFET device 200 is an n-type device, the work function layer 2303 comprises Ti, Ag, Al, TiAl, TiAlN, TiAlC, TaC, TaCN, TaSiN, TaAlC, Mn, Zr, a combination thereof, or the like, and may be formed using ALD, CVD, PVD, combinations thereof, or the like. In some embodiments where the FinFET device 200 is a p-type device, the work function layer 2303 comprises TiN, WN, TaN, Ru, Co, a combination thereof, or the like, and may be formed using ALD, CVD, PVD, combinations thereof, or the like. After forming the work function layer 2303, remaining portions of the recesses 2201 (see FIG. 22B) are filled with a gate electrode layer 2305. In some embodiments, the gate electrode layer 2305 comprises Co, Ru, Al, Ag, Au, W, Ni, Ti, Cu, Mn, Pd, Re, Ir, Pt, Zr, alloys thereof, combinations thereof, or the like, and may be formed using ALD, CVD, PVD, plating, combinations thereof, or the like. After filling the recesses 2201 with the gate electrode layer 2305, a planarization process, such as a CMP process, may be performed to remove the excess portions of the gate dielectric layer 2301, the work function layer 2303, and the gate electrode layer 2305, which excess portions are over the top surface of the dielectric layer 2001. The portions of the gate dielectric layer 2301, the work function layer 2303, and the gate electrode layer 2305 remaining in the recesses 2201 in combination with respective dielectric layers 601 form the gates 2307 in the recesses 2201. The gates 2307 may also be referred to as replacement gates.

Figure 24A:
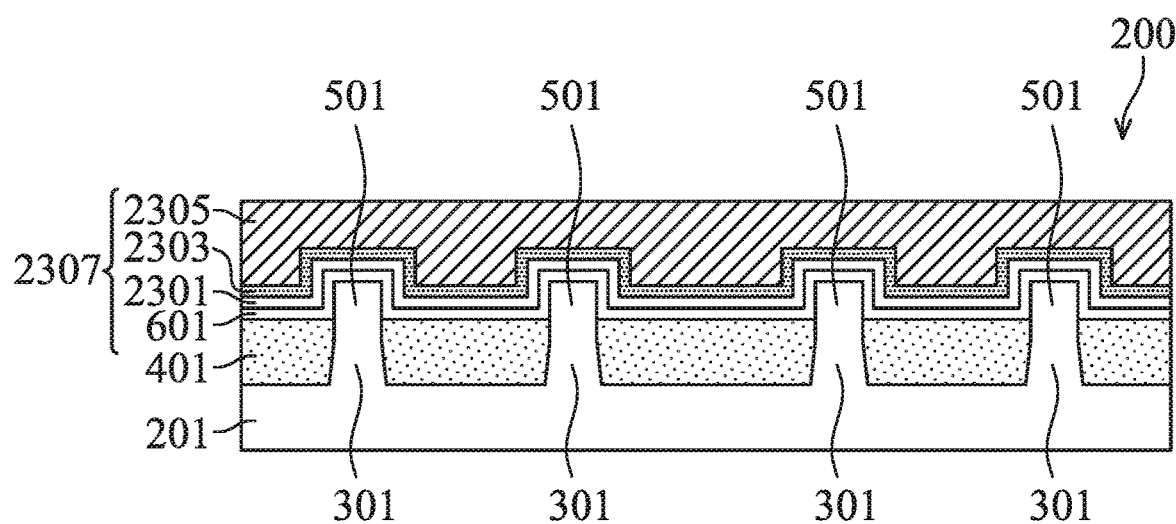
FIGS. 24A, 24B and 24C are cross-sectional views of an intermediate stage in the manufacture of a FinFET device in accordance with some embodiments.
Figure 24B:
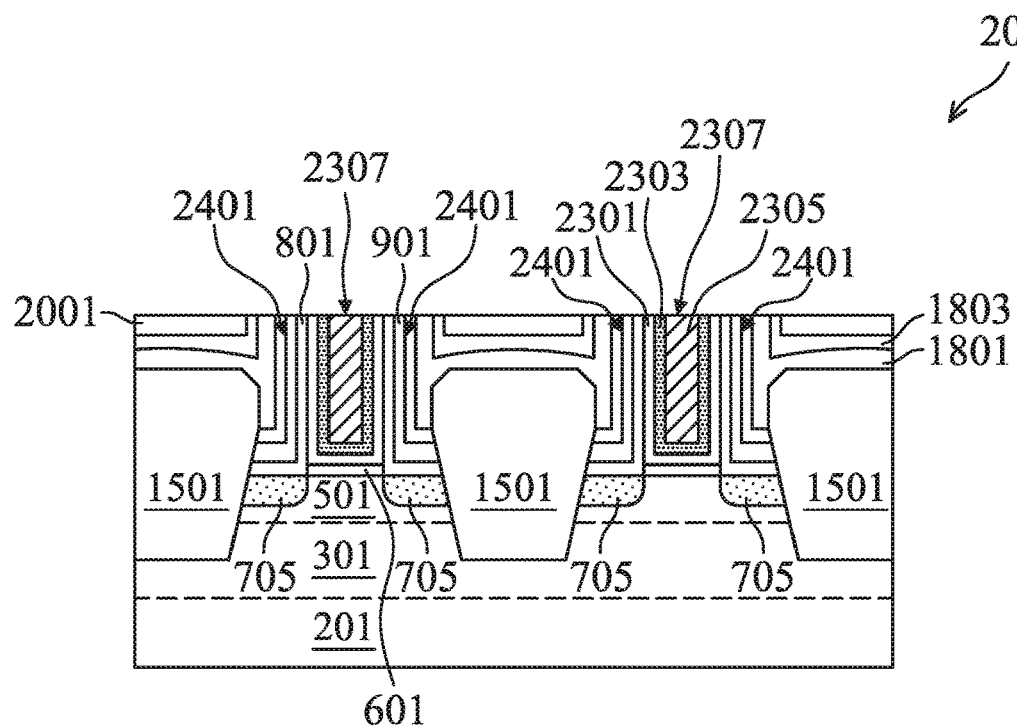
Figure 24C:
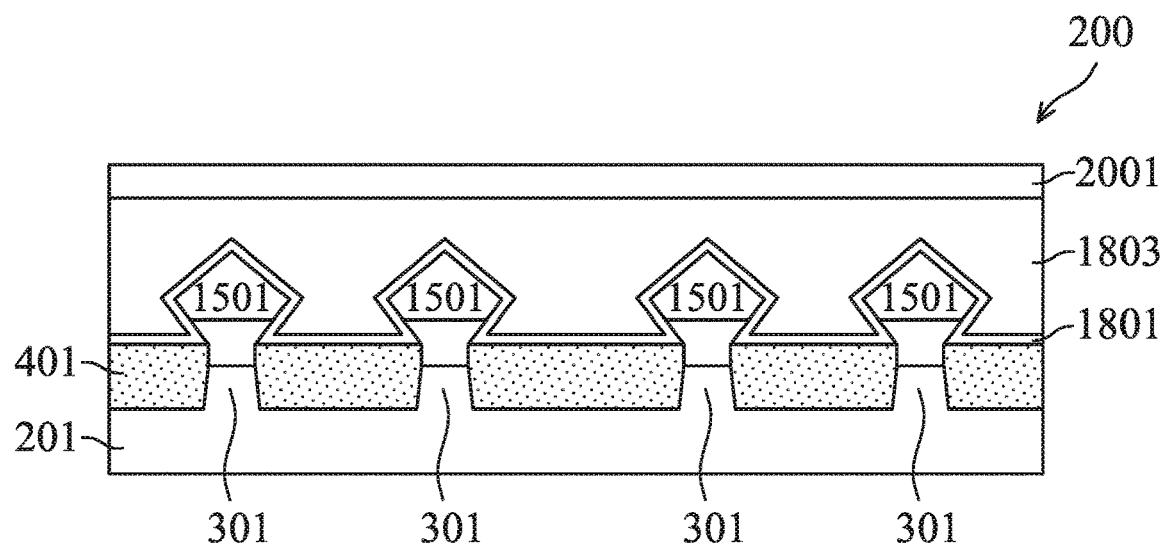

Referring to FIGS. 24A, 24B, and 24C, after forming the gates 2307, the remaining portions of the dielectric layer 1101 (see FIGS. 24A, 24B, and 24C) are removed to form gaps 2401. The gaps 2401 may also be referred to as air gaps of air spacers. In some embodiments, the remaining portions of the dielectric layer 1101 may be removed using a suitable etch process that is selective to the material of the dielectric layer 1101. In some embodiments, the suitable etch process may be a wet etch process performed by a mixture of HF and $H_2O$. In other embodiments, the suitable etch process may be a dry etch process performed by a plasma generated from a mixture of HF and $NF_3$. In some embodiments, the protection layer 901 protects the dielectric layer 801 from the etch process and improves etch selectivity of the dielectric layer 1101 during the etch process. Furthermore, the protection layer 901 improves structural integrity of gate spacer structures comprising the dielectric layers 801 and 1801, the protection layer 901, and the gaps 2401 to reduce or avoid collapsing of the gates 2307. In the illustrated embodiment, the gaps 2401 are formed after performing the gate replacement process for forming the gates 2307. In other embodiments, the gaps 2401 may be formed after performing the planarization process described above with reference to FIGS. 21A, 21B, and 21C, and before performing the gate replacement process for forming the gates 2307.

Figure 25A:
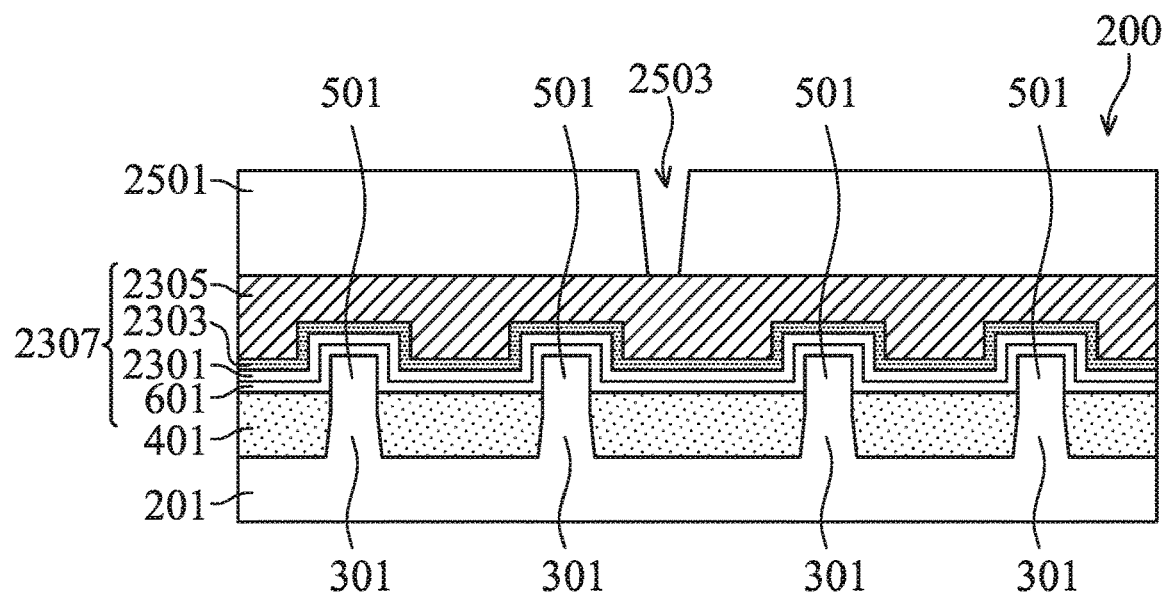
FIGS. 25A, 25B and 25C are cross-sectional views of an intermediate stage in the manufacture of a FinFET device in accordance with some embodiments.
Figure 25B:
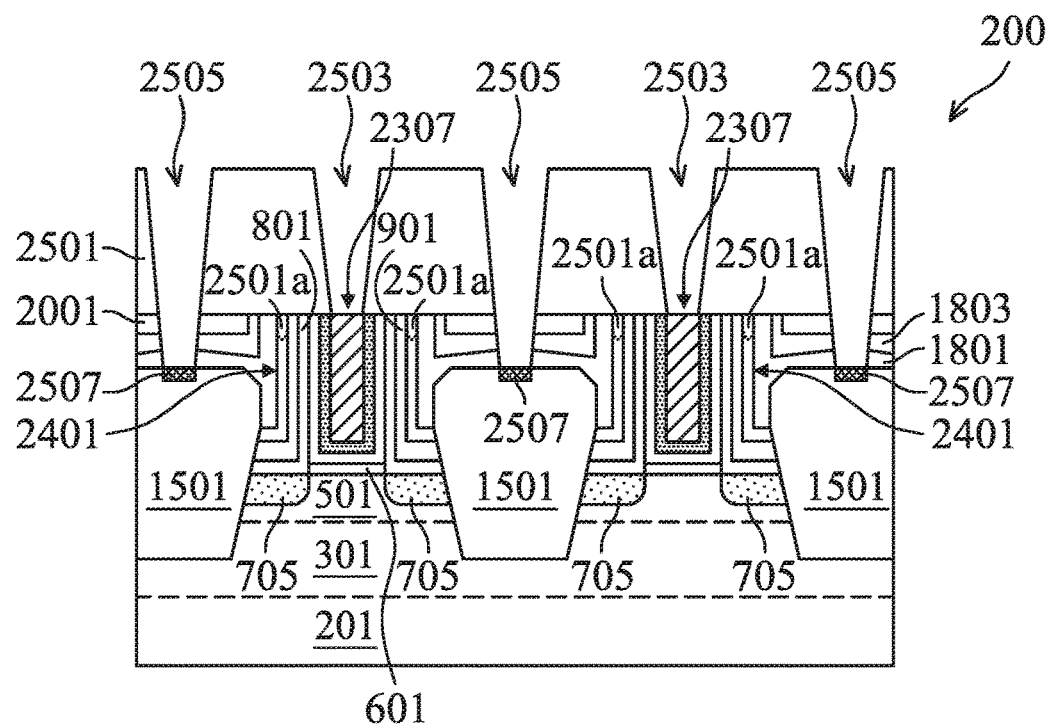
Figure 25C:
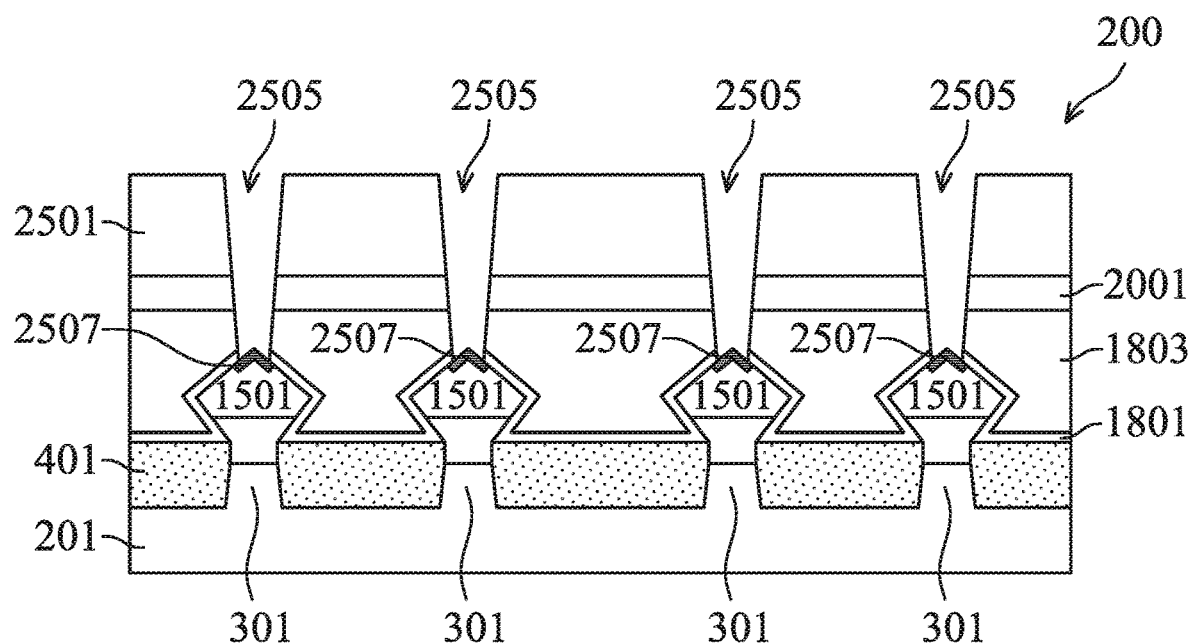

Referring to FIGS. 25A, 25B, and 25C, an ILD 2501 is formed over the gates 2307. In some embodiments, the ILD 2501 may be formed using similar materials and methods as the ILD 1803 described above with reference to FIGS. 18A, 18B and 18C, and the description is not repeated herein. In some embodiments, the ILD 2501 does not extend into the gaps 2401. In other embodiments, portions 2501a of the ILD 2501 extend into the gaps 2401. In some embodiments, the ILD 2501 and the ILD 1803 are formed of a same material. In other embodiments, the ILD 2501 and the ILD 1803 are formed of different materials. The dielectric layers 1801 and 2001, and the ILDs 1803 and 2501 are patterned to form openings 2503 and 2505. In some embodiments, the dielectric layers 1801 and 2001, and the ILDs 1803 and 2501 may be patterned using acceptable photolithography and etching techniques. The openings 2503 expose the respective gates 2307. The openings 2505 expose the respective epitaxial source/drain regions 1501. As described below in greater detail, the openings 2503 and 2505 are filled with one or more conductive materials to form contact plugs that provide electrical connections to the epitaxial source/drain regions 1501 and the gates 2307.

Referring further to FIGS. 25A, 25B, and 25C, self-aligned silicide (salicide) layers 2507 are formed through the openings 2503 and 2505. In some embodiments, a metallic material is deposited in the openings 2503 and 2505. The metallic material may comprise Ti, Co, Ni, NiCo, Pt, NiPt, Ir, PtIr, Er, Yb, Pd, Rh, Nb, a combination thereof, or the like, and may be formed using PVD, sputtering, or the like. Subsequently, an annealing process is performed to form the salicide layers 2507. In some embodiments where the epitaxial source/drain regions 1501 comprise silicon, the annealing process causes the metallic material to react with silicon to form a silicide of the metallic material.

Figure 26A:
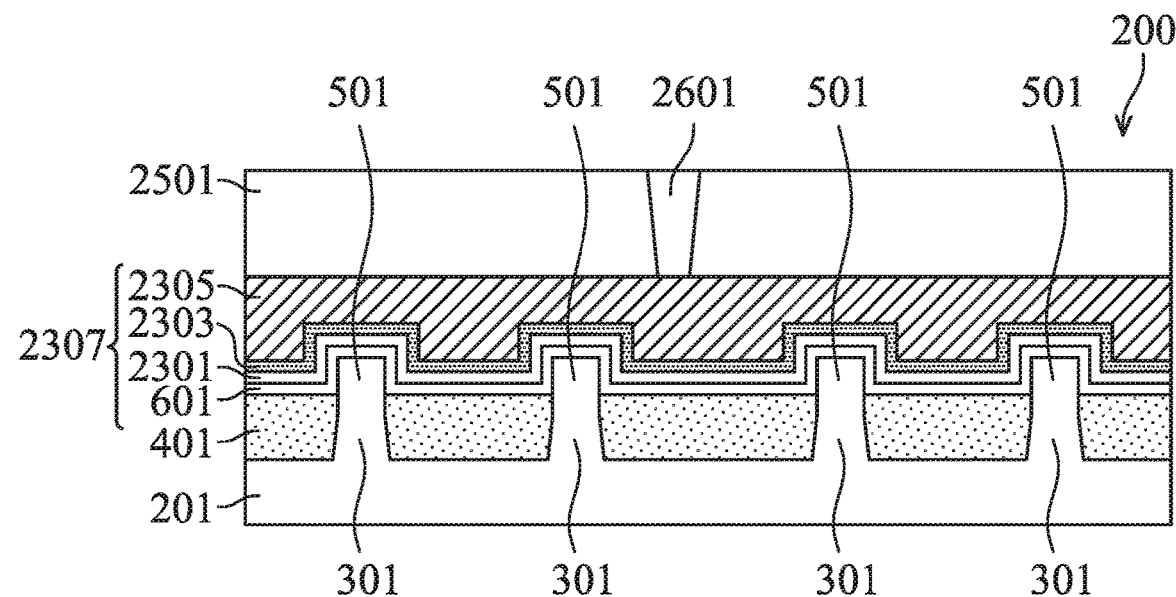
FIGS. 26A, 26B and 26C are cross-sectional views of an intermediate stage in the manufacture of a FinFET device in accordance with some embodiments.
Figure 26B:
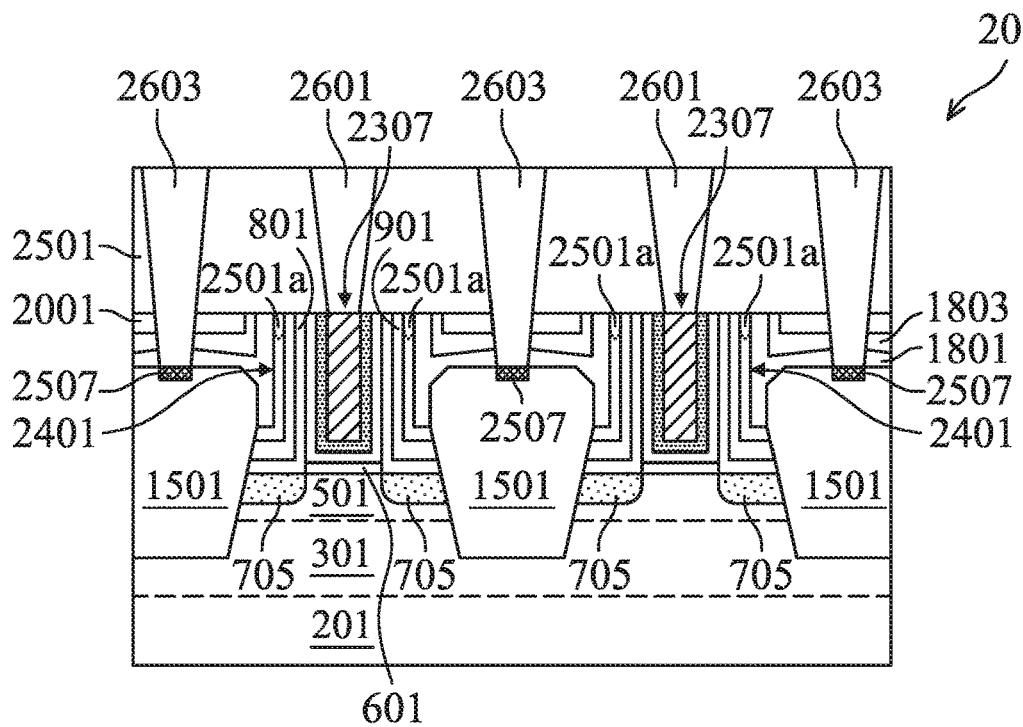
Figure 26C:
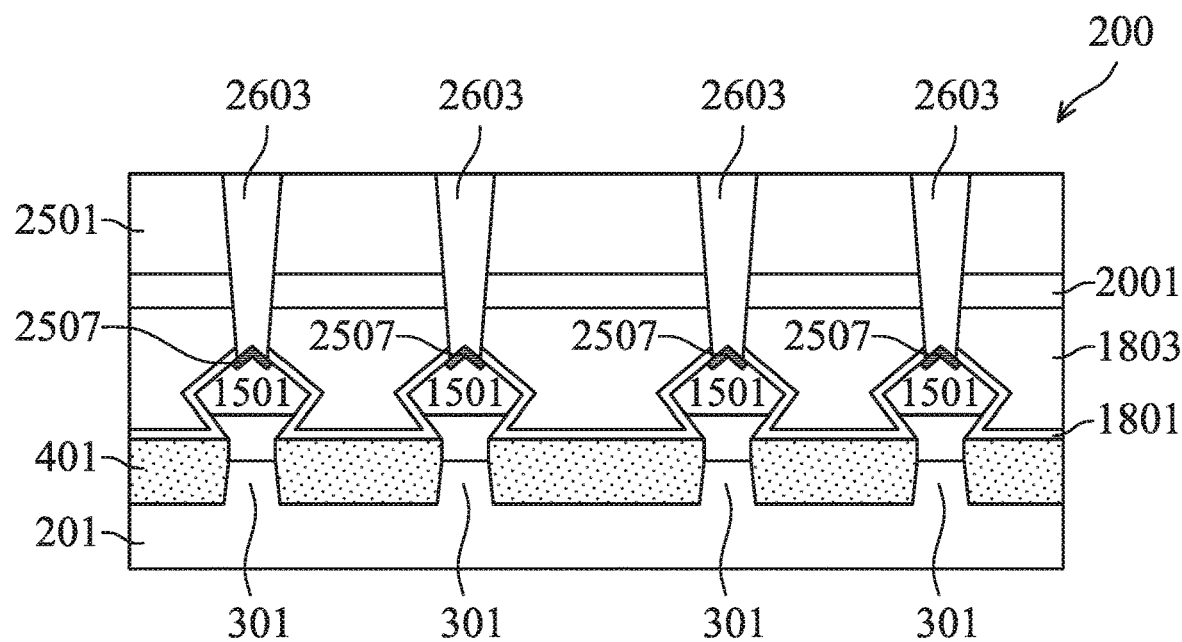

Referring to FIGS. 26A, 26B, and 26C, the openings 2503 and 2505 (see FIGS. 25A, 25B, and 25C) are filled with one or more conductive materials to form contact plugs 2601 and 2603, respectively. In some embodiments, a liner (not shown), such as a diffusion barrier layer, an adhesion layer, or the like, and a conductive material are formed in the openings 2503 and 2505. The liner may include titanium, titanium nitride, tantalum, tantalum nitride, a combination thereof, or the like, and may be formed CVD, PVD, ALD, a combination thereof, or the like. The conductive material may be copper, a copper alloy, silver, gold, tungsten, aluminum, nickel, a combination thereof, or the like, and may be formed using CVD, PVD, ALD, an electrochemical plating process, an electroless plating process, a combination thereof, or the like. A planarization process, such as a CMP process, may be performed to remove excess portions of the liner and the conductive material from a top surface of the ILD 2501. The remaining portions of the liner and the conductive material form contact plugs 2601 and 2603 in the openings 2503 and 2505, respectively. The contact plugs 2601 are physically and electrically coupled to the gates 2307. The contact plugs 2603 are physically coupled to the salicide layers 2507. The contact plugs 2603 are electrically coupled to the epitaxial source/drain regions 1501 through the salicide layers 2507.

FIGS. 27A-29A, 27B-29B, and 27C-29C are cross-sectional views of intermediate stages in the manufacturing of a FinFET device 2700 in accordance with some embodiments. In FIGS. 27A-29A, 27B-29B, and 27C-29C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 2700 may be similar to the process steps for forming the FinFET device 200 described above with reference to FIGS. 2A-9A, 11A-16A, 18A-26A, 6B-9B, 11B-16B, 18B-26B, 7C-9C, and 11C-26C, with like features labeled by like numerical references, and their description is not repeated herein.

Figure 27A:
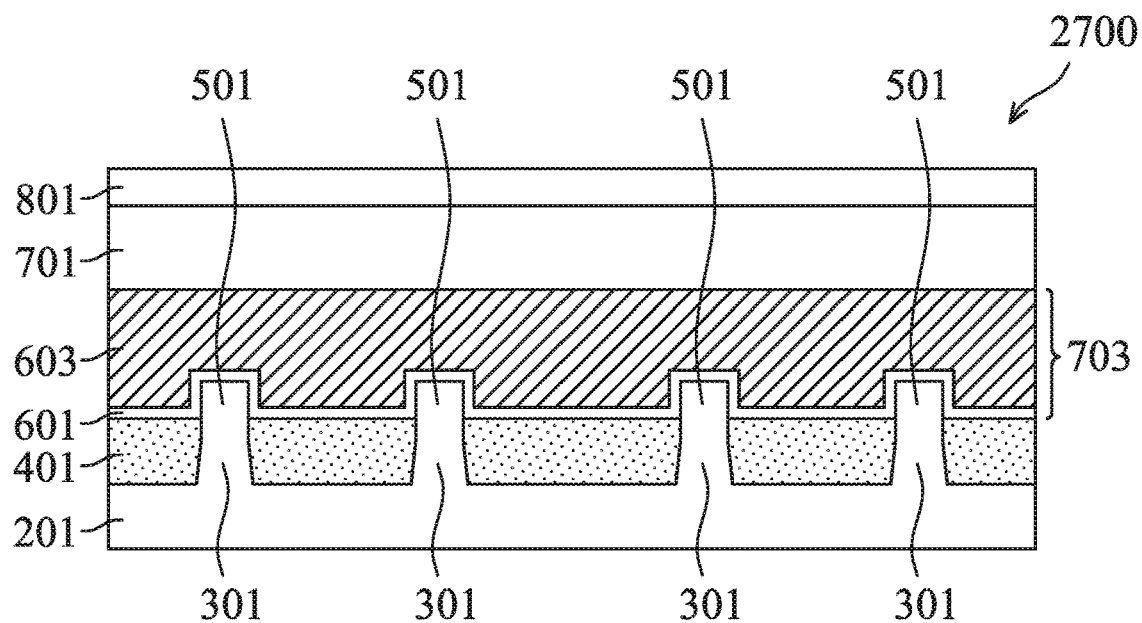
FIGS. 27A, 27B and 27C are cross-sectional views of an intermediate stage in the manufacture of a FinFET device in accordance with some embodiments.
Figure 27B:
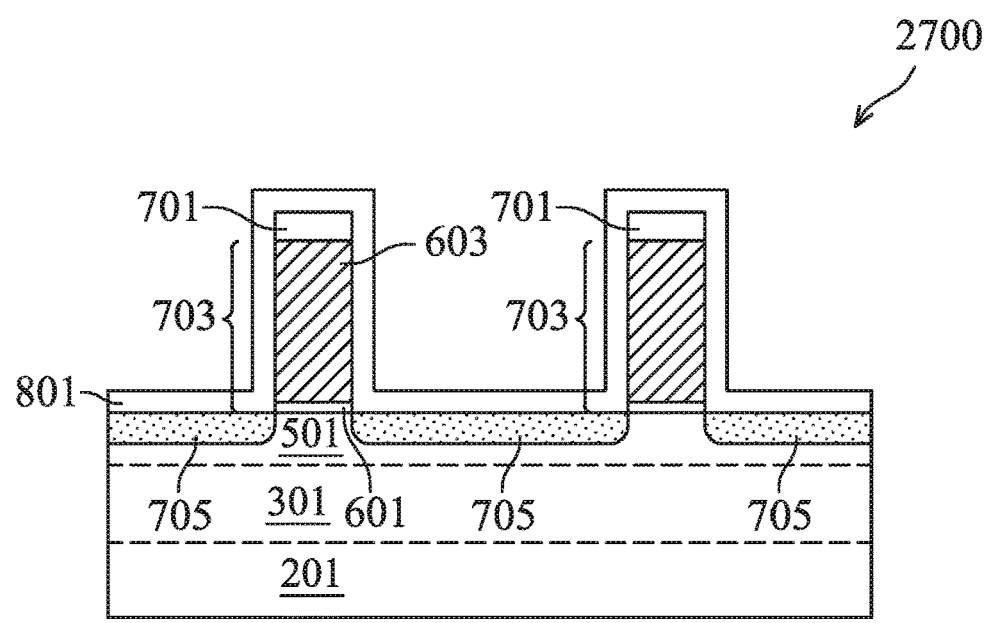
Figure 27C:
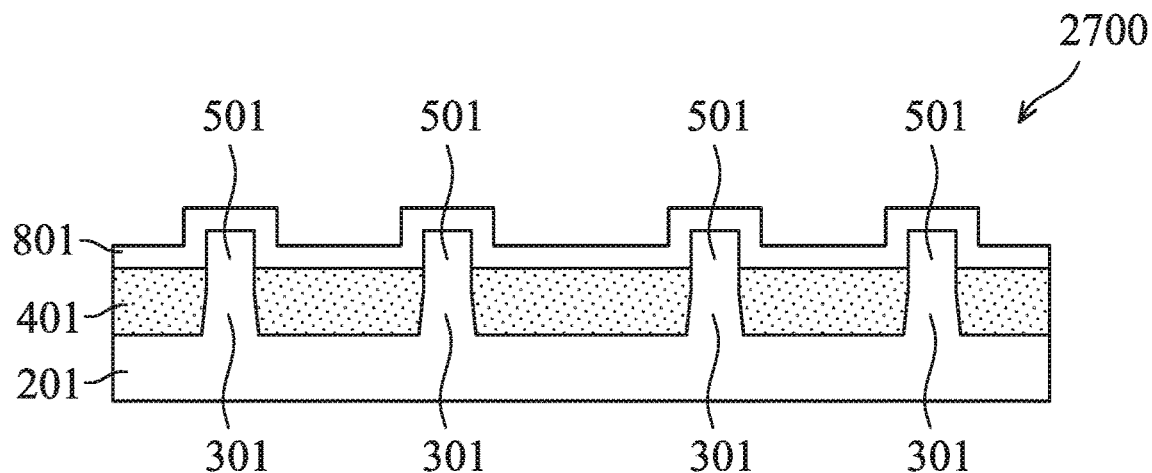

In some embodiments, the process of forming the FinFET device 2700 starts with forming a structure illustrated in FIGS. 7A, 7B, and 7C. The process steps for forming the structure of FIGS. 7A, 7B, and 7C are described above with reference to FIGS. 2A-7A, 6B, 7B, 7C, and the description is not repeated herein. Referring to FIGS. 27A, 27B, and 27C, a dielectric layer 801 is blanket formed on exposed surfaces of the gates 703, the patterned mask 701, the isolation regions 401, and the fins 501. In some embodiments, the dielectric layer 801 is formed as described above with reference to FIGS. 8A, 8B, and 8C, and the description is not repeated herein.

Figure 28A:
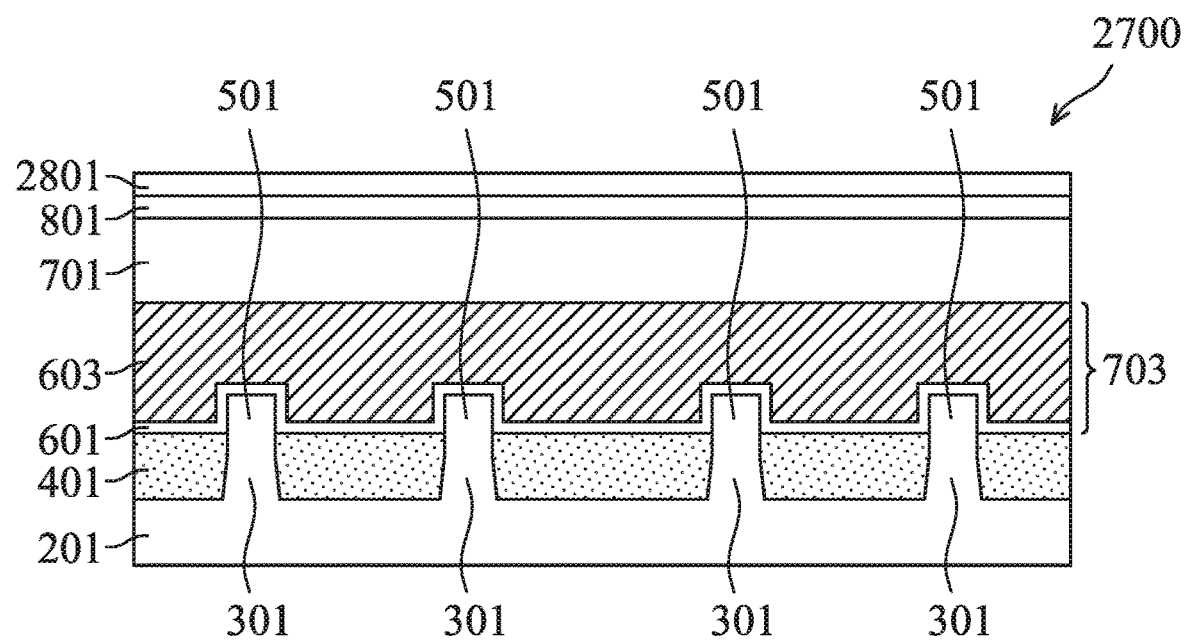
FIGS. 28A, 28B and 28C are cross-sectional views of an intermediate stage in the manufacture of a FinFET device in accordance with some embodiments.
Figure 28B:
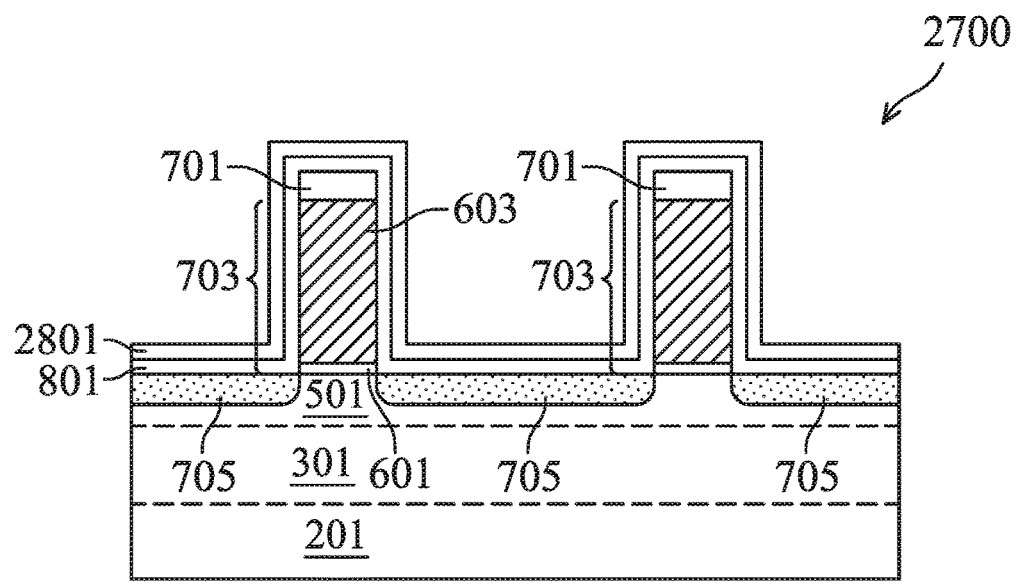
Figure 28C:
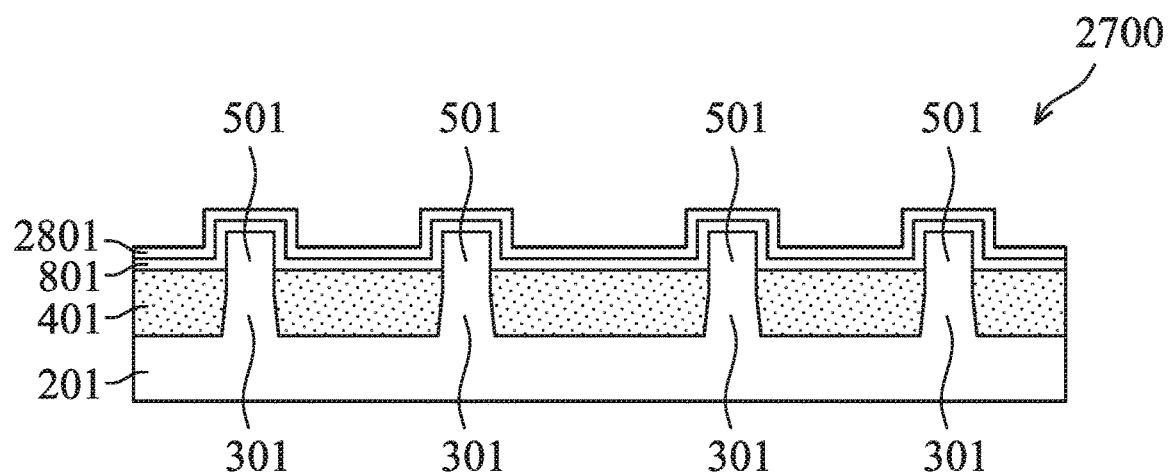

Referring to FIGS. 28A, 28B, and 28C, upper portion of the dielectric layer 801 is doped to form a doped portion of the dielectric layer 801. The doped portion of the dielectric layer 801 forms a protection layer 2801 over un-doped portion of the dielectric layer 801. In some embodiments, the upper portion of the dielectric layer 801 may be doped using carbon. In other embodiments, the upper portion of the dielectric layer 801 may be doped using boron. In some embodiments, the doping process is a plasma-assisted doping process performed by the plasma-assisted deposition/ doping apparatus 1000 in a doping regime as described above with reference to FIG. 10, and the description is not repeated herein. In some embodiments where the upper portion of the dielectric layer 801 is doped with carbon, the plasma-assisted doping process uses a gas mixture comprising a carbon-containing precursor gas. The carbon-containing precursor gas may be $CH_4$, or the like. In some embodiments, the implantation energy of carbon ions may be from about 0.5 KeV to about 5 KeV. In some embodiments, a dosage of the implanted carbon may be from about 5E13 atoms/cm$^2$ to about 1E15 atoms/cm$^2$. In some embodiments where the upper portion of the dielectric layer 801 is doped with boron, the plasma-assisted doping process uses a gas mixture comprising a boron-containing precursor gas. The boron-containing precursor gas may be $B_2H_6$, or the like. In some embodiments, the implantation energy of boron ions may be from about 1 KeV to about 3 KeV. In some embodiments, a dosage of the implanted boron may be from about 5E13 atoms/cm$^2$ to about 1E15 atoms/cm$^2$.

Referring further to FIGS. 28A, 28B, and 28C, by performing the plasma-assisted doping process, uniformity of dopants within the protection layer 2801 is improved. The doping process alters etch characteristics of the doped portion of the dielectric layer 801. In some embodiments, an etch rate of the protection layer 2801 is reduced compared to an etch rate of the un-doped portion of the dielectric layer 801. In some embodiments where the dielectric layer 801 comprises SiOCN and the carbon doping process is performed using the carbon-containing precursor gas $CH_4$, with the implantation energy of about 2 KeV and the dosage of about 5E15 atoms/cm$^2$, the etch rate of the protection layer 2801 is reduced by about 50% compared to the etch rate of the un-doped portion of the dielectric layer 801 with respect to a wet etch process performed using a mixture of HF and $H_2O$. In some embodiments where the dielectric layer 801 comprises SiN and the carbon doping process is performed using the carbon-containing precursor gas $CH_4$, with the implantation energy of about 2 KeV and the dosage of about 3E15 atoms/cm$^2$, the etch rate of the protection layer 2801 is reduced by about 70% compared to the etch rate of the un-doped portion of the dielectric layer 801 with respect to a wet etch process performed using a mixture of HF and $H_2O$. In some embodiments where the dielectric layer 801 comprises SiCN and the carbon doping process is performed using the carbon-containing precursor gas $CH_4$, with the implantation energy from about 1.5 keV to about 2 KeV and the dosage of about 5E15 atoms/cm$^2$, the etch rate of the protection layer 2801 is reduced by more than about 95% compared to the etch rate of the un-doped portion of the dielectric layer 801 with respect to a wet etch process performed using a mixture of HF and $H_2O$. In some embodiments where the dielectric layer 801 comprises SiOCN and the carbon doping process is performed using the carbon-containing precursor gas $CH_4$, with the implantation energy of about 2 KeV and the dosage of about 5E15 atoms/cm$^2$, the etch rate of the protection layer 2801 is reduced by about 50% compared to the etch rate of the un-doped portion of the dielectric layer 801 with respect to a dry etch process performed using a plasma generated from a mixture of HF and $NF_3$. In some embodiments where the dielectric layer 801 comprises SiCN and the carbon doping process is performed using the carbon-containing precursor gas $CH_4$, with the implantation energy from about 0.3 keV to about 1 KeV and the dosage of about 4E15 atoms/cm$^2$, the etch rate of the protection layer 2801 is reduced by more than about 75% compared to the etch rate of the un-doped portion of the dielectric layer 801 with respect to a dry etch process performed using a plasma generated from a mixture of HF and $NF_3$.

Figure 29A:
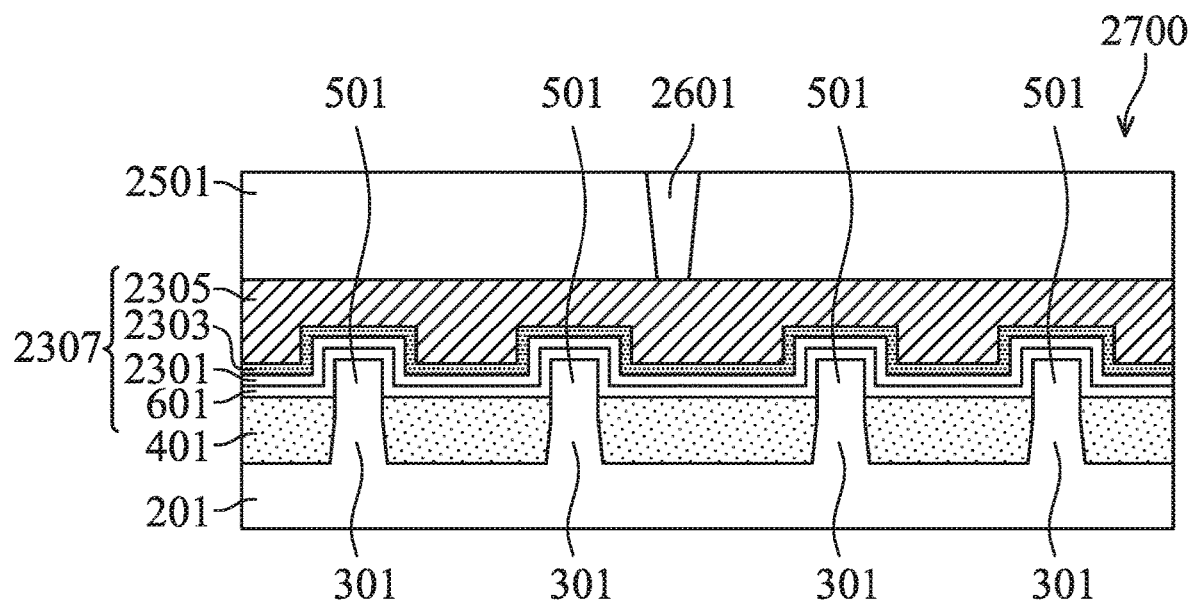
FIGS. 29A, 29B and 29C are cross-sectional views of an intermediate stage in the manufacture of a FinFET device in accordance with some embodiments.
Figure 29B:
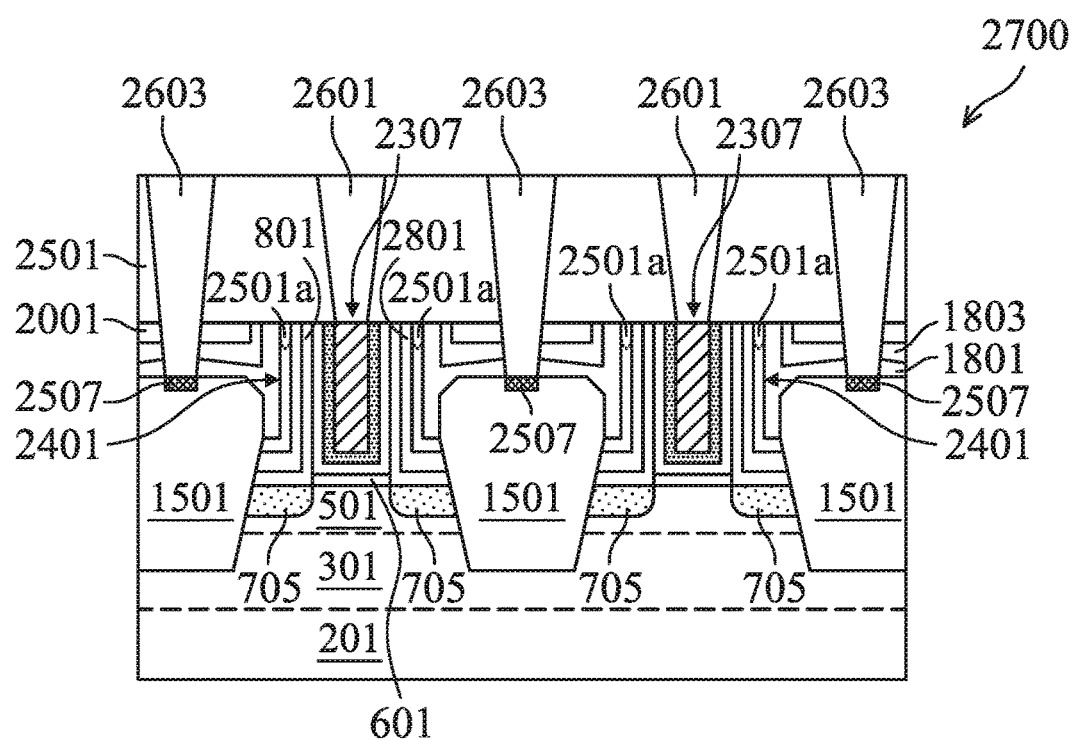
Figure 29C:
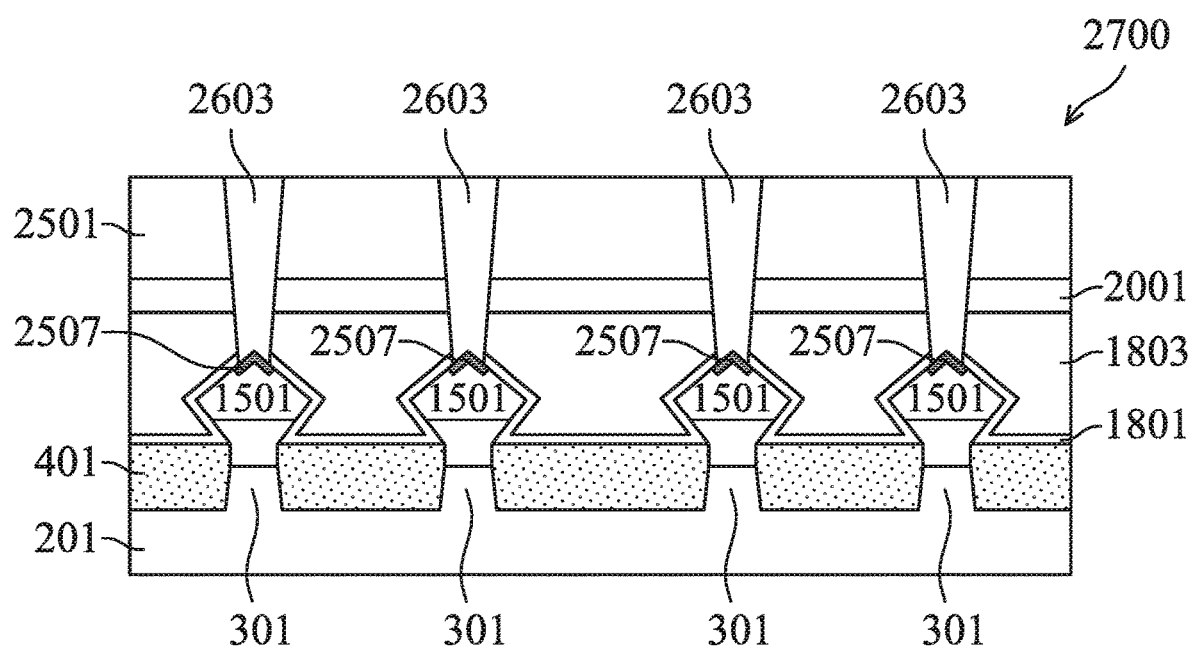

Referring to FIGS. 29A, 29B, and 29C, the process steps described above with reference to FIGS. 11A-16A, 18A-26A, 11B-16B, 18B-26B, and 11C-26C are performed on the structure of FIGS. 29A, 29B, and 29C to form the FinFET device 2700, and the description is not repeated herein. In some embodiments, the protection layer 2801 protects the un-doped portion of the dielectric layer 801 from the etch process that removes the dielectric layer 1101 and forms the gaps 2401, and improves etch selectivity of the dielectric layer 1101 during the etch process. Furthermore, the protection layer 2801 improves structural integrity of gate spacer structures comprising the dielectric layers 801 and 1801, the protection layer 2801, and the gaps 2401 to reduce or avoid collapsing of the gates 2307.

FIGS. 30A-33A, 30B-33B, and 30C-33C are cross-sectional views of intermediate stages in the manufacturing of a FinFET device 3000 in accordance with some embodiments. In FIGS. 30A-33A, 30B-33B, and 30C-33C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3000 may be similar to the process steps for forming the FinFET device 200 described above with reference to FIGS. 2A-9A, 11A-16A, 18A-26A, 6B-9B, 11B-16B, 18B-26B, 7C-9C, and 11C-26C, with like features labeled by like numerical references, and their description is not repeated herein.

Figure 30A:
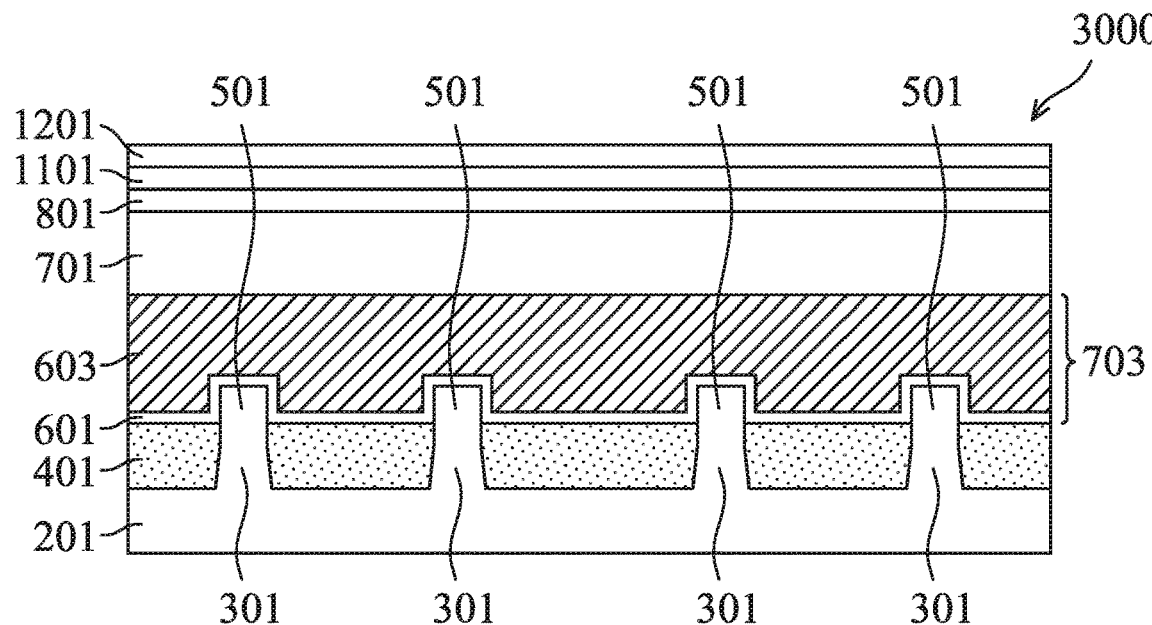
FIGS. 30A, 30B and 30C are cross-sectional views of an intermediate stage in the manufacture of a FinFET device in accordance with some embodiments.
Figure 30B:
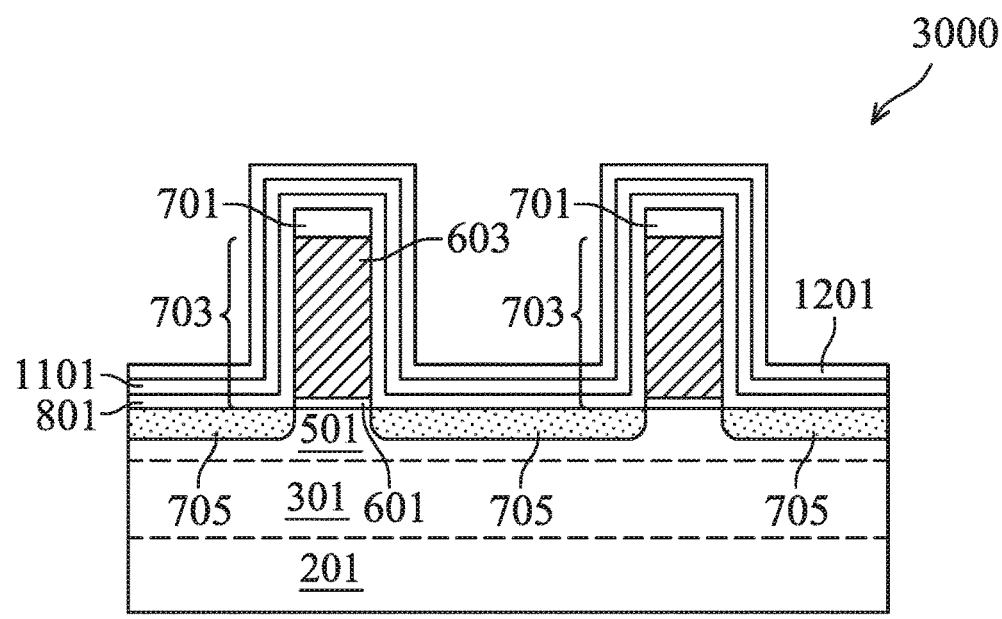
Figure 30C:
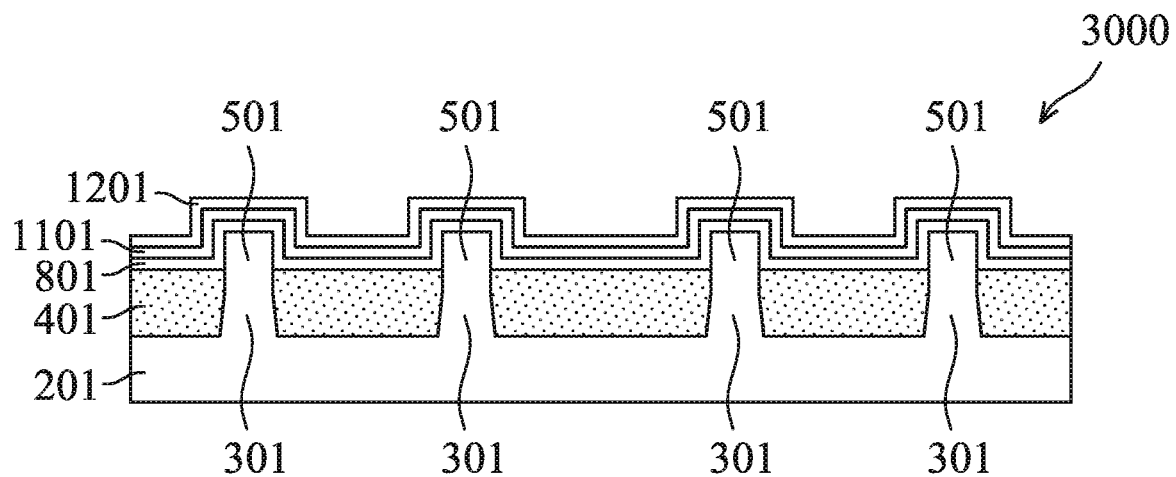

In some embodiments, the process of forming the FinFET device 3000 starts with forming a structure illustrated in FIGS. 8A, 8B, and 8C. The process steps for forming the structure of FIGS. 8A, 8B, and 8C are described above with reference to FIGS. 2A-8A, 6B-8B, and 7C-8C, and the description is not repeated herein. Referring to FIGS. 30A, 30B, and 30C, a dielectric layer 1101 is formed over the dielectric layer 801. In some embodiments, the dielectric layer 1101 is formed as described above with reference to FIGS. 11A, 111B, and 11C, and the description is not repeated herein. Subsequently, a dielectric layer 1201 is formed over the dielectric layer 1101. In some embodiments, the dielectric layer 1201 is formed as described above with reference to FIGS. 12A, 12B, and 12C, and the description is not repeated herein.

Figure 31A:
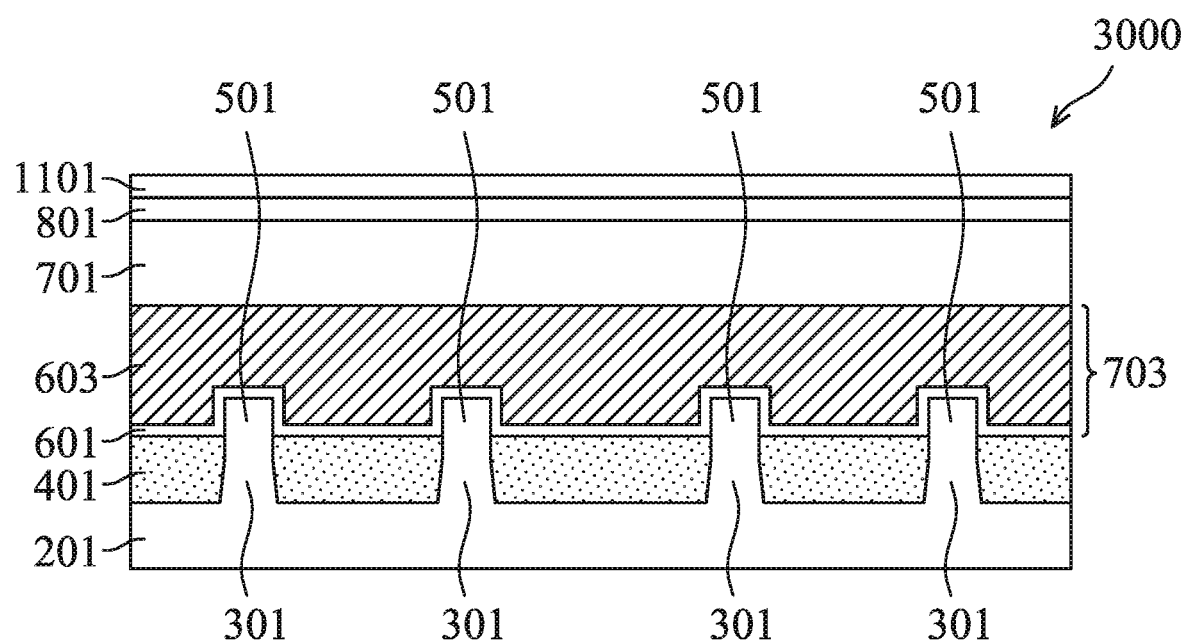
FIGS. 31A, 31B and 31C are cross-sectional views of an intermediate stage in the manufacture of a FinFET device in accordance with some embodiments.
Figure 31B:
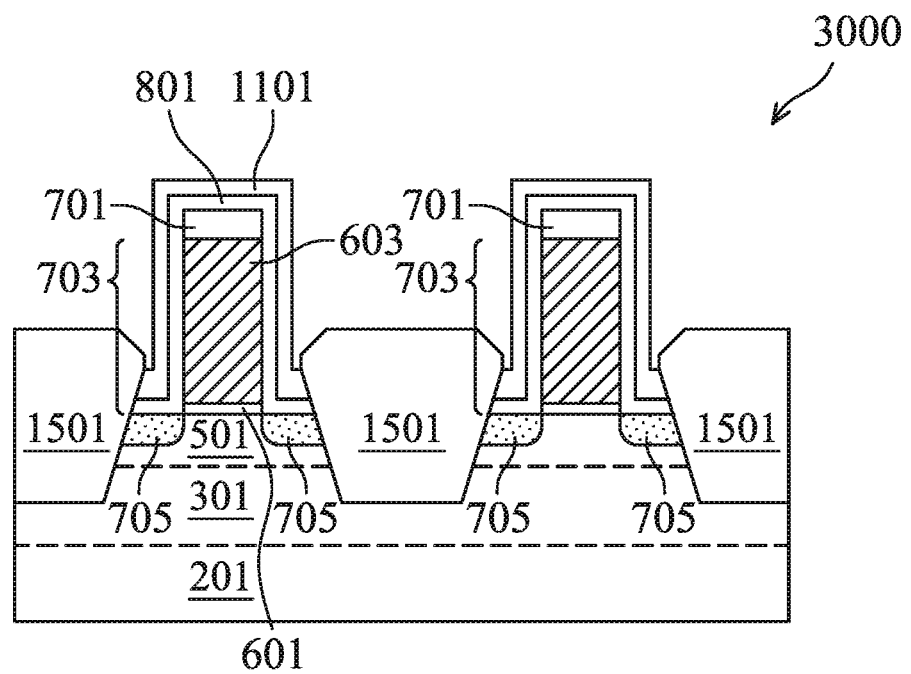
Figure 31C:
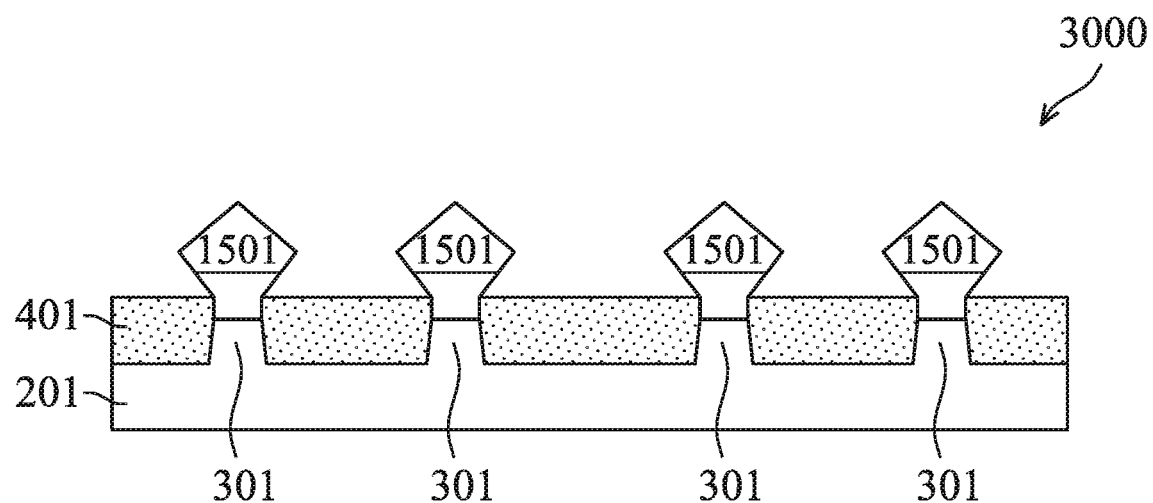

Referring to FIGS. 31A, 31B, and 31C, process steps described above with reference to FIGS. 13A-16A, 13B-16B, and 13C-16C are performed on the structure of FIGS. 30A, 30B, and 30C to form epitaxial source/drain regions 1501, and the description is not repeated herein.

Figure 32A:
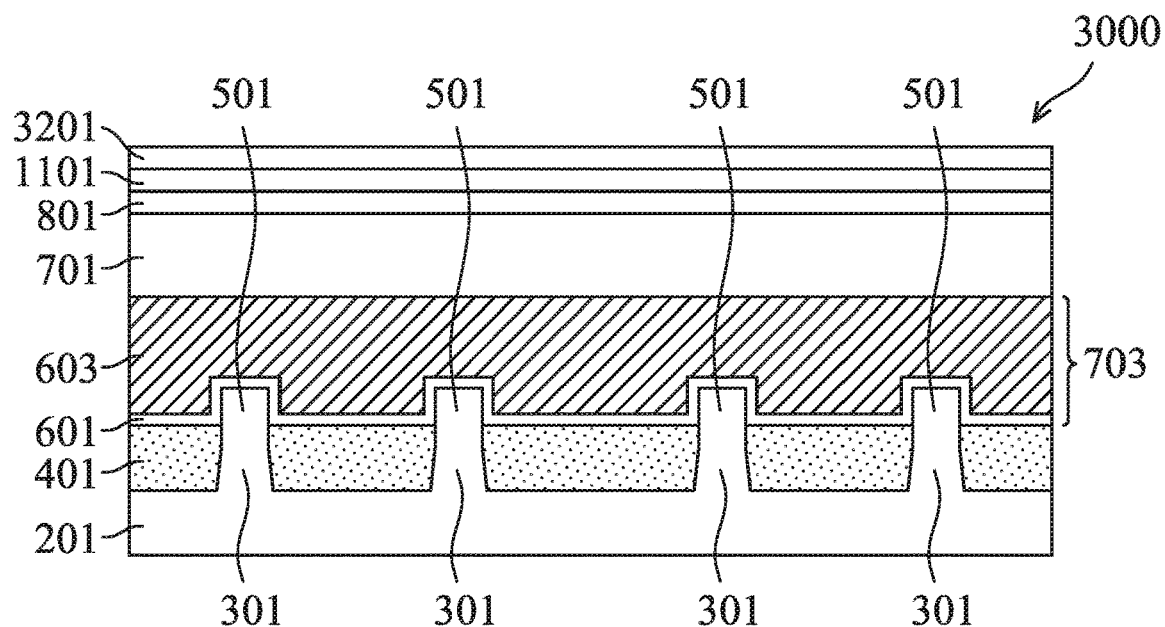
FIGS. 32A, 32B and 32C are cross-sectional views of an intermediate stage in the manufacture of a FinFET device in accordance with some embodiments.
Figure 32B:
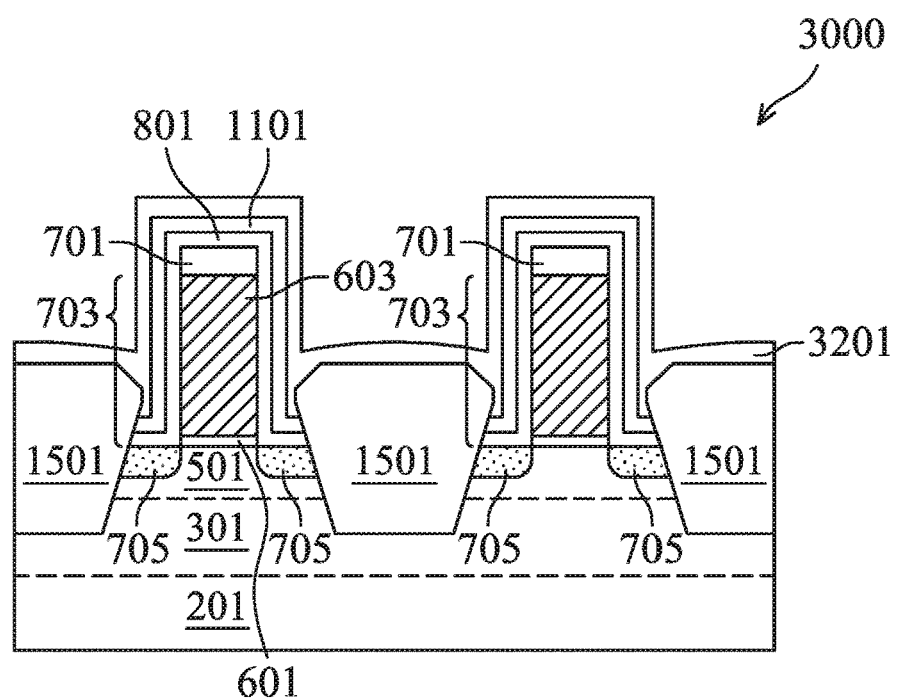
Figure 32C:
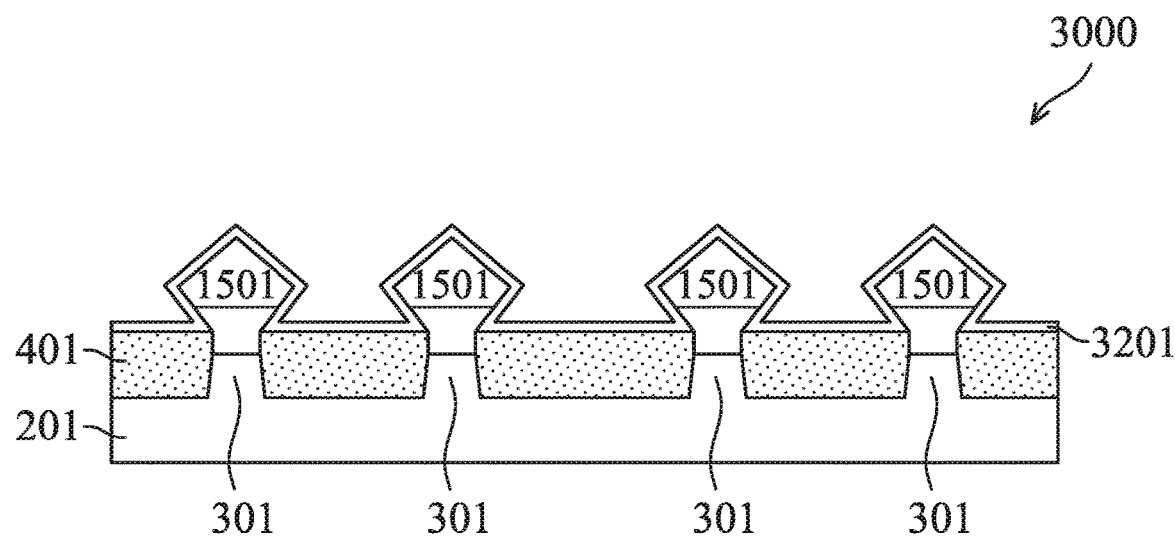

Referring to FIGS. 32A, 32B, and 32C, a protection layer 3201 is formed over the gates 703 and the epitaxial source/drain regions 1501. In some embodiments, the protection layer 3201 may be formed using similar materials and methods as the protection layer 901 described above with reference to FIGS. 9A, 9B and 9C, and the description is not repeated herein.

Figure 33A:
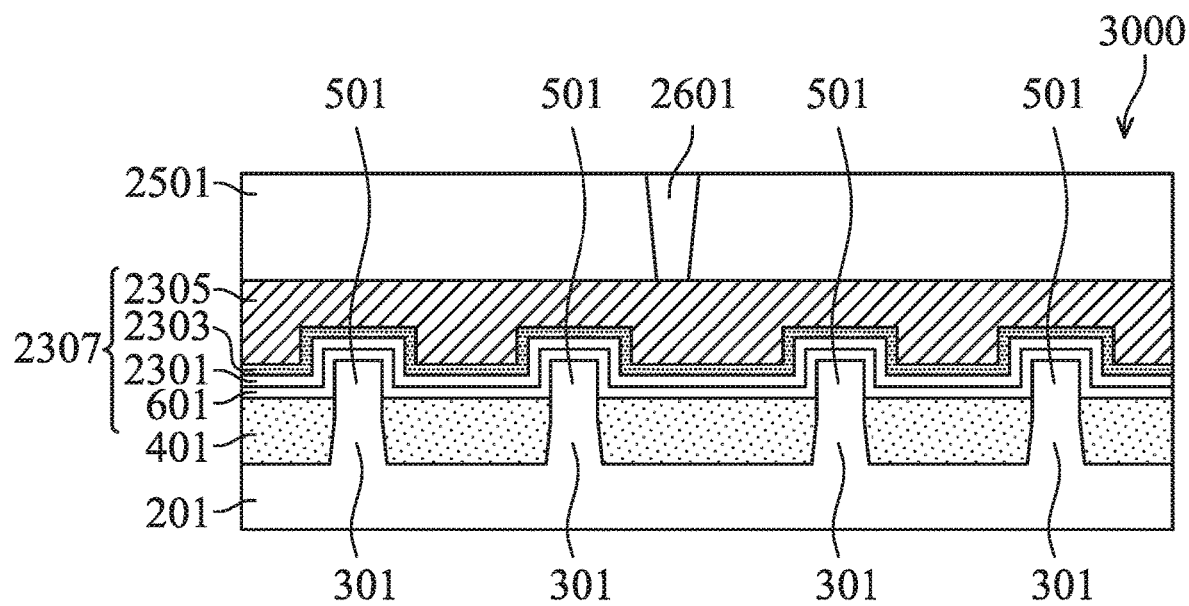
FIGS. 33A, 33B and 33C are cross-sectional views of an intermediate stage in the manufacture of a FinFET device in accordance with some embodiments.
Figure 33B:
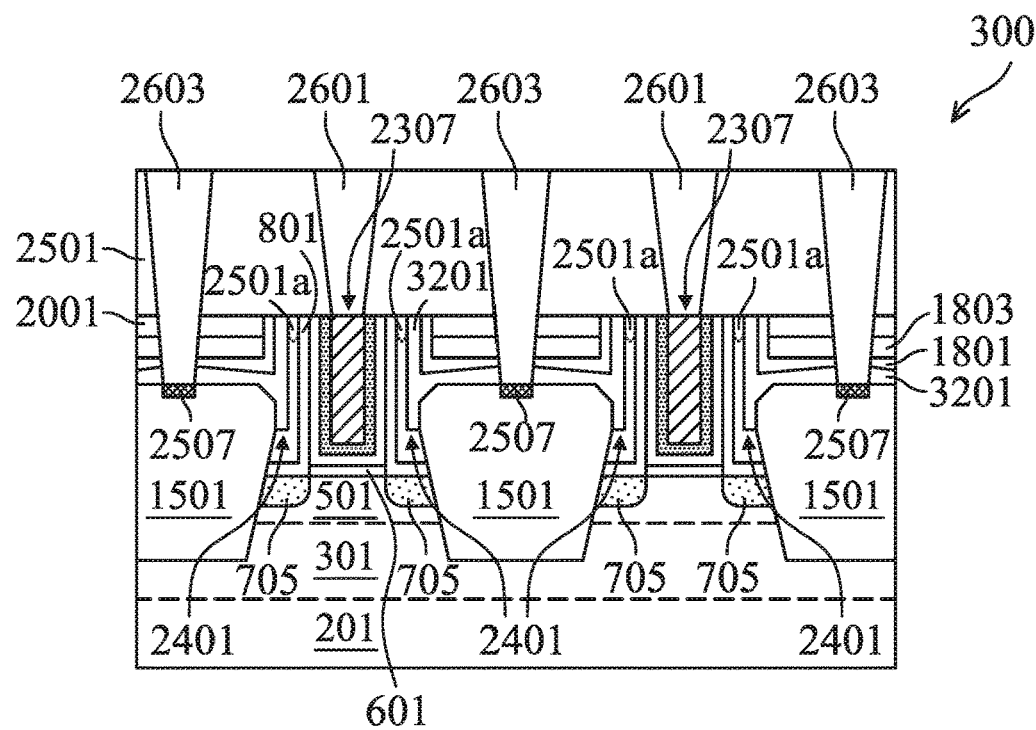
Figure 33C:
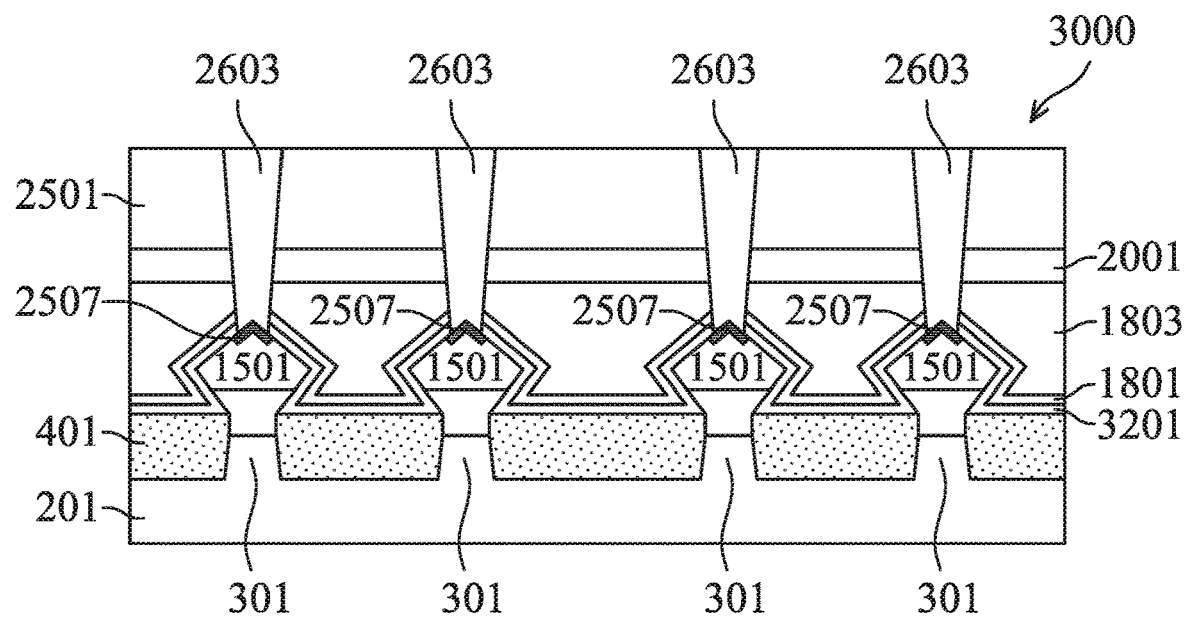

Referring to FIGS. 33A, 33B, and 33C, the process steps described above with reference to FIGS. 18A-26A, 18B-26B, and 18C-26C are performed on the structure of FIGS. 32A, 32B, and 32C to form the FinFET device 3000, and the description is not repeated herein. In some embodiments, the protection layer 3201 protects the dielectric layer 1801 from the etch process that removes the dielectric layer 1101 and forms the gaps 2401, and improves etch selectivity of the dielectric layer 1101 during the etch process. Furthermore, the protection layer 3201 improves structural integrity of gate spacer structures comprising the dielectric layers 801 and 1801, the protection layer 3201, and the gaps 2401 to reduce or avoid collapsing of the gates 2307.

Figure 34A:
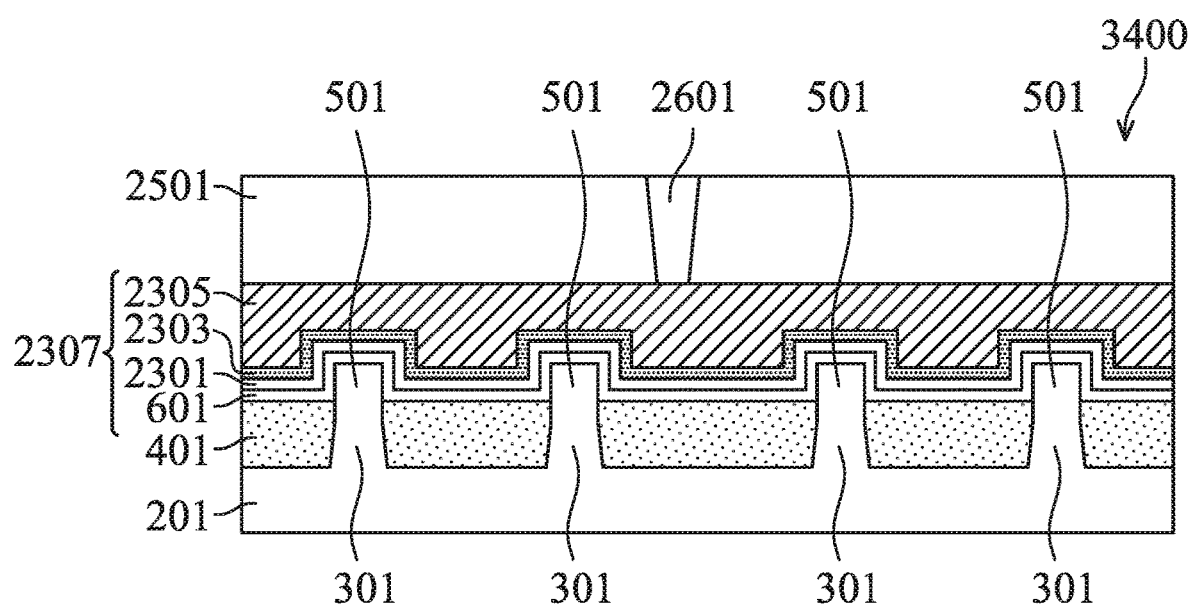
FIGS. 34A, 34B and 34C are cross-sectional views of an intermediate stage in the manufacture of a FinFET device in accordance with some embodiments.
Figure 34B:
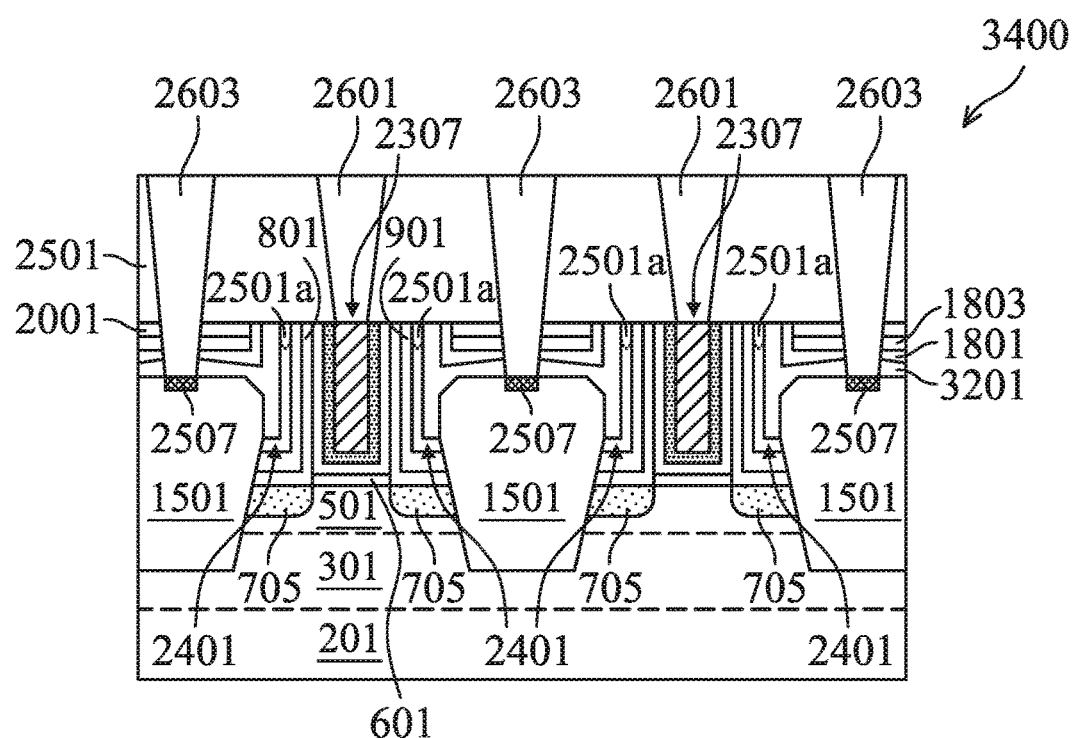
Figure 34C:
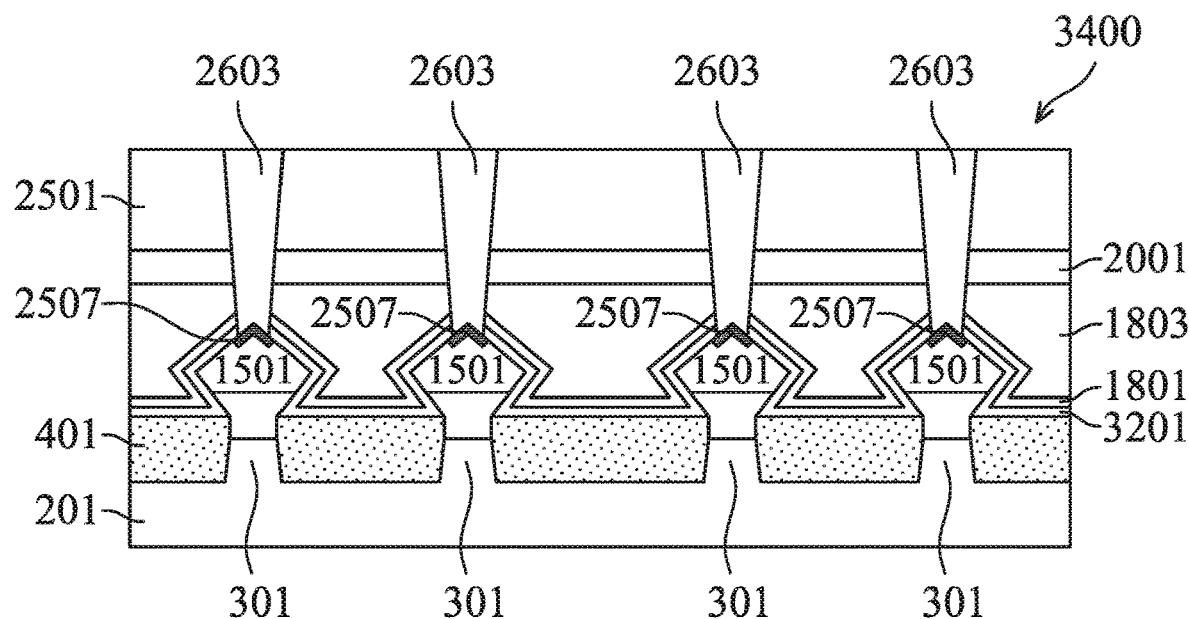

FIGS. 34A, 34B, and 34C are cross-sectional views of a FinFET device 3400 in accordance with some embodiments. In FIGS. 34A, 34B, and 34C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3400 may be similar to the process steps for forming the FinFET device 200 described above with reference to FIGS. 2A-9A, 11A-16A, 18A-26A, 6B-9B, 11B-16B, 18B-26B, 7C-9C, and 11C-26C, with like features labeled by like numerical references, and their description is not repeated herein.

In some embodiments, the process of forming the FinFET device 3400 starts with forming a structure illustrated in FIGS. 16A, 16B, and 16C. The process steps for forming the structure of FIGS. 16A, 16B, and 16C are described above with reference to FIGS. 2A-9A, 11A-16A, 6B-9B, 11B-16B, 7C-9C, and 11C-16C, and the description is not repeated herein. Subsequently, the process steps described above with reference to FIGS. 32A, 33A, 32B, 33B, 32C, and 33C are performed on the structure of FIGS. 16A, 16B, and 16C to form the FinFET device 3400, and the description is not repeated herein. In some embodiments, the protection layer 901 protects the dielectric layer 801 and the protection layer 3201 protects the dielectric layer 1801 from the etch process that removes the dielectric layer 1101 and forms the gaps 2401. In addition, protection layers 901 and 3201 improve etch selectivity of the dielectric layer 1101 during the etch process. Furthermore, the protection layers 901 and 3201 improve structural integrity of gate spacer structures comprising the dielectric layers 801 and 1801, the protection layers 901 and 3201, and the gaps 2401 to reduce or avoid collapsing of the gates 2307. In some embodiments, the protection layer 901 and the protection layer 3201 comprise a same material. In some embodiments, the protection layer 901 and the protection layer 3201 comprise different materials.

Figure 35A:
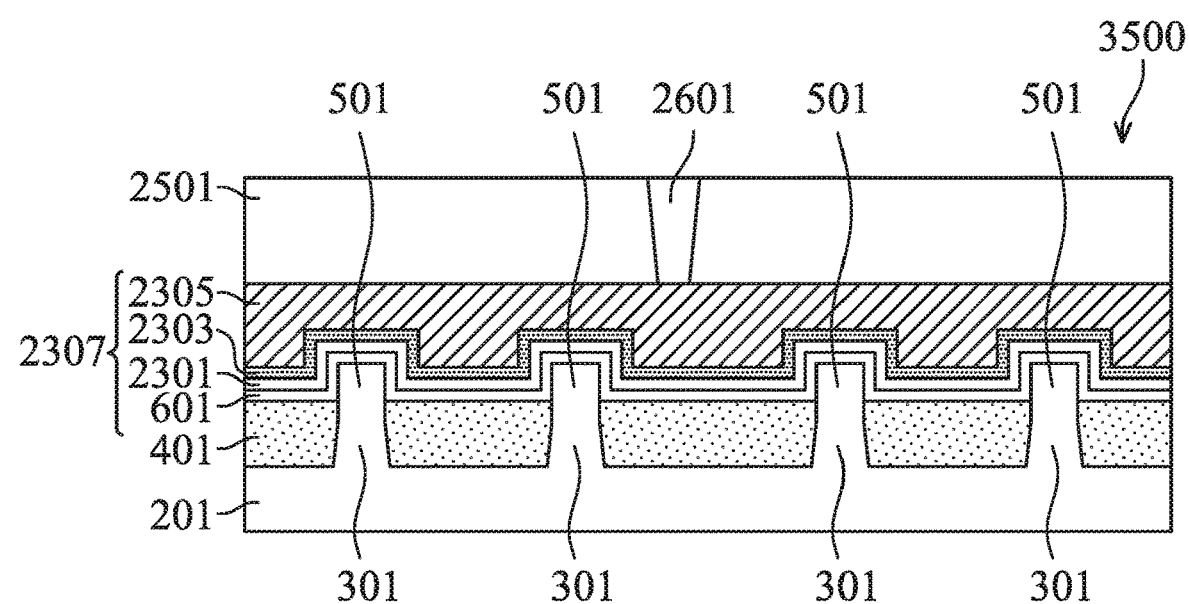
FIGS. 35A, 35B and 35C are cross-sectional views of an intermediate stage in the manufacture of a FinFET device in accordance with some embodiments.
Figure 35B:
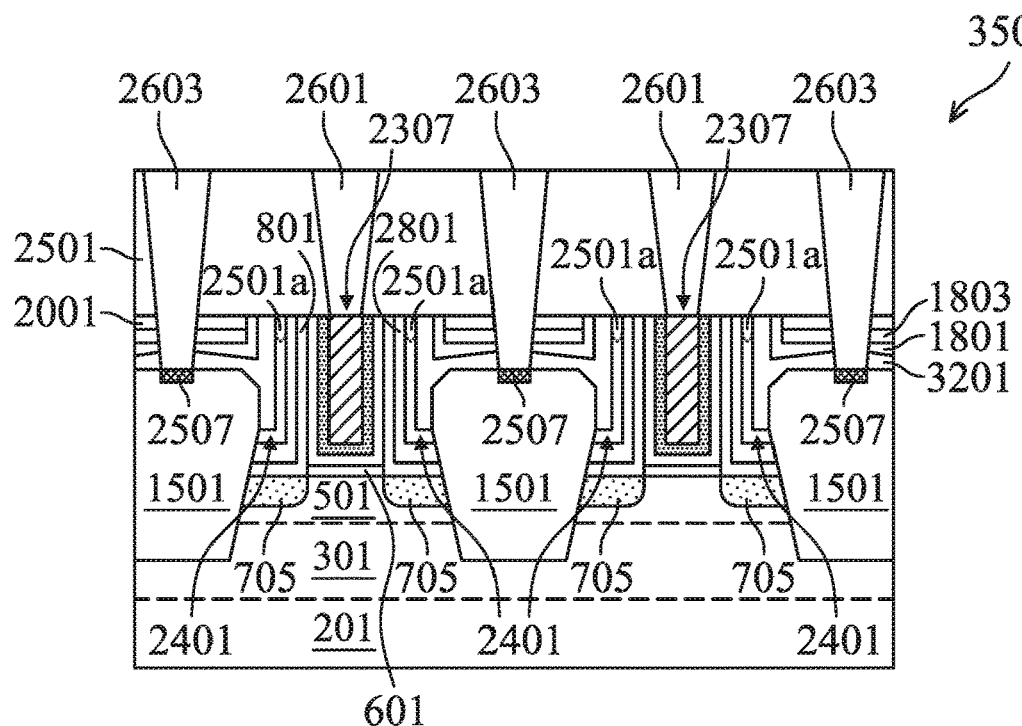
Figure 35C:
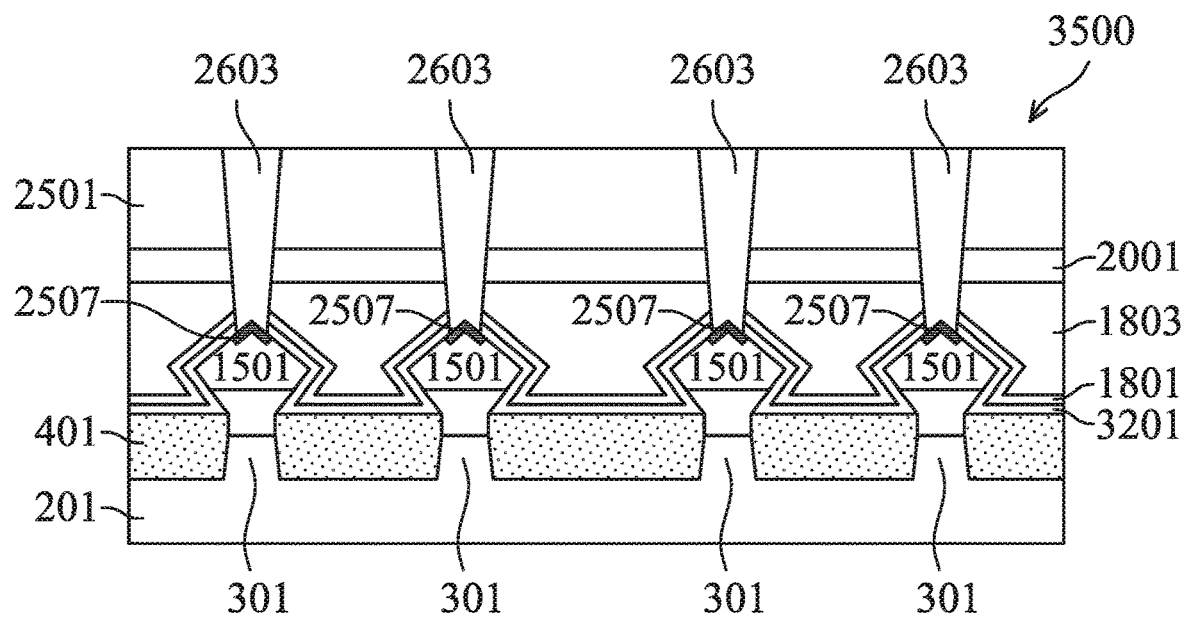

FIGS. 35A, 35B, and 35C are cross-sectional views of a FinFET device 3500 in accordance with some embodiments. In FIGS. 35A, 35B, and 35C, figures ending with an "A" designation are illustrated along the reference cross-section A-A illustrated in FIG. 1, except for multiple FinFETs and multiple fins per FinFET; figures ending with a "B" designation are illustrated along the reference cross-section B-B illustrated in FIG. 1; and figures ending with a "C" designation are illustrated along the cross-section C-C illustrated in FIG. 1. In some embodiments, process steps for forming the FinFET device 3500 may be similar to the process steps for forming the FinFET device 3400 described above with reference to FIGS. 34A, 34B, and 34C, with like features labeled by like numerical references, and their description is not repeated herein.

In some embodiments, the process of forming the FinFET device 3500 starts with forming a structure illustrated in FIGS. 28A, 28B, and 28C. The process steps for forming the structure of FIGS. 28A, 28B, and 28C are described above with reference to FIGS. 2A-7A, 27A, 28A, 6B, 7B, 27B, 28B, 7C, 27C, and 28C, and the description is not repeated herein. Subsequently, the process steps described above with reference to FIGS. 11A-16A, 11B-16B, and 11C-16C followed by the process steps described above with reference to FIGS. 32A, 33A, 32B, 33B, 32C, and 33C are performed on the structure of FIGS. 28A, 28B, and 28C to form the FinFET device 3500, and the description is not repeated herein. In some embodiments, the protection layer 2801 protects the un-doped portion of the dielectric layer 801 and the protection layer 3201 protects the dielectric layer 1801 from the etch process that removes the dielectric layer 1101 and forms the gaps 2401. In addition, protection layers 2801 and 3201 improve etch selectivity of the dielectric layer 1101 during the etch process. Furthermore, the protection layers 2801 and 3201 improve structural integrity of gate spacer structures comprising the dielectric layers 801 and 1801, the protection layers 2801 and 3201, and the gaps 2401 to reduce or avoid collapsing of the gates 2307.

Figure 36:
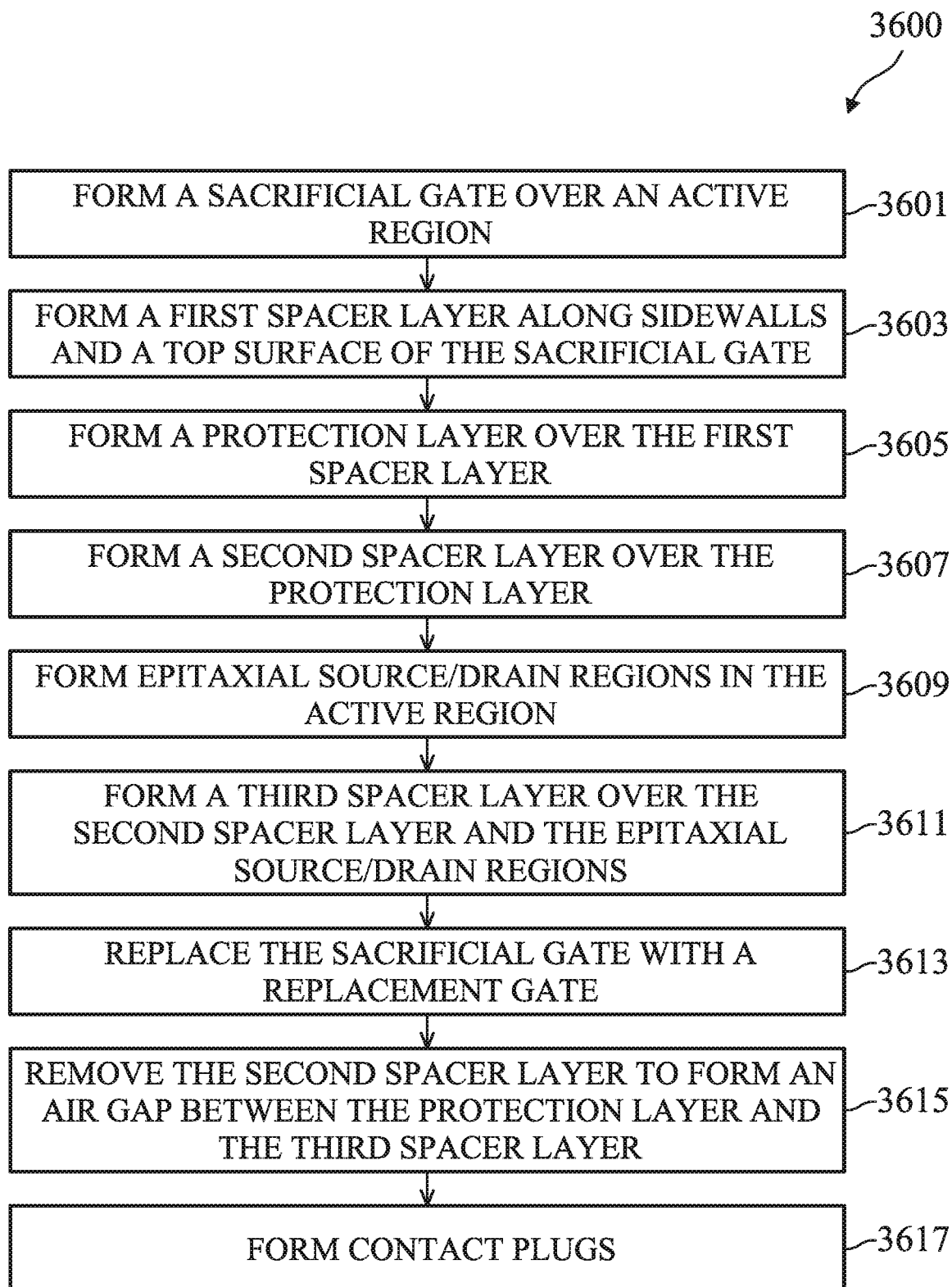
FIG. 36 is a flow diagram illustrating a method of forming a semiconductor device in accordance with some embodiments.

FIG. 36 is a flow diagram illustrating a method 3600 of forming a semiconductor device in accordance with some embodiments. The method 3600 starts with step 3601, where a sacrificial gate (such as the gate 703 illustrated in FIGS. 7A, 7B, and 7C) is formed over an active region (such as the fin 501 illustrated in FIGS. 7A, 7B, and 7C) as described above with reference to FIGS. 2A-7A, 6B, 7B, and 7C. In step 3603, a first spacer layer (such as the dielectric layer 801 illustrated in FIGS. 8A, 8B, and 8C) is formed along sidewalls and a top surface of the sacrificial gate as described above with reference to FIGS. 8A, 8B, and 8C. In step 3605, a protection layer (such as the protection layer 901 illustrated in FIGS. 9A, 9B, and 9C) is formed over the first spacer layer as described above with reference to FIGS. 9A, 9B, and 9C. In step 3607, a second spacer layer (such as the dielectric layer 1101 illustrated in FIGS. 11A, 111B, and 11C) is formed over the protection layer as described above with reference to FIGS. 11A, 11B, and 11C. In step 3609, epitaxial source/drain regions (such as the epitaxial source/drain regions 1501 illustrated in FIGS. 16A, 16B, and 16C) are formed in the active region as described above with reference to FIGS. 12A-16A, 12B-16B, and 12C-16C. In step 3611, a third spacer layer (such as the dielectric layer 1801 illustrated in FIGS. 18A, 18B, and 18C) is formed over the second spacer layer and the epitaxial source/drain regions as described above with reference to FIGS. 18A, 18B, and 18C. In step 3613, the sacrificial gate is replaced with a replacement gate (such as the gate 2307 illustrated in FIGS. 23A, 23B, and 23C) as described above with reference to FIGS. 19A-23A, 19B-23B, and 19C-23C. In step 3615, the second spacer layer is removed to form an air gap (such as the gap 2401 illustrated in FIGS. 24A, 24B, and 24C) between the protection layer and the third spacer layer as described above with reference to FIGS. 24A, 24B, and 24C. In step 3617, contact plugs (such as the contact plugs 2601 and 2603 illustrated in FIGS. 26A, 26B, and 26C) are formed as described above with reference to FIGS. 25A, 26A, 25B, 26B, 25C, and 26C.

Figure 37:
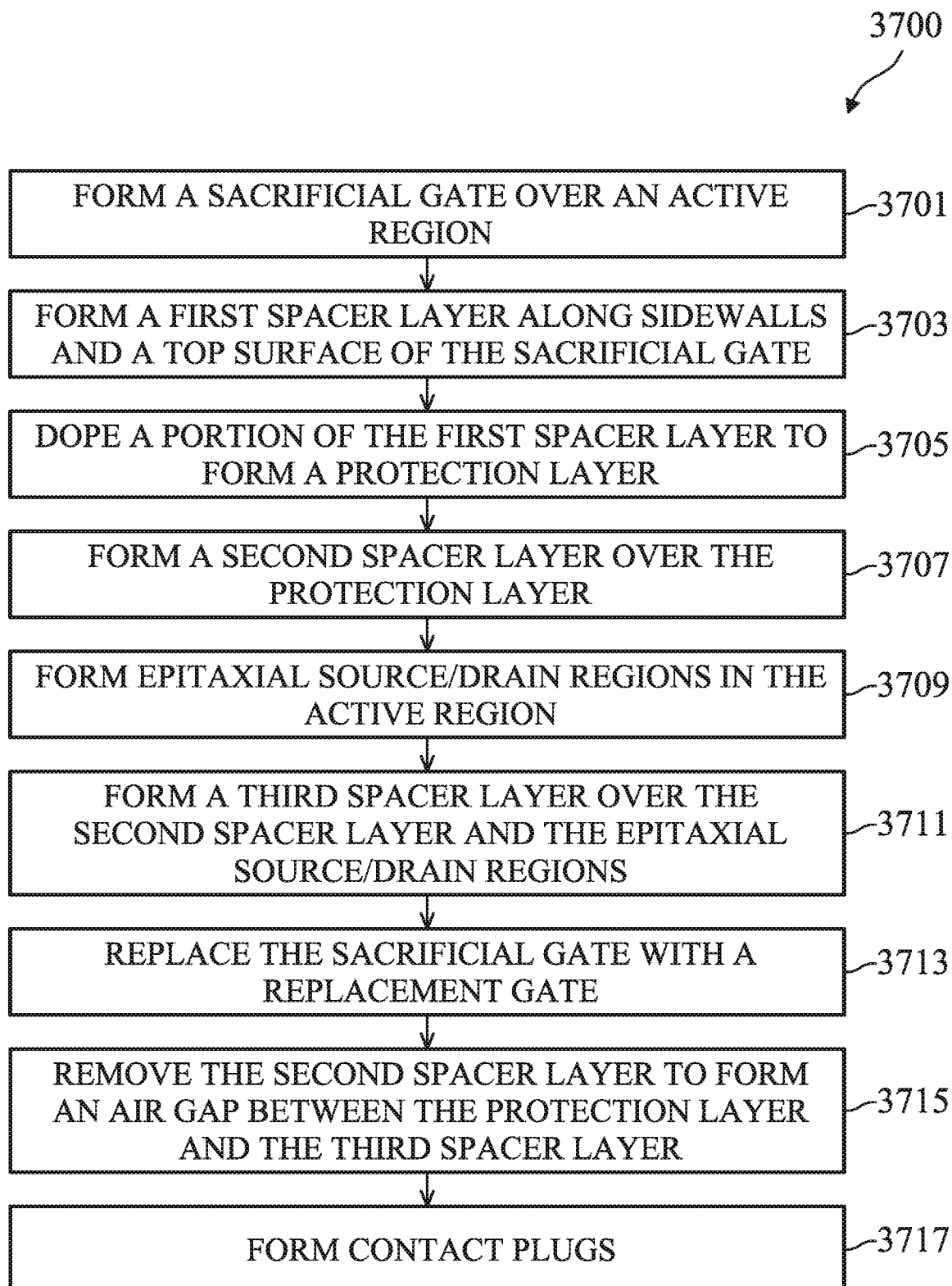
FIG. 37 is a flow diagram illustrating a method of forming a semiconductor device in accordance with some embodiments.

FIG. 37 is a flow diagram illustrating a method 3700 of forming a semiconductor device in accordance with some embodiments. The method 3700 starts with step 3701, where a sacrificial gate (such as the gate 703 illustrated in FIGS. 27A, 27B, and 27C) is formed over an active region (such as the fin 501 illustrated in FIGS. 27A, 27B, and 27C) as described above with reference to FIGS. 2A-7A, 6B, 7B, and 7C. In step 3703, a first spacer layer (such as the dielectric layer 801 illustrated in FIGS. 27A, 27B, and 27C) is formed along sidewalls and a top surface of the sacrificial gate as described above with reference to FIGS. 27A, 27B, and 27C. In step 3705, a portion of the first spacer layer is doped to form a protection layer (such as the protection layer 2801 illustrated in FIGS. 28A, 28B, and 28C) as described above with reference to FIGS. 28A, 28B, and 28C. In step 3707, a second spacer layer (such as the dielectric layer 1101 illustrated in FIGS. 11A, 11B, and 11C) is formed over the protection layer as described above with reference to FIGS. 11A, 11B, and 11C. In step 3709, epitaxial source/drain regions (such as the epitaxial source/drain regions 1501 illustrated in FIGS. 29A, 29B, and 29C) are formed in the active region as described above with reference to FIGS. 12A-16A, 12B-16B, and 12C-16C. In step 3711, a third spacer layer (such as the dielectric layer 1801 illustrated in FIGS. 29A, 29B, and 29C) is formed over the second spacer layer and the epitaxial source/drain regions as described above with reference to FIGS. 18A, 18B, and 18C. In step 3713, the sacrificial gate is replaced with a replacement gate (such as the gate 2307 illustrated in FIGS. 29A, 29B, and 29C) as described above with reference to FIGS. 19A-23A, 19B-23B, and 19C-23C. In step 3715, the second spacer layer is removed to form an air gap (such as the gap 2401 illustrated in FIGS. 29A, 29B, and 29C) between the protection layer and the third spacer layer as described above with reference to FIGS. 24A, 24B, and 24C. In step 3717, contact plugs (such as the contact plugs 2601 and 2603 illustrated in FIGS. 29A, 29B, and 29C) are formed as described above with reference to FIGS. 25A, 26A, 25B, 26B, 25C, and 26C.

Figure 38:
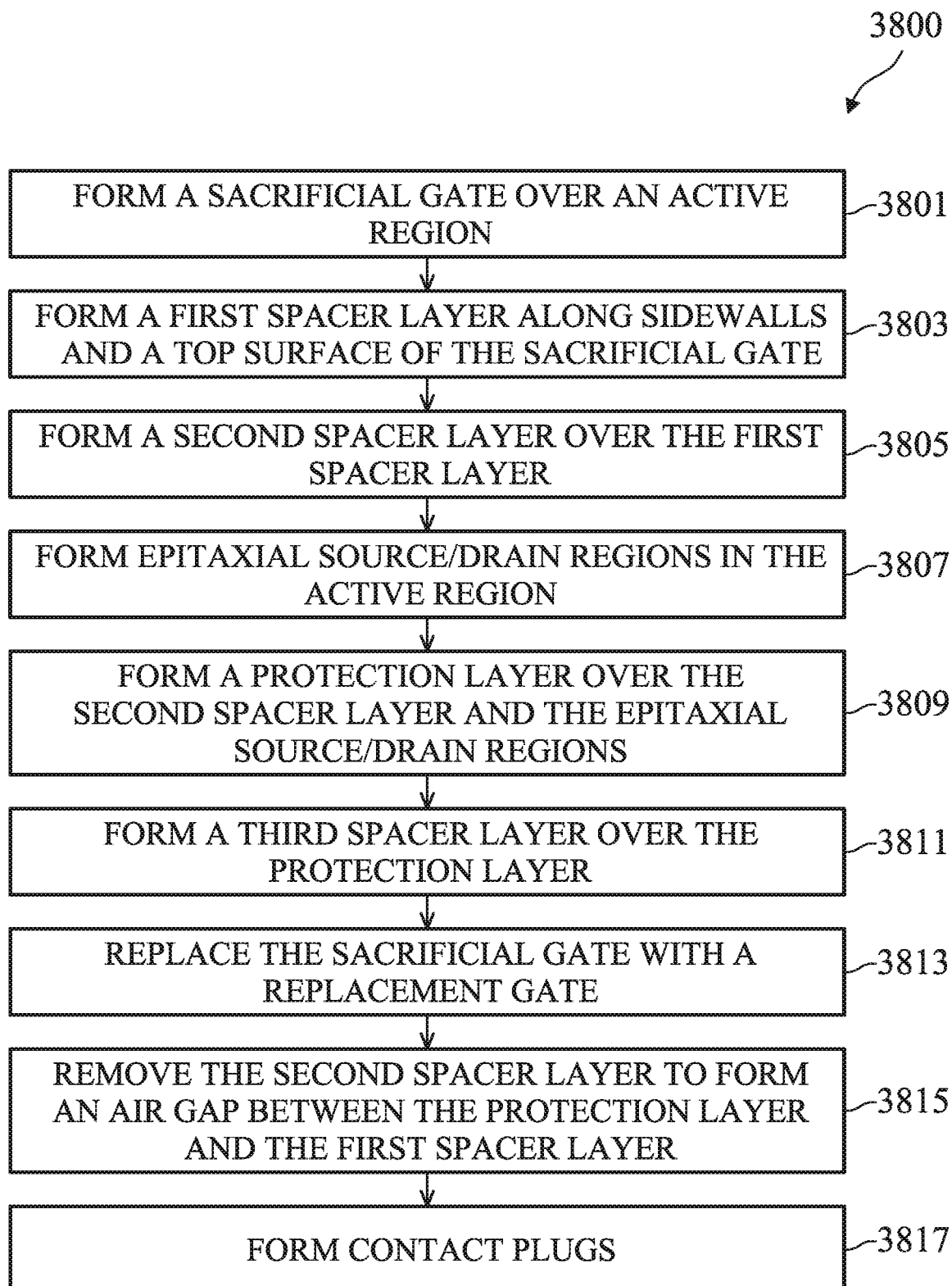
FIG. 38 is a flow diagram illustrating a method of forming a semiconductor device in accordance with some embodiments.

FIG. 38 is a flow diagram illustrating a method 3800 of forming a semiconductor device in accordance with some embodiments. The method 3800 starts with step 3801, where a sacrificial gate (such as the gate 703 illustrated in FIGS. 30A, 30B, and 30C) is formed over an active region (such as the fin 501 illustrated in FIGS. 30A, 30B, and 30C) as described above with reference to FIGS. 2A-7A, 6B, 7B, and 7C. In step 3803, a first spacer layer (such as the dielectric layer 801 illustrated in FIGS. 30A, 30B, and 30C) is formed along sidewalls and a top surface of the sacrificial gate as described above with reference to FIGS. 30A, 30B, and 30C. In step 3805, a second spacer layer (such as the dielectric layer 1101 illustrated in FIGS. 30A, 30B, and 30C) is formed over the first spacer layer as described above with reference to FIGS. 30A, 30B, and 30C. In step 3807, epitaxial source/drain regions (such as the epitaxial source/drain regions 1501 illustrated in FIGS. 31A, 31B, and 31C) are formed in the active region as described above with reference to FIGS. 12A-16A, 12B-16B, and 12C-16C. In step 3809, a protection layer (such as the protection layer 3201 illustrated in FIGS. 32A, 32B, and 32C) is formed over the second spacer layer and the epitaxial source/drain regions as described above with reference to FIGS. 32A, 32B, and 32C. In step 3811, a third spacer layer (such as the dielectric layer 1801 illustrated in FIGS. 33A, 33B, and 33C) is formed over the protection layer as described above with reference to FIGS. 18A, 18B, and 18C. In step 3813, the sacrificial gate is replaced with a replacement gate (such as the gate 2307 illustrated in FIGS. 33A, 33B, and 33C) as described above with reference to FIGS. 19A-23A, 19B-23B, and 19C-23C. In step 3815, the second spacer layer is removed to form an air gap (such as the gap 2401 illustrated in FIGS. 33A, 33B, and 33C) between the protection layer and the first spacer layer as described above with reference to FIGS. 24A, 24B, and 24C. In step 3817, contact plugs (such as the contact plugs 2601 and 2603 illustrated in FIGS. 33A, 33B, and 33C) are formed as described above with reference to FIGS. 25A, 26A, 25B, 26B, 25C, and 26C.

Figure 39:
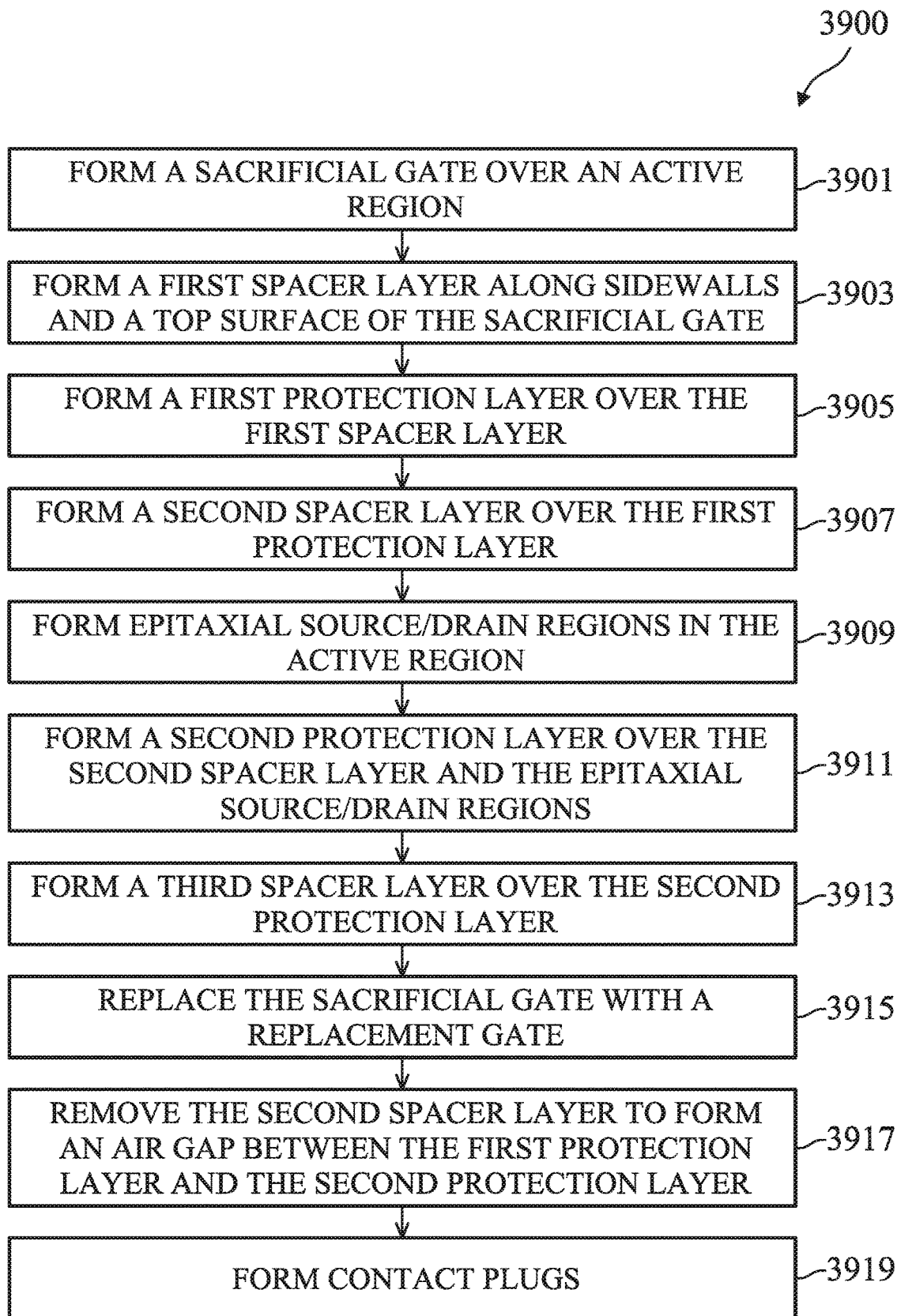
FIG. 39 is a flow diagram illustrating a method of forming a semiconductor device in accordance with some embodiments.

FIG. 39 is a flow diagram illustrating a method 3900 of forming a semiconductor device in accordance with some embodiments. The method 3900 starts with step 3901, where a sacrificial gate (such as the gate 703 illustrated in FIGS. 7A, 7B, and 7C) is formed over an active region (such as the fin 501 illustrated in FIGS. 7A, 7B, and 7C) as described above with reference to FIGS. 2A-7A, 6B, 7B, and 7C. In step 3903, a first spacer layer (such as the dielectric layer 801 illustrated in FIGS. 8A, 8B, and 8C) is formed along sidewalls and a top surface of the sacrificial gate as described above with reference to FIGS. 8A, 8B, and 8C. In step 3905, a first protection layer (such as the protection layer 901 illustrated in FIGS. 34A, 34B, and 34C) is formed over the first spacer layer as described above with reference to FIGS. 9A, 9B, and 9C. In step 3907, a second spacer layer (such as the dielectric layer 1101 illustrated in FIGS. 11A, 11B, and 11C) is formed over the first protection layer as described above with reference to FIGS. 11A, 11B, and 11C. In step 3909, epitaxial source/drain regions (such as the epitaxial source/drain regions 1501 illustrated in FIGS. 34A, 34B, and 34C) are formed in the active region as described above with reference to FIGS. 12A-16A, 12B-16B, and 12C-16C. In step 3911, a second protection layer (such as the protection layer 3201 illustrated in FIGS. 34A, 34B, and 34C) is formed over the second spacer layer and the epitaxial source/drain regions as described above with reference to FIGS. 32A, 32B, and 32C. In step 3913, a third spacer layer (such as the dielectric layer 1801 illustrated in FIGS. 34A, 34B, and 34C) is formed over the second protection layer as described above with reference to FIGS. 18A, 18B, and 18C. In step 3915, the sacrificial gate is replaced with a replacement gate (such as the gate 2307 illustrated in FIGS. 34A, 34B, and 34C) as described above with reference to FIGS. 19A-23A, 19B-23B, and 19C-23C. In step 3917, the second spacer layer is removed to form an air gap (such as the gap 2401 illustrated in FIGS. 34A, 34B, and 34C) between the first protection layer and the second protection layer as described above with reference to FIGS. 24A, 24B, and 24C. In step 3919, contact plugs (such as the contact plugs 2601 and 2603 illustrated in FIGS. 34A, 34B, and 34C) are formed as described above with reference to FIGS. 25A, 26A, 25B, 26B, 25C, and 26C.

Figure 40:
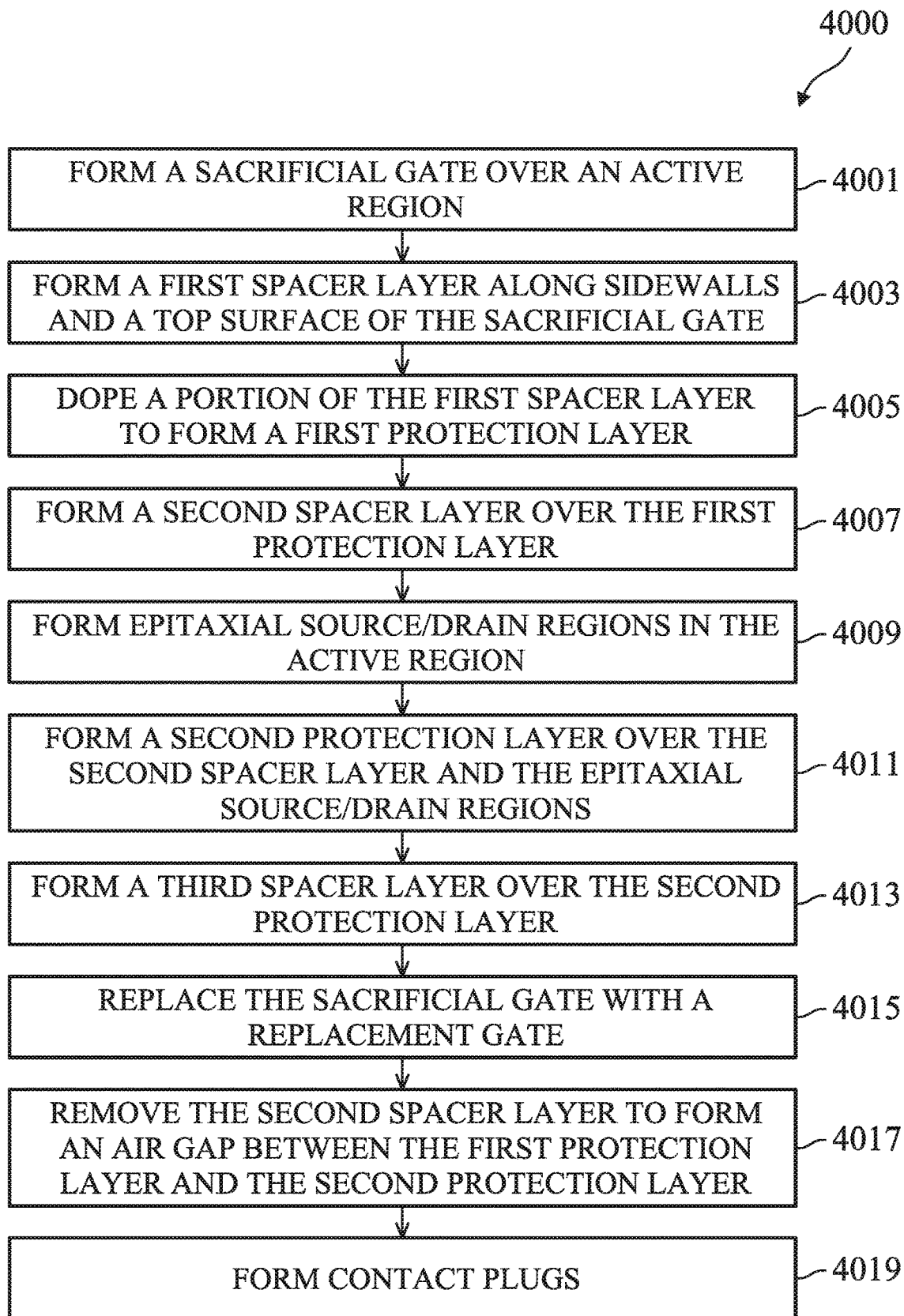
FIG. 40 is a flow diagram illustrating a method of forming a semiconductor device in accordance with some embodiments.

FIG. 40 is a flow diagram illustrating a method 4000 of forming a semiconductor device in accordance with some embodiments. The method 4000 starts with step 4001, where a sacrificial gate (such as the gate 703 illustrated in FIGS. 27A, 27B, and 27C) is formed over an active region (such as the fin 501 illustrated in FIGS. 27A, 27B, and 27C) as described above with reference to FIGS. 2A-7A, 6B, 7B, and 7C. In step 4003, a first spacer layer (such as the dielectric layer 801 illustrated in FIGS. 27A, 27B, and 27C) is formed along sidewalls and a top surface of the sacrificial gate as described above with reference to FIGS. 27A, 27B, and 27C. In step 4005, a portion of the first spacer layer is doped to form a first protection layer (such as the protection layer 2801 illustrated in FIGS. 28A, 28B, and 28C) as described above with reference to FIGS. 28A, 28B, and 28C. In step 4007, a second spacer layer (such as the dielectric layer 1101 illustrated in FIGS. 11A, 11B, and 11C) is formed over the first protection layer as described above with reference to FIGS. 11A, 11B, and 11C. In step 4009, epitaxial source/drain regions (such as the epitaxial source/drain regions 1501 illustrated in FIGS. 35A, 35B, and 35C) are formed in the active region as described above with reference to FIGS. 12A-16A, 12B-16B, and 12C-16C. In step 4011, a second protection layer (such as the protection layer 3201 illustrated in FIGS. 35A, 35B, and 35C) is formed over the second spacer layer and the epitaxial source/drain regions as described above with reference to FIGS. 32A, 32B, and 32C. In step 4013, a third spacer layer (such as the dielectric layer 1801 illustrated in FIGS. 35A, 35B, and 35C) is formed over the second protection layer as described above with reference to FIGS. 18A, 18B, and 18C. In step 4015, the sacrificial gate is replaced with a replacement gate (such as the gate 2307 illustrated in FIGS. 35A, 35B, and 35C) as described above with reference to FIGS. 19A-23A, 19B-23B, and 19C-23C. In step 4017, the second spacer layer is removed to form an air gap (such as the gap 2401 illustrated in FIGS. 35A, 35B, and 35C) between the first protection layer and the second protection layer as described above with reference to FIGS. 24A, 24B, and 24C. In step 4019, contact plugs (such as the contact plugs 2601 and 2603 illustrated in FIGS. 35A, 35B, and 35C) are formed as described above with reference to FIGS. 25A, 26A, 25B, 26B, 25C, and 26C.

In accordance with an embodiment, a method including: forming a sacrificial gate structure over an active region; forming a first spacer layer along sidewalls and a top surface of the sacrificial gate structure; forming a first protection layer over the first spacer layer; forming a second spacer layer over the first protection layer; forming a third spacer layer over the second spacer layer; replacing the sacrificial gate structure with a replacement gate structure; and removing the second spacer layer to form an air gap between the first protection layer and the third spacer layer. In an embodiment, the method further includes forming a second protection layer between the second spacer layer and the third spacer layer. In an embodiment, the first protection layer and the second protection layer include a same material. In an embodiment, the first protection layer and the second protection layer include different materials. In an embodiment, forming the first protection layer over the first spacer layer includes depositing a carbon layer or a boron layer over the first spacer layer. In an embodiment, removing the second spacer layer includes performing a selective etch process on the second spacer layer. In an embodiment, the method further includes, before forming the third spacer layer, forming an epitaxial source/drain region in the active region adjacent the sacrificial gate structure.

In accordance with another embodiment, a method including: forming a sacrificial gate structure over an active region; depositing a first spacer layer along sidewalls and a top surface of the sacrificial gate structure; doping an upper portion of the first spacer layer to form a first protection layer over an un-doped portion of the first spacer layer; depositing a second spacer layer over the first protection layer; forming an epitaxial source/drain region in the active region adjacent the sacrificial gate structure; depositing a third spacer layer over the second spacer layer and the epitaxial source/drain region; replacing the sacrificial gate structure with a replacement gate structure; and performing a selective etch process on the second spacer layer to form an air gap between the first protection layer and the third spacer layer. In an embodiment, the method further includes forming a second protection layer between the second spacer layer and the third spacer layer. In an embodiment, forming the second protection layer includes depositing a carbon layer or a boron layer. In an embodiment, doping the upper portion of the first spacer layer includes doping a material of the first spacer layer with carbon or boron. In an embodiment, an etch rate of the first protection layer is less than an etch rate of the un-doped portion of the first spacer layer with respect to the selective etch process. In an embodiment, doping the upper portion of the first spacer layer includes performing a plasma-assisted doping process on the first spacer layer. In an embodiment, forming epitaxial source/drain region includes: etching the first spacer layer, the second spacer layer, the first protection layer and the active region to form a recess; and epitaxially growing a semiconductor material in the recess.

In accordance with yet another embodiment, a device including: a gate structure over an active region; a first spacer extending along a sidewall of the gate structure and a top surface of the active region; a first protection layer adjacent the first spacer, the first spacer being interposed between the sidewall of the gate structure and the first protection layer; a second spacer adjacent the first protection layer, the first protection layer being interposed between the first spacer and the second spacer; and an air gap interposed between the first protection layer and the second spacer. In an embodiment, the device further includes a second protection layer between the first protection layer and the second spacer. In an embodiment, the air gap is interposed between the first protection layer and the second protection layer. In an embodiment, the second protection layer is a carbon layer or a boron layer. In an embodiment, the first protection layer is a carbon layer or a boron layer. In an embodiment, the first spacer is formed of a first material, and the first protection layer is formed of the first material doped with carbon or boron.

In accordance with yet another embodiment, a device includes: a gate structure over an active region; an epitaxial source/drain region extending into the active region adjacent the gate structure; and a spacer structure on a sidewall of the gate structure, the spacer structure including: a first layer extending along the sidewall of the gate structure; a second layer adjacent the first layer, the second layer extending along and being in physical contact with a top surface of the epitaxial source/drain region; and an air gap interposed between the first layer and the second layer, a first surface of the first layer and a second surface of the second layer being exposed by the air gap.

In accordance with yet another embodiment, a device includes: a gate structure over an active region; an epitaxial source/drain region extending into the active region adjacent the gate structure; and a spacer structure between the gate structure and the epitaxial source/drain region, the spacer structure including: a first layer extending along a top surface of the active region and being in physical contact with a sidewall of the epitaxial source/drain region; a second layer adjacent the first layer, the second layer being in physical contact with the sidewall and a top surface of the epitaxial source/drain region; and an air gap interposed between the first layer and the second layer, a first surface of the first layer, a second surface of the second layer, and a portion of the sidewall of the epitaxial source/drain region being exposed by the air gap.

In accordance with yet another embodiment, a method includes: forming a sacrificial gate structure over an active region; forming a first spacer layer along a sidewall of the sacrificial gate structure and a top surface of the active region; forming a first protection layer over the first spacer layer; forming a second spacer layer over the first protection layer; forming an epitaxial source/drain region in the active region adjacent the sacrificial gate structure, a sidewall of the epitaxial source/drain region being in physical contact with the first spacer layer, the first protection layer, and the second spacer layer; forming a third spacer layer over the second spacer layer and a top surface of the epitaxial source/drain region; and etching the second spacer layer to form an air gap between the first protection layer and the third spacer layer.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a first gate structure over an active region;
   depositing a first spacer layer along sidewalls and a top surface of the first gate structure;
   doping an upper portion of the first spacer layer to form a first protection layer over an un-doped portion of the first spacer layer;
   depositing a sacrificial layer over the first protection layer;
   depositing a second spacer layer over the sacrificial layer; and
   removing at least a portion of the sacrificial layer to form a gap between the first protection layer and the second spacer layer.

2. The method of claim 1, wherein doping the upper portion of the first spacer layer reduces an etch rate of a material of the first spacer layer while removing at least the portion of the sacrificial layer.

3. The method of claim 1, further comprising forming a dielectric layer over the second spacer layer, wherein the dielectric layer extends partially into the gap.

4. The method of claim 1, further comprising forming a second protection layer over the sacrificial layer, wherein depositing the second spacer layer deposits the second spacer layer over the second protection layer.

5. The method of claim 1, wherein the first protection layer comprises a material of the un-doped portion of the first spacer layer doped with carbon or boron.

6. A method comprising:
   forming a first gate structure over an active region;
   depositing a first spacer layer along sidewalls and a top surface of the first gate structure;
   doping an upper portion of the first spacer layer to form a first protection layer over an un-doped portion of the first spacer layer;
   depositing a sacrificial layer over the first protection layer;
   forming a second protection layer over the sacrificial layer;
   depositing a second spacer layer over the second protection layer; and
   removing at least a portion of the sacrificial layer to form a gap between the first protection layer and the second protection layer.

7. The method of claim 6, wherein doping the upper portion of the first spacer layer comprises performing a plasma-assisted doping process to dope the first spacer layer with carbon.

8. The method of claim 7, wherein the plasma-assisted doping process is performed using an implantation energy between 0.5 KeV and 5 KeV, and an implant dosage between 5E13 atoms/cm$^2$ to about 1E15 atoms/cm$^2$.

9. The method of claim 6, wherein doping the upper portion of the first spacer layer comprises performing a plasma-assisted doping process to dope the first spacer layer with boron.

10. The method of claim 9, wherein the plasma-assisted doping process is performed using an implantation energy between 1 KeV to 3 KeV, and an implant dosage between 5E13 atoms/cm$^2$ to about 1E15 atoms/cm$^2$.

11. The method of claim 6, wherein forming the second protection layer comprises depositing a carbon-containing layer.

12. The method of claim 11, wherein depositing the carbon-containing layer comprises a plasma-assisted process using a carbon-containing precursor gas, wherein the carbon-containing precursor gas includes CH4, CO, CO2, or a combination thereof.

13. The method of claim 6, wherein forming the second protection layer comprises depositing a boron-containing layer.

14. The method of claim 13, wherein depositing the boron-containing layer comprises a plasma-assisted process using a boron-containing precursor gas, wherein the boron-containing precursor gas includes $B_2H_6$, $BF_3$, or a combination thereof.

15. The method of claim 6, wherein a thickness of the second protection layer is in a range between 0.5 nm and about 4 nm.

16. A method comprising:
forming a conductive structure on a substrate;
depositing a first dielectric layer along sidewalls of conductive structure;
forming a first protection layer on the first dielectric layer;
depositing a sacrificial layer over the first protection layer;
forming a second protection layer over the sacrificial layer;
depositing a second dielectric layer over the second protection layer;
removing at least a portion of the sacrificial layer to form a gap between the first protection layer and the second protection layer; and
forming a third dielectric layer over the gap.

17. The method of claim 16, wherein the third dielectric layer extends partly into the gap.

18. The method of claim 16, wherein the gap extends under the second dielectric layer.

19. The method of claim 16, wherein forming the first protection layer comprises doping an upper portion of the first dielectric layer, wherein the first protection layer has a lower etch rate than an undoped portion of the first dielectric layer while removing the portion of the sacrificial layer.

20. The method of claim 16, wherein forming the first protection layer comprises depositing a material layer, wherein the material layer has a lower etch rate than the first dielectric layer while removing the portion of the sacrificial layer.

* * * * *